(12) United States Patent
Hagelin

(10) Patent No.: US 7,369,003 B2
(45) Date of Patent: May 6, 2008

(54) OSCILLATOR SYSTEM HAVING A PLURALITY OF MICROELECTROMECHANICAL RESONATORS AND METHOD OF DESIGNING, CONTROLLING OR OPERATING THE SAME

(75) Inventor: Paul Merritt Hagelin, Saratoga, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 11/438,653

(22) Filed: May 22, 2006

(65) Prior Publication Data

US 2007/0247246 A1    Oct. 25, 2007

Related U.S. Application Data

(62) Division of application No. 11/399,176, filed on Apr. 6, 2006.

(51) Int. Cl.
*H03B 5/30* (2006.01)
*H03B 5/40* (2006.01)

(52) U.S. Cl. .................. 331/116 M; 331/156

(58) Field of Classification Search ........... 331/116 M, 331/154, 156
See application file for complete search history.

(56) References Cited

U.S. PATENT DOCUMENTS

| | | | |
|---|---|---|---|
| 4,415,870 A | 11/1983 | Zumsteg | |
| 4,489,289 A | 12/1984 | Slobodnik et al. | |
| 4,868,524 A | 9/1989 | Costlow et al. | |
| 5,309,116 A | 5/1994 | Stone | |
| 5,955,932 A * | 9/1999 | Nguyen et al. | 333/186 |
| 6,557,419 B1 | 5/2003 | Herb et al. | |
| 6,995,622 B2 * | 2/2006 | Partridge et al. | 331/66 |
| 7,106,143 B2 * | 9/2006 | Bloch et al. | 331/65 |
| 7,248,128 B2 * | 7/2007 | Mattila et al. | 331/175 |

OTHER PUBLICATIONS

"The dual-mode frequency-locked technique for the characterization of the temperature coefficient of permittivity of anisotropic materials", Tobar et al., Measurement Science and Technology 15 (2004), pp. 29-34.

"Room Temperature Duel-Mode Oscillator", Torrealba et al., Electronics Letters, Jan. 19, 2006, vol. 42, No. 2, pp. 99-100.

(Continued)

*Primary Examiner*—Benny Lee
*Assistant Examiner*—James Goodley
(74) *Attorney, Agent, or Firm*—Patterson & Sheridan, LLP

(57) ABSTRACT

There are many inventions described and illustrated herein. In one aspect, the present inventions relate to oscillator systems which employ a plurality of microelectromechanical resonating structures, and methods to control and/or operate same. The oscillator systems are configured to provide and/or generate one or more output signals having a predetermined frequency over temperature, for example, (1) an output signal having a substantially stable frequency over a given/predetermined range of operating temperatures, (2) an output signal having a frequency that is dependent on the operating temperature from which the operating temperature may be determined (for example, an estimated operating temperature based on a empirical data and/or a mathematical relationship), and/or (3) an output signal that is relatively stable over a range of temperatures (for example, a predetermined operating temperature range) and is "shaped" to have a desired turn-over frequency.

36 Claims, 55 Drawing Sheets

OTHER PUBLICATIONS

"Cryogenic Duel-Mode Resonator for a Fly-Wheet Oscillator for a Caesium Frequency Standard", Tobar et al., IEEE Transactions on Ultrasonics, Ferroelectric, and Frequency Control, vol. 49, No. 10, Oct. 2002, pp. 1340-1355.

"Second Generation 50 K Duel-Mode Sapphire Oscillator", Anstie et al, IEEE Transactions on Ultrasonics, Ferroelectrics, and Frequency Control, vol. 53, No. 2, Feb. 2006, pp. 284-288.

"Improving the Frequency Stability of Microwave Oscillators by Utilizing the Duel-Mode Sapphire-Loaded Cavity Resonator", Tobar et al., Measurement Science and Technology 13 (2002), pp. 1284-1288.

"New Method to Build a High Stability Sapphire Oscillator from the Temperature Compensation of the Difference Frequ3ency Between Modes of Orthogonal Polarization", Tobar et al., IEEE Transactions on Ultrasonics, Ferroelectrics, and Frequency Control, vol. 50, No. 3 Mar. 2003, pp. 214-219.

"Temperature-Insensitive Dual-Mode Resonant Sensors—A Review", Vig, IEEE Sensors Journal, vol. 1, No. 1, Jun. 2001, pp. 62-68.

"Resonator Self-Temperature-Sending Using a Dual-Harmonic-Mode Crystal Oscillator", Schodowski, 43rd Annual Symposium on Frequency Control, 1989, pp. 2-7.

"A Microcomputer-Compensated Crystal Oscillator Using a Duel-Mode Resonator", Benjaminson et al., 43rd Annual Symposium on Frequency Control, 1989, pp. 20-26.

"Beat Frequency Oscillator R7077", Robinson, Ray, http://www.shlrc.mq.ed.au/~robinson/museum/AWA_BFO.html, Oct. 18, 2005, 4 pages.

"Design and Realisation of a 100MHz Synthesis Chain from an X-Band Reference Signal", Lardet-Vieudrin et al., , Joint Meeting 2003 IEEE International Frequency Control Symposium & 17th European Frequency and Time Forum, Tampa, USA, May 5-8, 2003, pp. 560-564.

"Multiple Mode Micromechanical Resonators", Brennen et al., Proc. IEEE Micro Electro Mechanical Systems Workshop (1990), pp. 9-14.

"Aging of Dual Mode Resonator for Microcomputer Compensated Crystal Oscillator", Kim, Y., IEEE 2005, pp. 171-175.

"Digital Recursive Oscillator with Reduced Frequency versus Temperature Dependency Utilizing a Duel-Mode Crystal Oscillator", Stofanik et al., IEEE 2005, pp. 517-521.

* cited by examiner

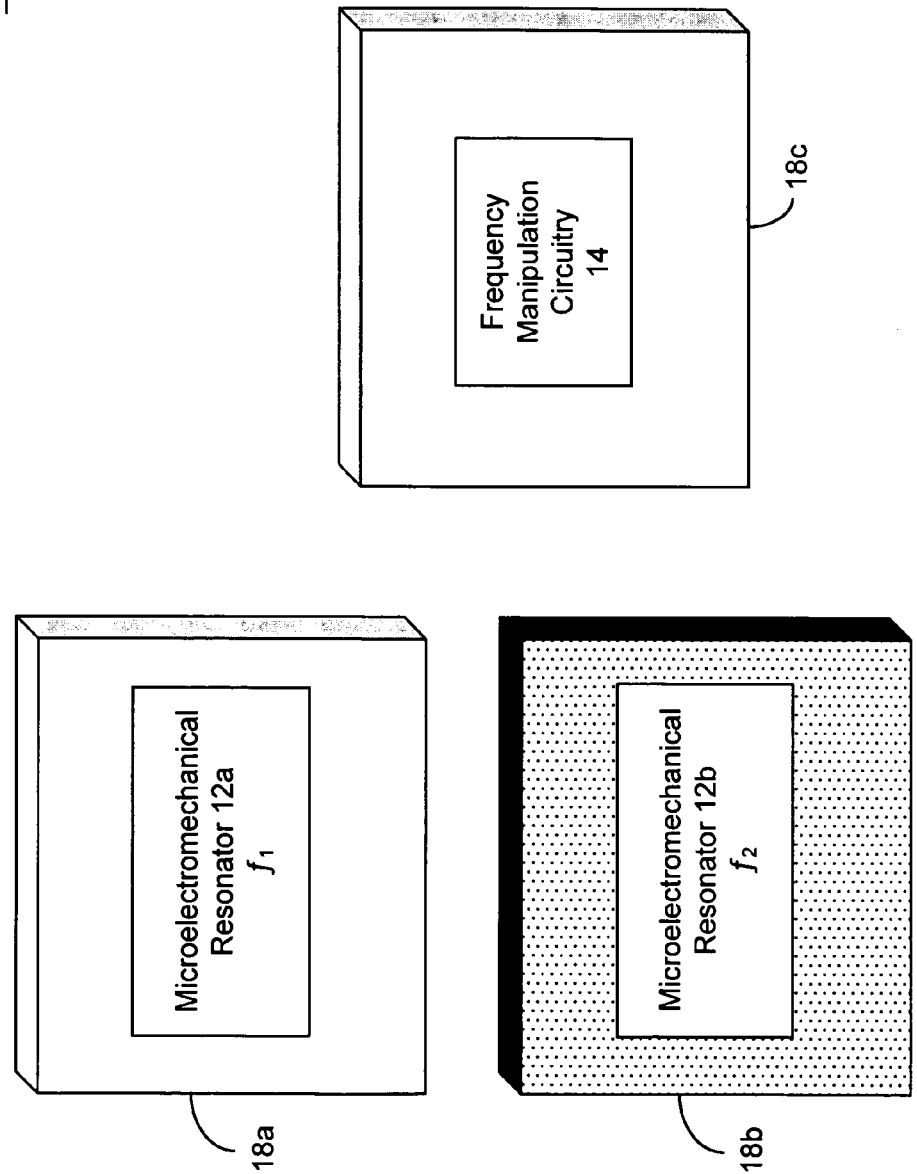

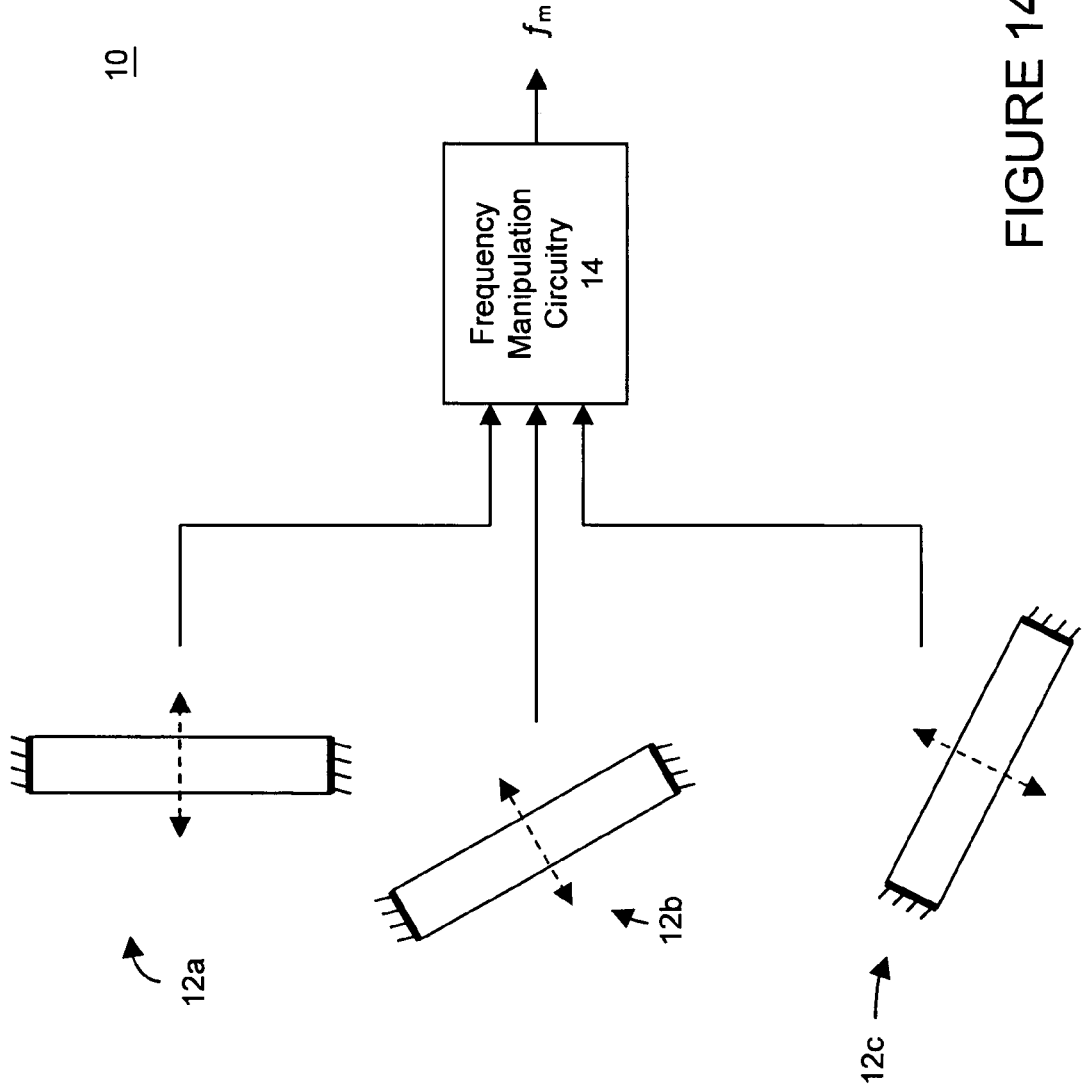

OSCILLATOR SYSTEM HAVING A PLURALITY OF MICROELECTROMECHANICAL RESONATORS AND METHOD OF DESIGNING, CONTROLLING OR OPERATING THE SAME

RELATED APPLICATION

This application is a divisional application of Application Ser. No. 11/399,176, filed on Apr. 6, 2006 (still pending), the contents of which are incorporated herein by reference.

BACKGROUND

There are many inventions described and illustrated herein. The inventions relate to microelectromechanical and/or nanoelectromechanical (collectively hereinafter "microelectromechanical") structures and devices/systems including same; and more particularly, in one aspect, to oscillator systems employing microelectromechanical resonating structures, and methods to control and/or operate same.

Microelectromechanical systems, for example, gyroscopes, oscillators, resonators and accelerometers, utilize micromachining techniques (i.e., lithographic and other precision fabrication techniques) to reduce mechanical components to a scale that is generally comparable to microelectronics. Microelectromechanical systems typically include a microelectromechanical structure fabricated from or on, for example, a silicon substrate using micromachining techniques. The operation and the response of the microelectromechanical structures depend, to a significant extent, on the operating temperature of the structure.

Where the microelectromechanical system is, for example, a resonator, which is fabricated from or on silicon, the performance of the microelectromechanical resonator is dependent on the operating temperature of the resonator. In this regard, temperature fluctuations may result in, for example, changes in (i) microelectromechanical resonator geometry, (ii) microelectromechanical resonator mass, (iii) stresses or strains on the microelectromechanical resonator (for example, changes in stresses/strains due to, among other things, the thermal coefficient of expansion of the resonator, substrate and/or packaging (if any)), and (iv) the material properties of the resonator. Among thermally-induced changes, the elastic sensitivity of silicon to temperature often dominates in many silicon-based microelectromechanical resonator designs, which often results in a resonator frequency shift in the range of about −20 ppm/C to about −30 ppm/C.

As is well understood, the Young's modulus for most materials of interest changes with temperature according to known thermal coefficients. For example, polysilicon has a first-order thermal coefficient of −75 ppm/C. Furthermore, the geometry of a beam structure also changes with temperature, generally expanding with increasing in temperature. Again, as an example, polysilicon has a thermal expansion coefficient of 2.5 ppm/C.

For some beam designs and related modeling purposes, and given a material with an isotropic thermal coefficient of expansion, the effect of thermal expansion of the width of the beam is somewhat offset by the effect of thermal expansion of the length of the beam. While it may be possible to compensate for some thermally-induced changes in the resonator based on the coefficient of thermal expansion, the shift in Young's modulus over temperature generally dominates in many resonator designs.

Setting aside electrostatic forces, the resonance frequency (f) of a beam may be characterized under these assumptions by the equation:

$$f = \frac{1}{2\pi}\sqrt{\frac{k_{\textit{eff}}}{m_{\textit{eff}}}}$$

where $k_{\textit{eff}}$ is the effective stiffness of the beam, and $m_{\textit{eff}}$ is the effective mass of the beam which is often constant over temperature.

In most implementations, the resonance frequency of the microelectromechanical resonator should remain substantially stable over a range of operating temperatures. This, however, will not normally be the case as thermally induced changes to the Young's modulus (or other variables) tend to change in the mechanical stiffness of the beam. As such, thermally-induced changes to the Young's modulus tend to cause considerable drift or change in the frequency of the output of the resonator. (See, for example, FIG. 1).

Given typical requirements for temperature stabilities ranging in magnitude from 0.1 to 100 ppm, and common operating temperature specifications ranging from −40 C to +85 C, there is a need for a temperature stable frequency (over an operating temperature range) of output signals of systems employing microelectromechanical resonators.

SUMMARY OF THE INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In one aspect, the present inventions are directed to a an oscillator system, comprising (i) a first microelectromechanical resonator to generate a first output signal having a frequency that varies with operating temperature, wherein the first microelectromechanical resonator includes a frequency function of temperature of the first microelectromechanical resonator, and (ii) a second microelectromechanical resonator to generate a second output signal having a frequency that varies with operating temperature, wherein the second microelectromechanical resonator includes a frequency function of temperature of the second microelectromechanical resonator. The oscillator system further includes frequency manipulation circuitry, coupled to the first and second microelectromechanical resonators to generate a third signal having frequency that is substantially stable over a predetermined operating temperature using the first and second output signals. The frequency manipulation circuitry may also be comprised of digital and/or analog circuitry, and/or microelectromechanical components to perform, for example, mixing and/or filtering of the signals.

In one embodiment, the frequency manipulation circuitry is frequency subtraction circuitry, for example, frequency mixer circuitry. The frequency subtraction circuitry may include filter circuitry, coupled to the frequency mixer circuitry, to receive an output of the frequency mixer circuitry and to filter/attenuate a frequency sum component of the output of the frequency mixer circuitry. The frequency mixer circuitry may include digital or analog circuitry.

The first and the second microelectromechanical resonators may be disposed in or on the same substrate. Further, the first microelectromechanical resonator and/or the second microelectromechanical resonator may be fabricated from one or more materials. In addition, the first and the second microelectromechanical resonators may be fabricated from the same material. Indeed, the first microelectromechanical resonator and the second microelectromechanical resonator may be the same physical structure. Moreover, the first microelectromechanical resonator, the second microelectromechanical resonator and the frequency manipulation circuitry may be disposed in or on the same substrate, or disposed in or on different substrates.

In one embodiment, the first microelectromechanical resonator and the second microelectromechanical resonator include different crystalline orientations or directions in or on the same substrate. In another embodiment, the first microelectromechanical resonator and the second microelectromechanical resonator are disposed in or on the different substrates and/or fabricated from different materials.

In another aspect, the present inventions are directed to an oscillator system, comprising (i) a first microelectromechanical resonator to generate a first output signal having a frequency that varies with operating temperature, wherein the first microelectromechanical resonator includes a frequency function of temperature of the first microelectromechanical resonator, and (ii) a second microelectromechanical resonator to generate a second output signal having a frequency that varies with operating temperature, wherein the second microelectromechanical resonator includes a frequency function of temperature of the second microelectromechanical resonator. The oscillator system of this aspect includes frequency mixer circuitry, coupled to the first and second microelectromechanical resonators to generate a third signal having a frequency that is substantially stable over an operating temperature using the first and second output signals.

In one embodiment of this aspect of the present inventions, the frequency mixer circuitry further includes filter circuitry, coupled to the frequency mixer circuitry, to receive an output of the frequency mixer circuitry and to filter/attenuate a frequency sum component of the output of the frequency mixer circuitry. The frequency mixer circuitry may include, or be comprised of digital or analog circuitry.

In this aspect of the inventions, like the previous aspect of the inventions, the first microelectromechanical resonator and the second microelectromechanical resonator may be disposed in or on the same substrate. Further, the first microelectromechanical resonator and the second microelectromechanical resonator may be fabricated from the same material. Indeed, the first microelectromechanical resonator and the second microelectromechanical resonator may be the same physical structure. Moreover, the first microelectromechanical resonator, the second microelectromechanical resonator and the frequency mixer circuitry may be disposed in or on the same substrate, or disposed in or on different substrates.

The first microelectromechanical resonator and the second microelectromechanical resonator may include different crystalline orientations or directions in or on the same substrate. In another embodiment, the first microelectromechanical resonator and the second microelectromechanical resonator are disposed in or on different substrates and/or fabricated from different materials.

In yet another aspect, the present inventions are directed to an oscillator system, comprising (i) a first microelectromechanical resonator to generate a first output signal having a frequency that varies with operating temperature, wherein the first microelectromechanical resonator includes a frequency function of temperature of the first microelectromechanical resonator, and (ii) a second microelectromechanical resonator to generate a second output signal having a frequency that varies with operating temperature, wherein the second microelectromechanical resonator includes a frequency function of temperature of the second microelectromechanical resonator. The oscillator system of this aspect of the inventions includes frequency mixer circuitry, coupled to the first and second microelectromechanical resonators to generate a third signal having frequency that is substantially stable over an operating temperature using the first and second output signals. In addition, the oscillator system includes signal alignment circuitry, coupled to the frequency mixer circuitry, to generate an output signal having a frequency that is greater than, less than, or equal to the frequency of the third signal. The signal alignment circuitry may also induce a phase change in the output signal with respect to the input signals.

In one embodiment of this aspect of the present inventions, the frequency mixer circuitry further includes filter circuitry, coupled to the frequency mixer circuitry, to receive an output of the frequency mixer circuitry and to filter/attenuate a frequency sum component of the output of the frequency mixer circuitry. As such, the signal alignment circuitry receives the output of the filter circuitry. Notably, the frequency mixer circuitry may include, or be comprised of digital or analog circuitry.

The signal alignment circuitry may include one or more phase locked loops, delay locked loops, digital/frequency synthesizer and/or frequency locked loops. In addition, the one or more digital/frequency synthesizers may include one or more direct digital synthesizers, frequency synthesizers, fractional synthesizers and/or numerically controlled oscillators. Further, the one or more phase locked loops, delay locked loops, digital/frequency synthesizer and/or frequency locked loops may include fractional and/or fine-fractional type phase locked loops, delay locked loops, digital/frequency synthesizer and/or frequency locked loops.

In this aspect of the inventions, like the previous aspects of the inventions, the first microelectromechanical resonator and the second microelectromechanical resonator may be disposed in or on the same substrate. Further, the first microelectromechanical resonator and the second microelectromechanical resonator may be fabricated from the same material. Indeed, the first microelectromechanical resonator and the second microelectromechanical resonator may be the same physical structure. Moreover, the first microelectromechanical resonator, the second microelectromechanical resonator, the frequency mixer circuitry and signal alignment circuitry may be disposed in or on the same substrate, or disposed in or on different substrates.

Notably, the first microelectromechanical resonator and the second microelectromechanical resonator may include different crystalline orientations or directions in or on the same substrate. In another embodiment, the first microelectromechanical resonator and the second microelectromechanical resonator are disposed in or on different substrates and/or fabricated from different materials.

Again, there are many inventions, and aspects of the inventions, described and illustrated herein. This Summary of the Inventions is not exhaustive of the scope of the present inventions. Moreover, this Summary of the Inventions is not intended to be limiting of the inventions and should not be interpreted in that manner. While certain embodiments have been described and/or outlined in this Summary of the Inventions, it should be understood that the present inventions are not limited to such embodiments, description and/or outline, nor are the claims limited in such a manner. Indeed, many others embodiments, which may be different from and/or similar to, the embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

FIGS. 8E-8K illustrate three-dimensional block diagram representations of a plurality of exemplary embodiments of the microelectromechanical oscillator having microelectromechanical resonators (i) integrated on/in a common and/or different substrates and (ii) fabricated from different materials, according to certain aspects of the present inventions;

FIGS. 14A-14C are block diagram representations of microelectromechanical oscillator systems, including three or more microelectromechanical resonators and frequency manipulation circuitry (for example, frequency subtraction circuitry and/or frequency addition circuitry), according to certain aspects of the present inventions;

DETAILED DESCRIPTION

Figure 1:
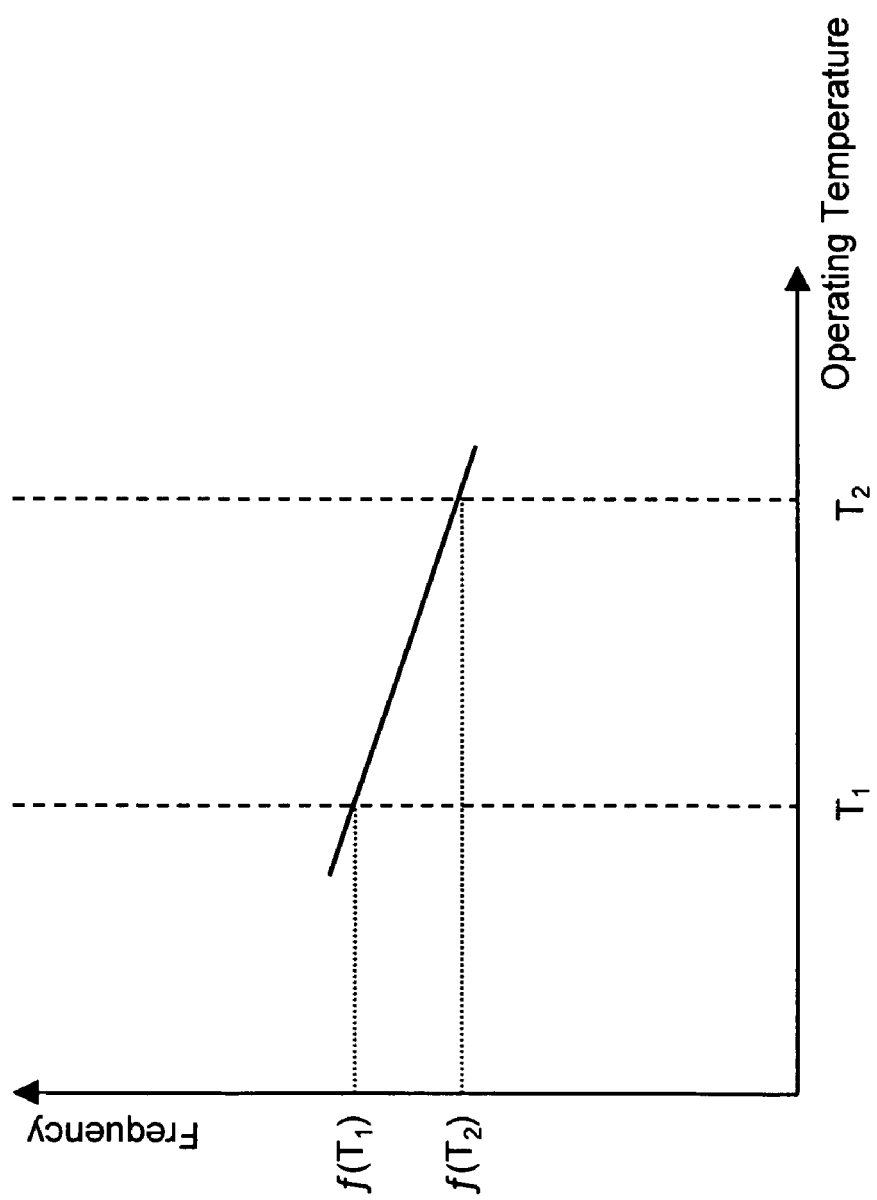
FIG. 1 is a graphical illustration of the change of frequency of the output signal of a microelectromechanical resonator over a given operating temperature range of $T_1$ to $T_2$.

There are many inventions described and illustrated herein. In one aspect, the present inventions relate to oscillator systems which employ a plurality of microelectromechanical resonators, and methods to control and/or operate same. The oscillator systems of the present inventions may be configured to provide and/or generate one or more output signals having a predetermined frequency over temperature, for example, (1) an output signal having a substantially stable frequency (i.e., constant, substantially constant and/or essentially constant frequency) over a predetermined range of operating temperatures, (2) an output signal having a frequency that is dependent on the operating temperature from which the operating temperature may be determined (for example, an estimated operating temperature based on a empirical data and/or a mathematical relationship), and/or (3) an output signal having a substantially stable frequency over a range of temperatures (for example, a predetermined operating temperature range) and is "shaped" to have a desired turn-over frequency. Notably, "substantially stable frequency" may be considered in view of, among other things, a particular application over a particular, given or predetermined range of temperatures.

In one embodiment, the present inventions include an oscillator system having two microelectromechanical resonators, each resonator having a "frequency function of temperature" (resulting from or caused by, for example, a change in Young's modulus over temperature of the microelectromechanical resonator (i.e., E(T) varies over temperature), a change in dimension of the microelectromechanical resonator over temperature, a change in mass of the microelectromechanical resonator over temperature, a change in stress/strain conditions of the microelectromechanical resonator, the substrate and/or the housing). In this embodiment, the output of each microelectromechanical resonator, having a frequency that varies with temperature (for example, operating temperature), may be applied to frequency manipulation circuitry to generate an output signal having a predetermined frequency that is substantially stable (i.e., constant, substantially constant and/or essentially constant) over temperature (for example, over a given or predetermined temperature range). The frequency manipulation circuitry may, in addition to or in lieu thereof, generate an output signal having a predetermined frequency that changes over temperature in a predetermined manner, or it may change in an indeterminate or hysteretic manner. For example, part or much of the change may be in a predetermined manner while another part or portion of the change may be indeterminate or hysteretic.

Notably, the frequency manipulation circuitry may be implemented as digital and/or analog circuitry. In addition thereto, or in lieu thereof, the frequency manipulation circuitry may be implemented as microelectromechanical components. There are many types, designs and/or configurations of frequency manipulation circuitry. All such circuitry, whether now known of later developed, are intended to fall within the scope of the present inventions.

In one embodiment, the output signal having the substantially stable frequency (i.e., constant, substantially constant and/or essentially constant frequency) over, for example, a predetermined temperature range, may be employed as an output signal and/or may be applied to signal or clock (hereinafter collectively "clock") alignment circuitry (for example, one or more phase locked loops (PLLs), delay locked loops (DLLs), digital/frequency synthesizer, for example, a direct digital synthesizer ("DDS"), frequency synthesizer, fractional synthesizer and/or numerically controlled oscillator, and/or frequency locked loops (FLLs)) to adjust (for example, increase or decrease) and/or control the frequency of the output signal of the microelectromechanical resonator-based oscillator system. In this way, the clock signal may include a predetermined frequency that is higher or lower in frequency than the frequency of the output signal of the oscillator system. Indeed, the clock alignment circuitry may provide a plurality of output signals that are higher and/or lower in frequency than the frequency of the output signal of the oscillator system.

Where an output signal of the frequency manipulation circuitry changes over temperature in a predetermined manner, that signal may be employed as a measure of the operating temperature of the system. In one embodiment, the signal which is representative of the operating temperature of the oscillator system may be applied to control circuitry, in a feedback loop, which adjusts the drive and/or sense circuitry of one or more of the resonators or other (different) microelectromechanical-type elements or structures, for example, microelectromechanical gyroscopes or accelerometers that are, for example, disposed on or in the same substrate. In this way, the output signal of the oscillator system may include a substantially stable frequency via control or adjustment of the drive and/or sense circuitry of one or more of the microelectromechanical resonators.

Notably, the frequency manipulation circuitry may provide a plurality of outputs including one or more output signals (i) having a frequency (for example, a predetermined frequency) that is substantially stable (i.e., constant, substantially constant and/or essentially constant) over temperature (for example, over a given or predetermined temperature range), and/or (ii) having a frequency that changes over temperature (for example, over a given or predetermined temperature range) in a predetermined manner. All permutations and combinations of outputs of the frequency manipulation circuitry are intended to fall within the scope of the present inventions.

Figure 2:
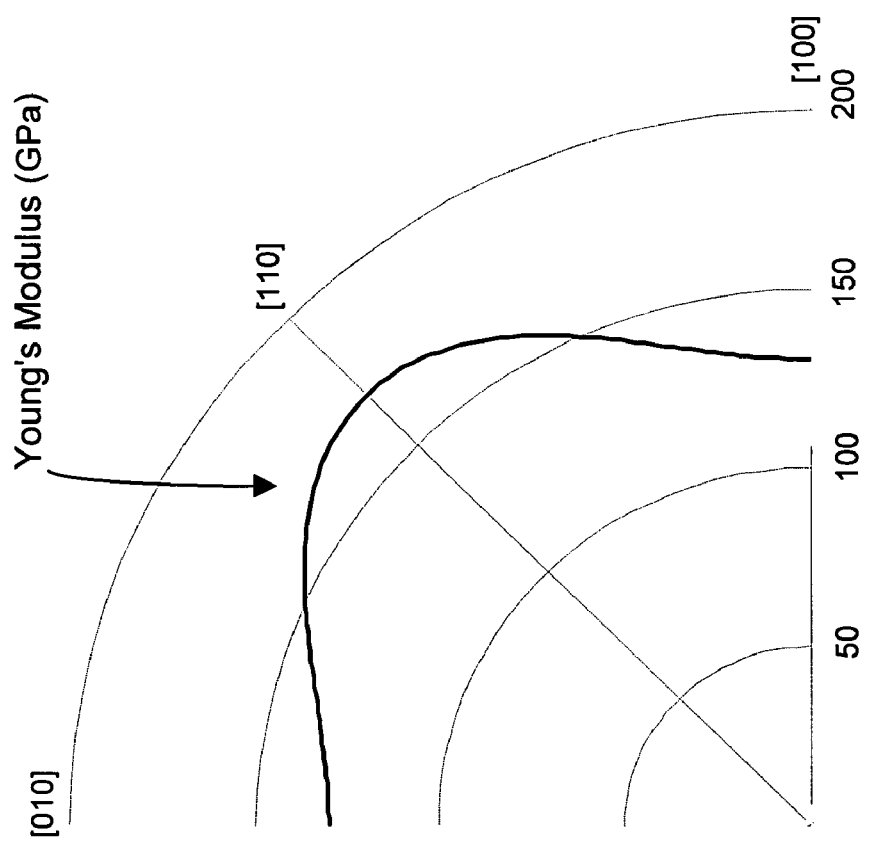
FIG. 2 is a graphical illustration of Young's modulus (E) versus crystalline orientation of the microelectromechanical structure disposed in the (100) plane of monocrystalline silicon.

The microelectromechanical resonators may be disposed (1) on/in the same substrate and fabricated from the same material, (2) on/in different substrates from the same material, (3) on/in the same substrate but from different materials, and/or (4) on/in different substrates of different materials. For example, where the resonators are disposed on the same substrate and in the same material (for example, monocrystalline silicon) or in/on different substrates of the same material, the resonators may be fabricated in/on the substrate in different orientations or directions. In this way, although the resonators are fabricated from or in the same material having the same or substantially the same mechanical properties, the Young's modulus of each resonator structure may be different and may vary or change differently over temperature (i.e., dE/dT of one resonator structure is different from the dE/dT of the other resonator structure, or E(T) of one resonator structure is different from E(T) of the other resonator structure, where E(T) is the function of Young's modulus over temperature) due to the different crystalline orientations (for example, where the material is silicon, the strain field of one of the resonators may be predominantly oriented in the <100> direction in the (100) plane, and the strain field of the other resonator may be disposed in the <110> direction on the (100) plane (stated differently, the two strain fields are oriented at an angle of 45° with respect to each other in the (100) plane)). (See, for example, FIG. 2). Resonator designs that incorporate strain energy in multiple directions and/or multiple materials are also possible and indeed may be advantageous. For example a pair of resonator structures may have strain fields that are not oriented purely in <100> and <110> directions, thereby forming resonators with intermediate "aggregate" material properties.

Notably, where the microelectromechanical resonators are disposed on/in the same substrate and fabricated from different materials, and/or on/in different substrates from different materials, the Young's modulus of each resonator structure may be different and may also vary or change differently over temperature (i.e., dE/dT of one resonator structure is different from the dE/dT of the other resonator structure, or E(T) of one resonator is different from E(T) of the other resonator) due to the differences in the properties, for example, mechanical properties, of the different materials. As such, the crystalline orientations (if any) of the microelectromechanical resonators may or may not be different.

Further, at least one resonator may be created from a composite material, for example, a combination of silicon, silicon nitride, and/or silicon dioxide. The relative amounts of materials and their location in the resonator device may be adjusted to advantageously influence the frequency function of temperature of each.

Figure 3:
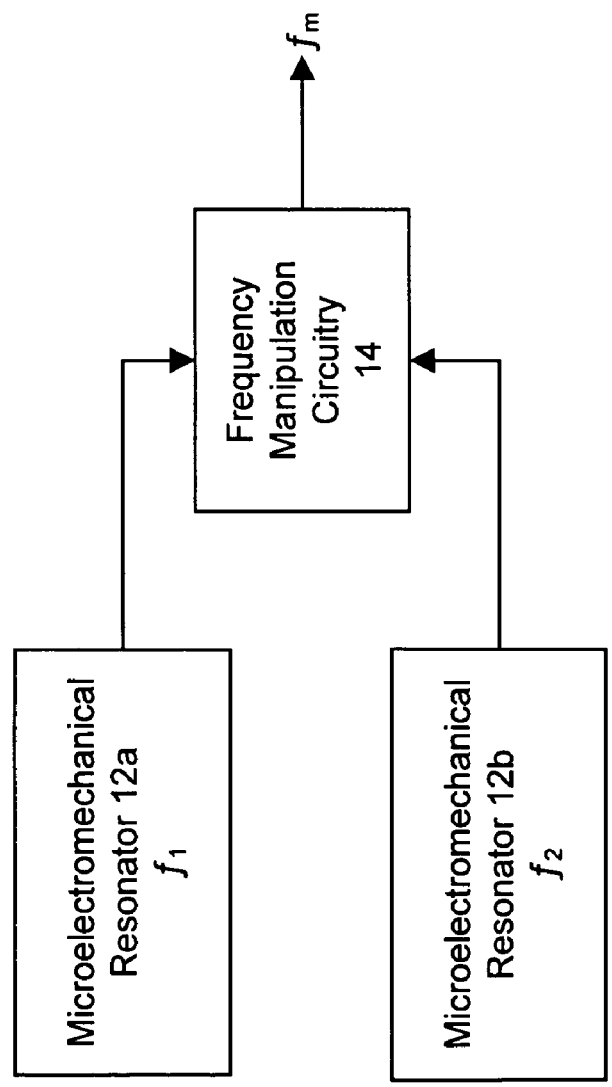
FIG. 3 is a block diagram representation of a microelectromechanical oscillator system, including two microelectromechanical resonators and frequency manipulation circuitry, according to certain aspects of the present inventions.
Figure 4:
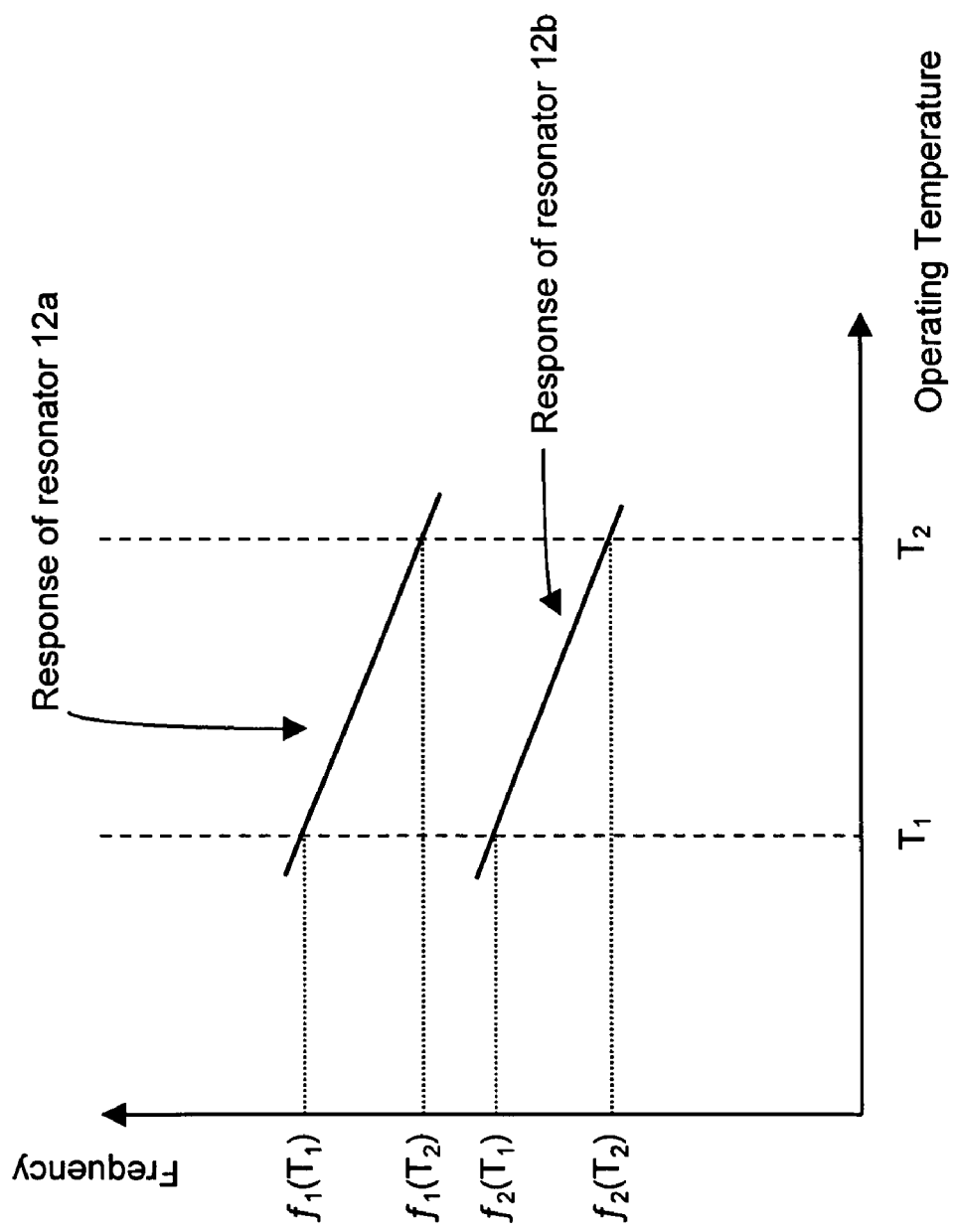
FIG. 4 is a graphical illustration of the change of frequency of the output signal of the two microelectromechanical resonators of FIG. 3 over a given/predetermined operating temperature range of $T_1$ to $T_2$.

With reference to FIG. 3, in one aspect, the present inventions are directed to microelectromechanical oscillator system 10 having microelectromechanical resonators 12a and 12b and frequency manipulation circuitry 14. The output signal of microelectromechanical resonator structure 12a includes a resonant frequency $f_1$ that varies over temperature. The output signal of resonator structure 12b includes a resonant frequency $f_2$ that varies over temperature. Moreover, with reference to FIG. 4, microelectromechanical resonator structure 12a includes a Young's modulus which changes over operating temperature (i.e., non-zero dE/dT or varying E(T)) in a manner and/or rate that is different from the manner and/or rate of the Young's modulus change over temperature of microelectromechanical resonator structure 12b.

Figure 5A:
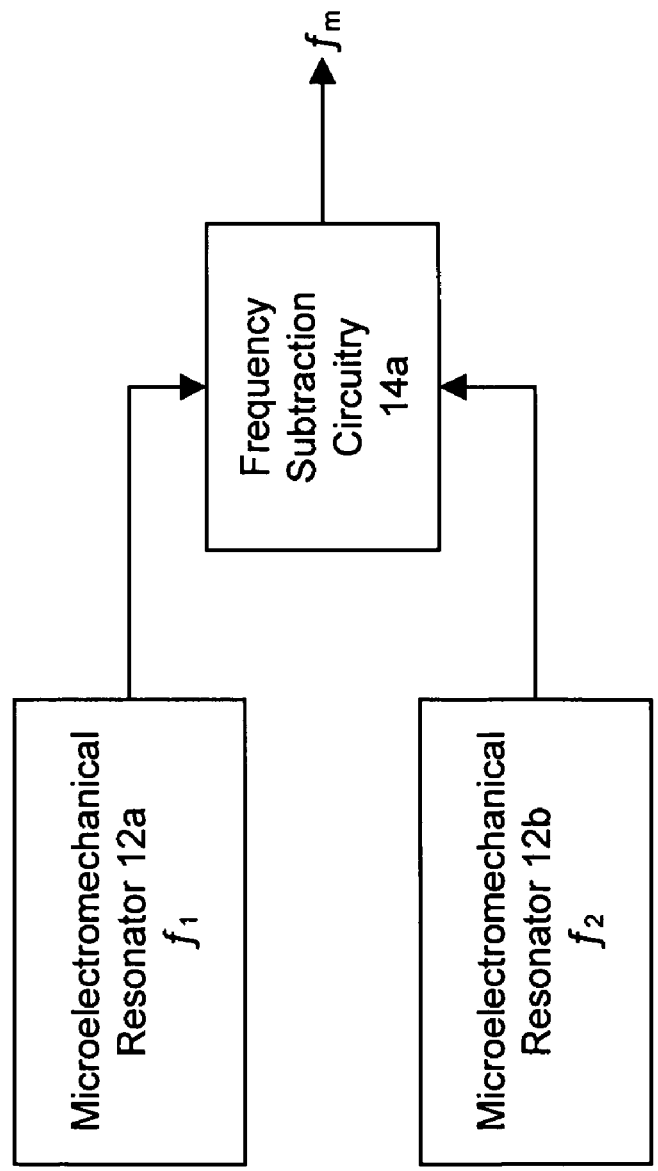
FIG. 5A is a block diagram representation of a microelectromechanical oscillator system, including two microelectromechanical resonators and frequency subtraction circuitry, according to certain aspects of the present inventions.
Figure 6A:
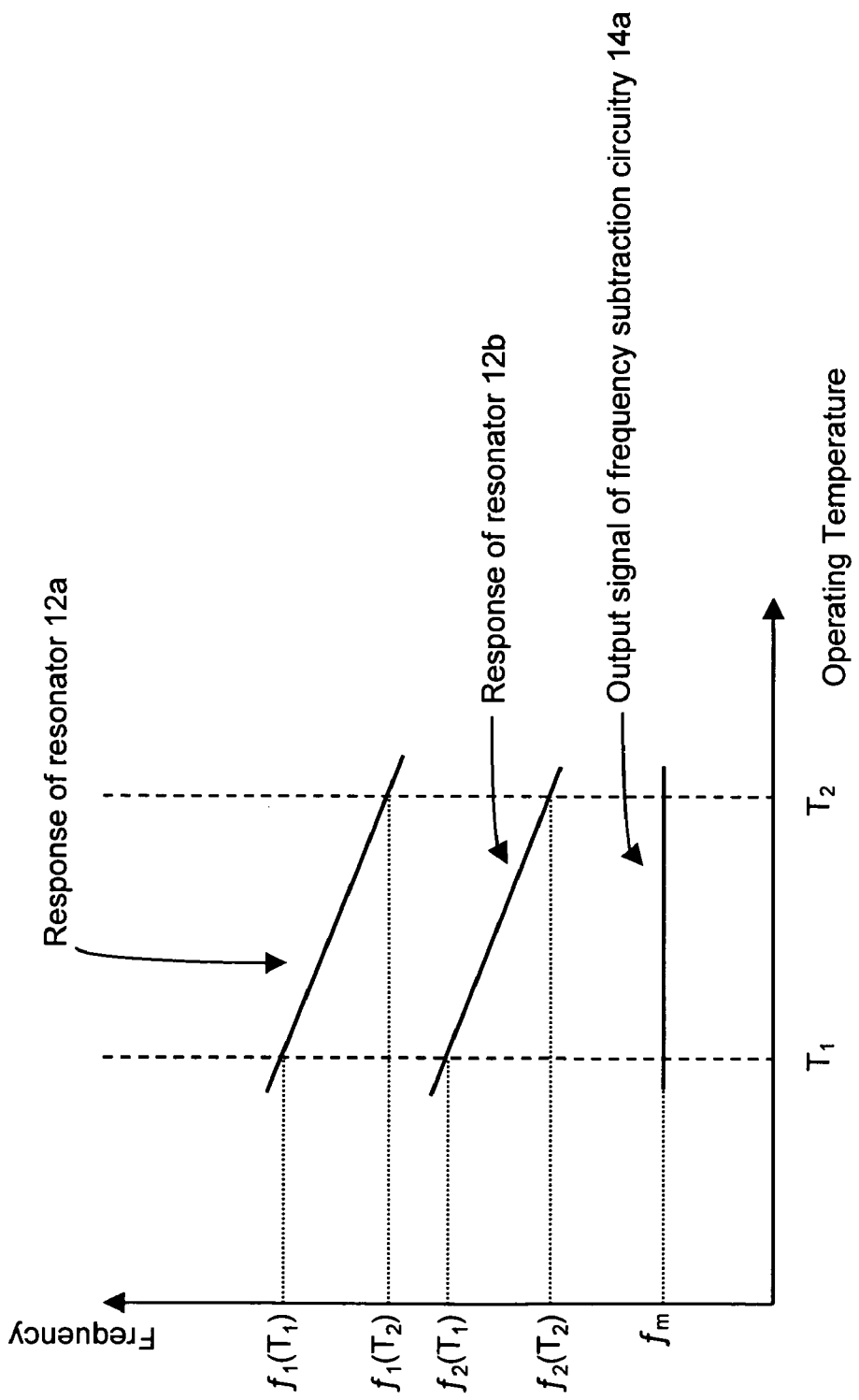
FIGS. 6A and 6B are graphical illustrations of the change of frequency of the output signals of the two microelectromechanical resonators and the output of the frequency subtraction circuitry of FIG. 5A over a given operating temperature range of $T_1$ to $T_2$, wherein the frequency of the output signal is relatively constant over the given/predetermined operating temperature range without exhibiting a "turn-over frequency" (see, FIG. 6A), and the frequency of the output signal, which is relatively constant over the given/predetermined operating temperature range, including a "turn-over frequency" within the given/predetermined operating temperature range (see, FIG. 6B)

In one embodiment, the resonant frequency $f_1$ and resonant frequency $f_2$ are different frequencies. In this embodiment, frequency manipulation circuitry 14 may generate an output signal having a frequency ($f_m$) that is substantially stable over temperature. In one embodiment, frequency manipulation circuitry 14 may generate an output signal having substantially stable frequency ($f_m$) by "subtracting" the frequencies of the output signals of microelectromechanical resonator structure 12a and microelectromechanical resonator structure 12b. With reference to FIGS. 5A and 6, in this embodiment, frequency manipulation circuitry 14 is comprised of frequency subtraction circuitry 14a.

The resonant frequency of a mass-spring system may be characterized as $$f = \frac{1}{2\pi}\sqrt{\frac{k}{m}}$$

where f is the resonant frequency of the system, k is the mechanical spring constant, and m is the movable mass. In many systems, the spring constant may be a function of the material stiffness, material dimensions, material composition, direction of bending, presence of stresses or strains, and surrounding fluids or gasses, some or all of which may be a function of temperature. In addition, the mass may change with temperature due to, for instance, evaporation and condensation. In some cases, the effect of Young's modulus will be the dominant factor. The frequency function of temperature may be expressed as:

$$f(T) = \frac{1}{2\pi}\sqrt{\frac{k_0}{m_0}(1 + \alpha(T-T_0) + \beta(T-T_0)^2 + \gamma(T-T_0)^3 + \dots)}$$

where $k_0$ and $m_0$ are the stiffness and mass, respectively, at reference temperature $T_0$. Substituting a reference frequency $$f_o = \frac{1}{2\pi}\sqrt{\frac{k_0}{m_0}}$$

into the equation above, and truncating at the third-order temperature-dependent term for compactness and/or simplification, the frequency function of temperature may be expressed as:

$$f(T) = f_0\sqrt{(1+\alpha(T-T_0)+\beta(T-T_0)^2+\gamma(T-T_0)^3)}$$

Using the Taylor expansion about reference temperature $T_0$, this expression may be simplified as:

$$f(T) = f_0(1 + a(T-T_0) + b(T-T_0)^2 + c(T-T_0)^3)$$

where $a = \frac{\alpha}{2}, b = \frac{\beta}{2},$ and $c = \frac{\gamma}{2}$.

Generally, the frequency function of temperature for resonator "n" may be expressed as:

$$f_n(T) = f_{nT(0)}(1+a_n(T-T_0)+b_n(T-T_0)^2+c_n(T-T_0)^3).$$

The adverse impact on the frequency of the output of the resonator due to temperature variations may be offset, reduced and/or minimized by cancelling and/or addressing the impact of at least one of the temperature-dependent terms in the equation above. As such, the frequency outputs of two resonators may be combined as follows:

$$f_m(T) = \pm f_1(T) \pm f_2(T).$$

Notably, the sign of $f_1(T)$ and $f_2(T)$ in the equation immediately above may be "selected" to provide for one or more predetermined temperature-dependence terms to cancel and/or offset the temperature impact on the output frequency. In this regard, when the temperature dependence of the frequency for each resonator are of similar sign, for example, and the slopes of the temperature dependence of frequency of the resonators have the same orientation, frequency manipulation circuitry 14 may generate an output signal having a frequency ($f_m$) that is substantially stable over a predetermined/given temperature range by "subtracting" the frequencies of microelectromechanical resonators 12a and 12b. When the temperature dependence of the frequency for each resonator is opposite, for example, the slopes of the temperature dependence of frequency of the resonators are opposite, and frequency manipulation circuitry 14 may generate an output signal having a frequency ($f_m$) that is substantially stable over a predetermined/given temperature range by "adding" the frequencies of microelectromechanical resonators 12a and 12b.

For example, where the characteristics of microelectromechanical resonators 12a and 12b include a similar change over temperature (for example, microelectromechanical resonators 12a and 12b include the same slope of temperature dependence of the frequency), frequency manipulation circuitry 14 may "subtract" the output signal of second microelectromechanical resonator 12b from the output signal of first microelectromechanical resonator 12a, and setting the first order temperature dependence term to zero provides two equations $$f_{1T(0)} - f_{2T(0)} = f_{mT(0)}$$

$$a_1 f_{1T(0)} - a_2 f_{2T(0)} = 0$$

where $f_{mT(0)}$ is the output frequency at the reference temperature. This may provide the relationship of $$\frac{f_{1T(0)}}{f_{2T(0)}} = \frac{a_2}{a_1},$$

and per the sign convention of positive frequencies, $$f_{1T(0)} > f_{2T(0)} \text{ and } \frac{a_2}{a_1} > 0,$$

where:

$$f_{1T(0)} = \frac{f_{mT(0)}}{1 - \frac{a_1}{a_2}} \text{ and } f_{2T(0)} = \frac{a_1}{a_2}f_{1T(0)} \text{ and } a_1 < a_2$$

Figure 7A:
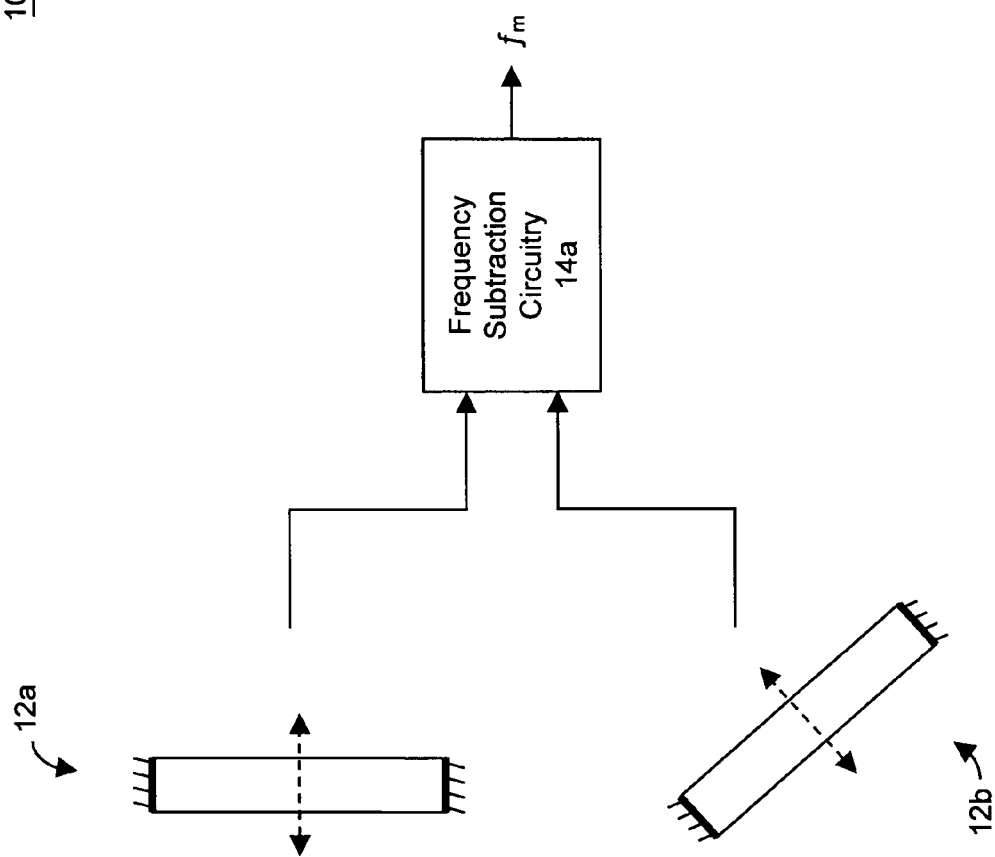
FIG. 7A is a block diagram representation of a microelectromechanical oscillator system according to an embodiment of one aspect of the present inventions, wherein one or more of the microelectromechanical resonators include a resonating beam (which is anchored at both ends)
Figure 7B:
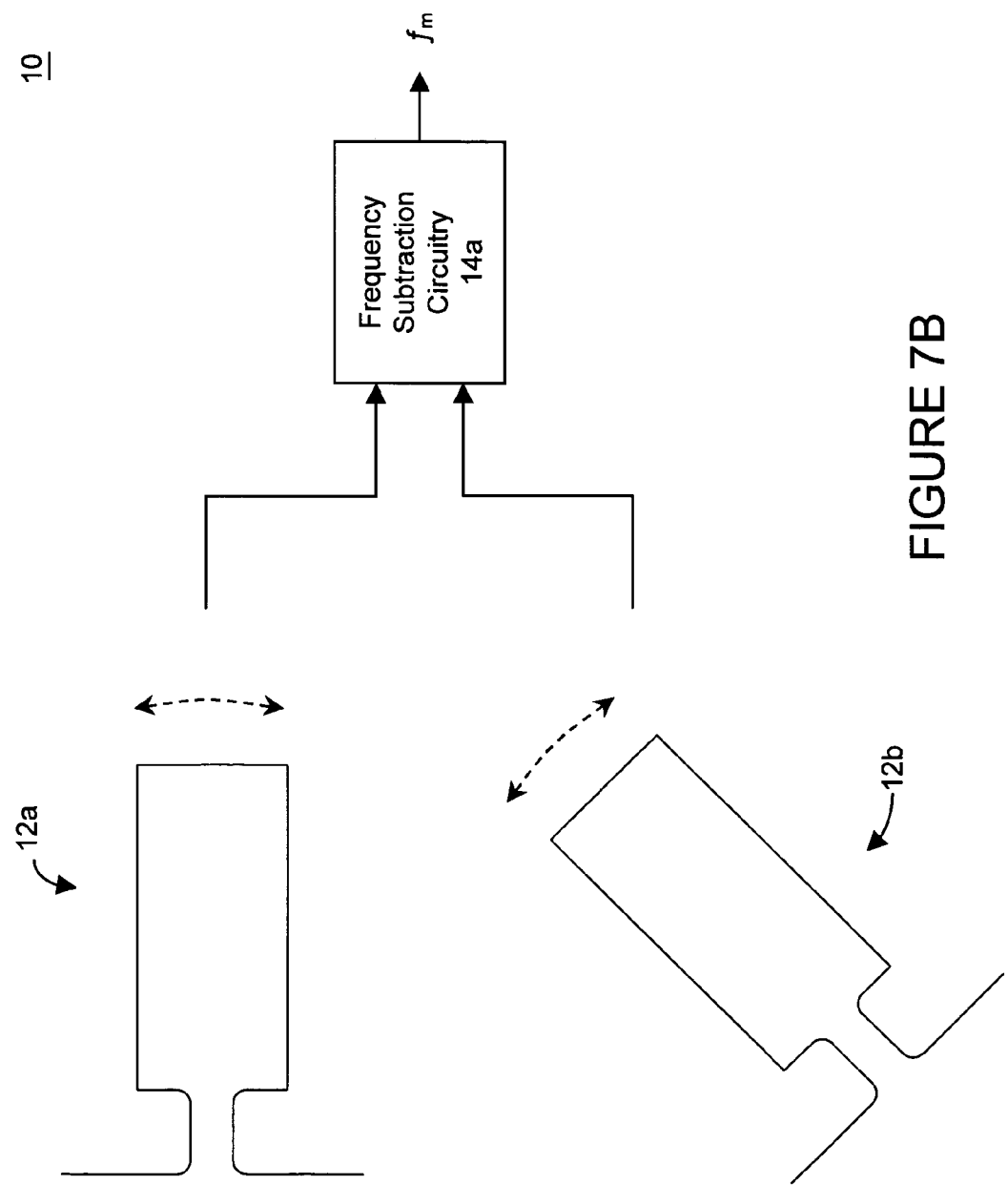
FIG. 7B is a block diagram representation of a microelectromechanical oscillator system according to another embodiment of one aspect of the present inventions, wherein one or more of the microelectromechanical resonators are illustrated as "paddle" like resonating beams which include layouts which are rotated relative to each other to provide different changes in Young's modulus over temperature due to the different layout orientations.
Figure 7C:
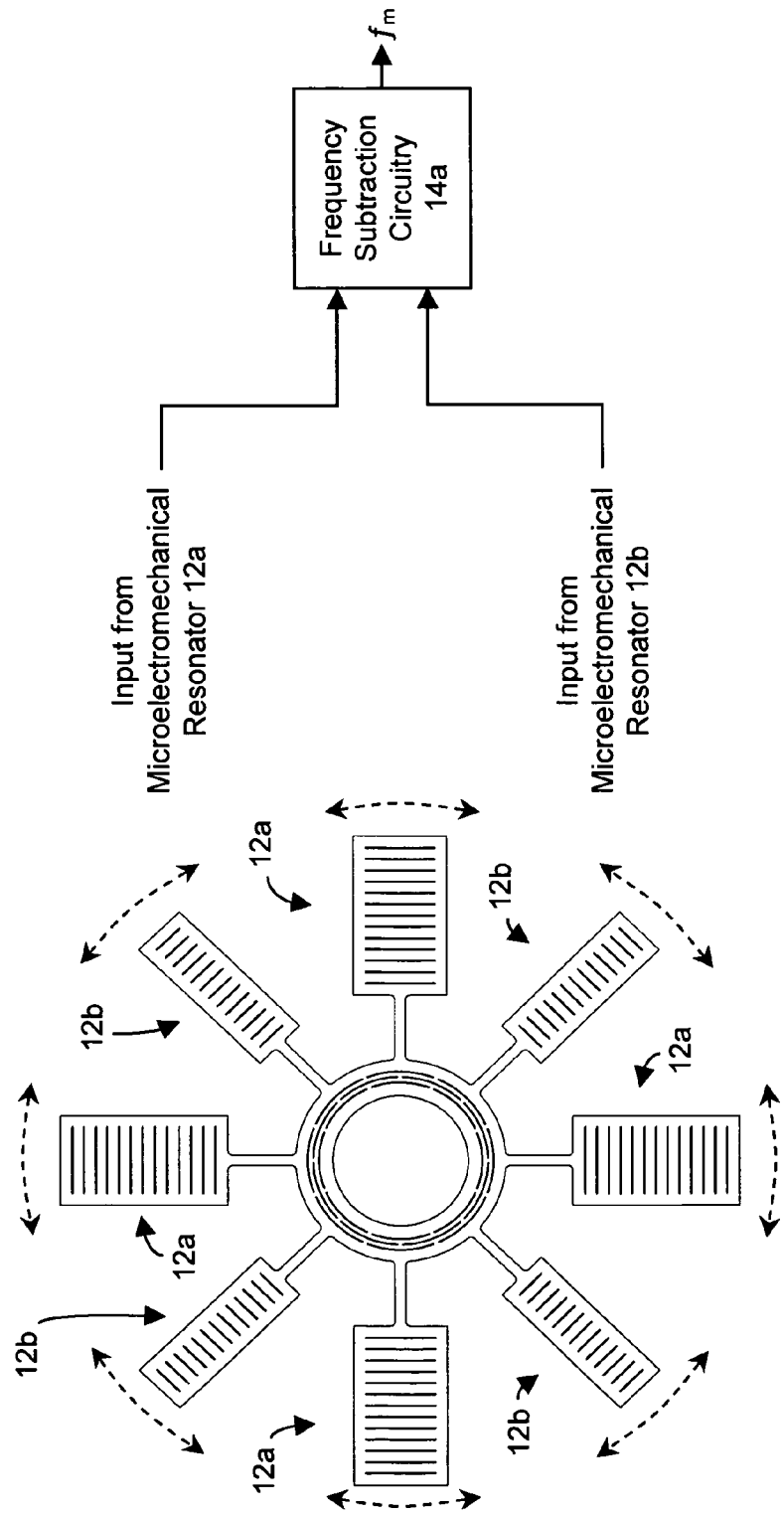
FIG. 7C is a block diagram representation of a microelectromechanical oscillator system according to another embodiment of one aspect of the present inventions, wherein the microelectromechanical resonators are illustrated as "paddle" like resonating beams which are coupled to a common structure and include layouts which are rotated relative to each other to provide different changes in Young's modulus over temperature due to the different layout orientations.

In one exemplary embodiment, in the context of monocrystalline silicon, the strain field of microelectromechanical resonator 12a may be predominantly oriented in the <110> direction in the (100) plane, and the strain field of microelectromechanical resonator 12b may be disposed in the <100> direction on the (100) plane (stated differently, the two strain fields are oriented at an angle of 45° with respect to each other in the (100) plane)). (See, for example, FIGS. 7B and 7C). As such, Young's modulus of microelectromechanical resonators 12a and 12b are different, and the manner and/or rate of change of Young's modulus of microelectromechanical resonators 12a and 12b differ over operating temperature (i.e., E(T) differs). Some example parameters may be found in literature or derived/obtained from data reported in literature. Notably, certain of these parameters have recently been measured as $a_1=-19.0\times10^{-6}/C$, $a_2=-28.5\times10^{-6}/C$, leading to $a1/a2\approx\frac{2}{3}$. Different ratios of $a_1/a_2$ may be obtained as the stress fields in one or more resonator devices may be distributed across multiple orientations in the same material or through multiple materials in a composite structure.

Using such typical values and the relationships of $$f_{mT(0)} = f_{1T(0)} - f_{2T(0)}, \frac{f_{1T(0)}}{f_{2T(0)}} = \frac{a_2}{a_1}, \text{ and } f_{mT(0)} = f_{1T(0)}\left(1 - \frac{a_1}{a_2}\right),$$

$$\text{then } f_{1T(0)} \cong 3f_{mT(0)} \text{ and } f_{2T(0)} \cong 2f_{mT(0)} \text{ since } \frac{a_1}{a_2} \cong \frac{2}{3}.$$

The frequency manipulation circuitry 14 (which, in this example, includes frequency subtraction circuitry 14a) may provide and/or generate an output signal having a frequency ($f_m$) of, for example, approximately 100 kHz, which is substantially stable over a given or predetermined operating temperature range, employing microelectromechanical resonator structure 12a having a frequency ($f_{1T(0)}$) of approximately 300 kHz and a microelectromechanical resonator structure 12b having a frequency ($f_{2T(0)}$) of approximately 200 kHz. Thus, in this exemplary embodiment, although (i) the output signal of microelectromechanical resonator structure 12a includes a resonant frequency $f_1$ which varies over operating temperature, and (ii) the output signal of resonator structure 12b includes a resonant frequency $f_2$ which also varies over operating temperature, frequency manipulation circuitry 14 (which includes, in this example, frequency subtraction circuitry 14a) may generate and/or provide an output signal having a frequency ($f_m$) that is substantially stable over, for example, a given or predetermined temperature range. (See, for example, FIGS. 6A and/or 6B).

Figure 6B:
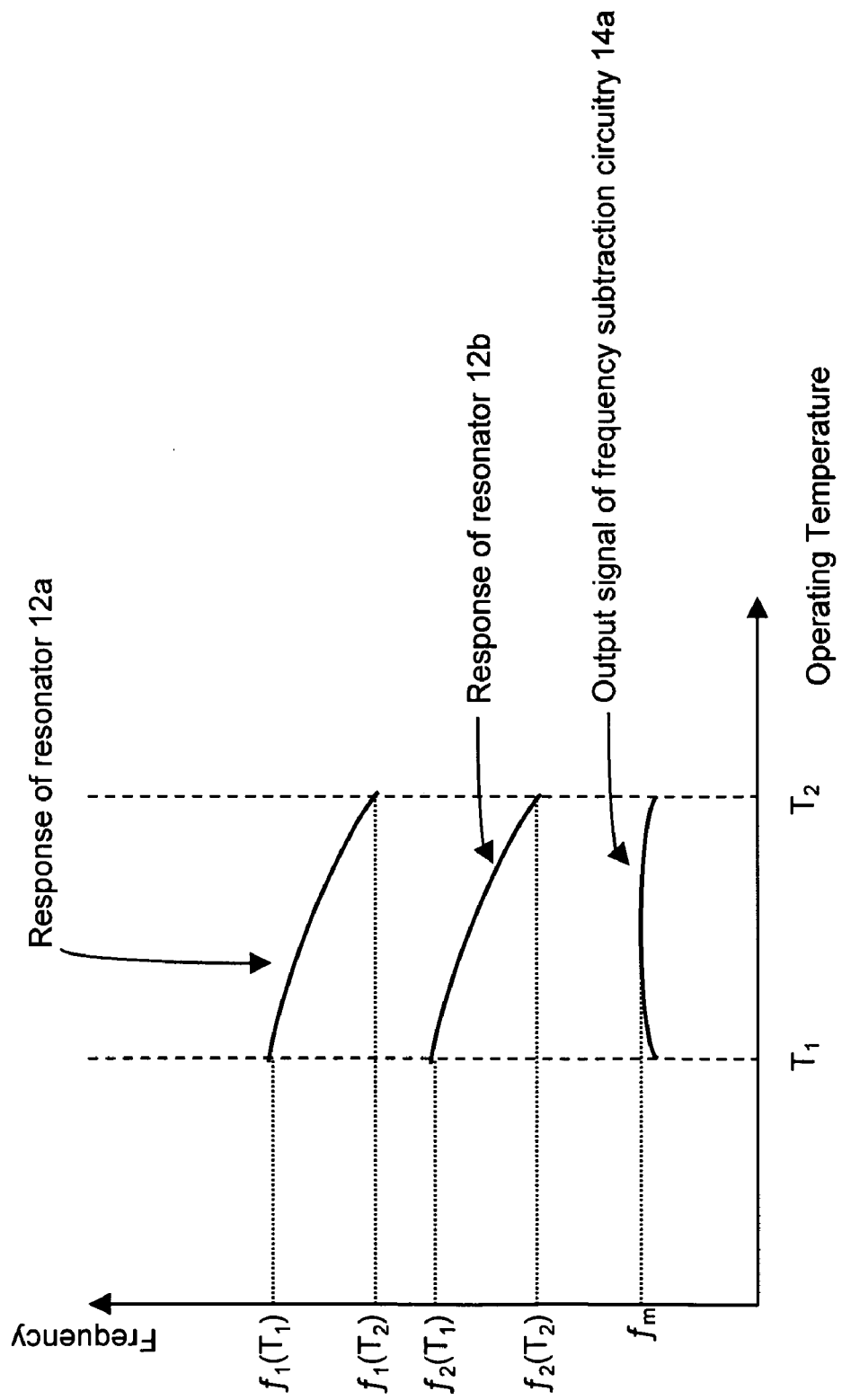

Notably, with reference to FIG. 6B, and the output signal, which is relatively constant over the given/predetermined operating temperature range, may include a "turn-over frequency" within the given/predetermined operating temperature range (see, FIG. 6B). The "turn-over" frequency may be provided since the frequency responses of microelectromechanical resonator structure 12a and 12b may not be perfectly linear and, as such, the "turn-over" frequency may occur by simply eliminating the first order coefficient from the temperature-dependent frequency function.

Figure 5B:
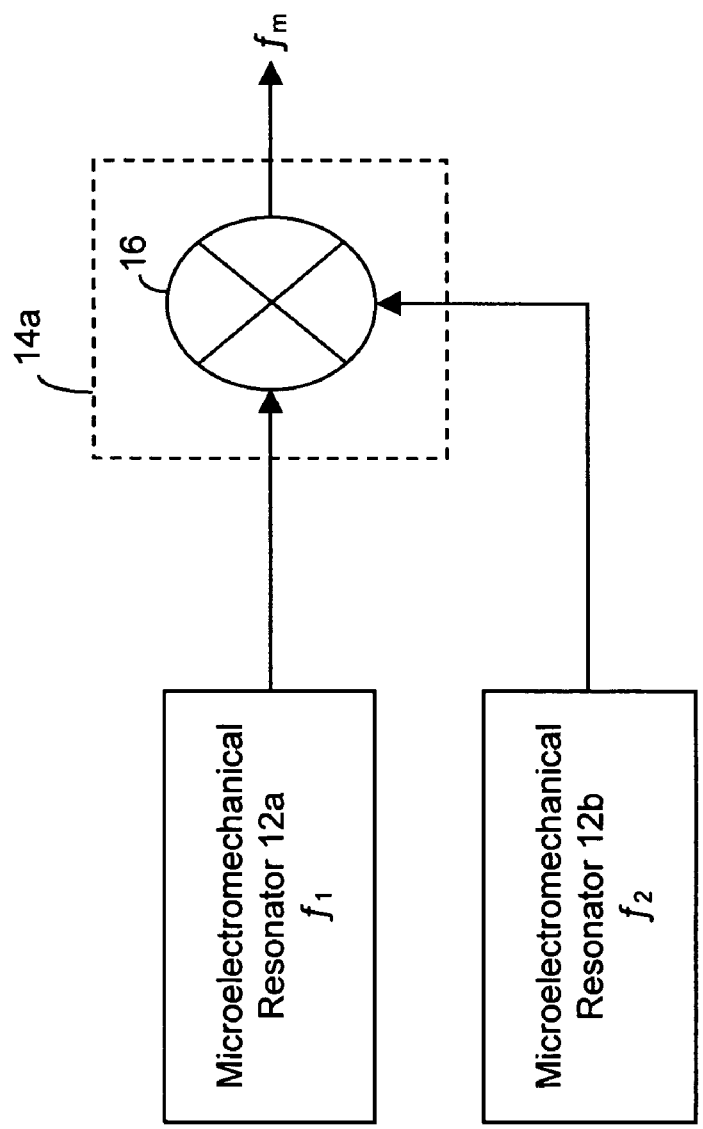
FIG. 5B is a block diagram representation of a microelectromechanical oscillator system of FIG. 5A, wherein the frequency subtraction circuitry includes frequency mixer circuitry, according to certain aspects of the present inventions.

With reference to FIG. 5B, in one embodiment, frequency subtraction circuitry 14a includes frequency mixer circuitry 16 to generate an output signal having substantially stable frequency ($f_m$) over temperature (for example, a given or predetermined temperature range). The frequency mixer circuitry 16 is well known circuitry which provides, generates and/or produces a signal that includes a frequency of the "difference" between the frequencies of the two input signals (the "frequency difference component") and a signal that includes a frequency of the "sum" of the frequencies of the two input signals (the "frequency sum component"). The "frequency difference" component of the output signal of frequency mixer circuitry 16 may be employed as an output signal having a frequency ($f_m$) that is substantially stable over, for example, a given or predetermined temperature range. Notably, the frequency mixer circuitry may be current based or voltage based. Indeed, all forms, types and architectures of frequency mixer circuitry, whether now known or later developed, are intended to fall within the scope of the present inventions.

For example, frequency subtraction circuitry 14a and/or frequency mixer circuitry 16 may be implemented as digital and/or analog circuitry. As such, the subtraction operation may be performed in the digital domain and/or analog domain. For example the frequency subtraction circuitry may be frequency mixer or multiplier circuitry or more generally any non-linear circuitry with two or more inputs and at least one output. Again, the circuit may be digital and/or analog circuitry, such as an XOR gate or more complex circuitry, for example frequency comparison counters with electronic oscillator and control loop. Such circuitry may include one or more microelectromechanical elements that might be separate from the resonators or might be part of the resonators. Again, all forms, types and architectures of frequency subtraction circuitry 14a and/or frequency mixer circuitry 16, whether now known or later developed, are intended to fall within the scope of the present inventions.

Figure 7D:
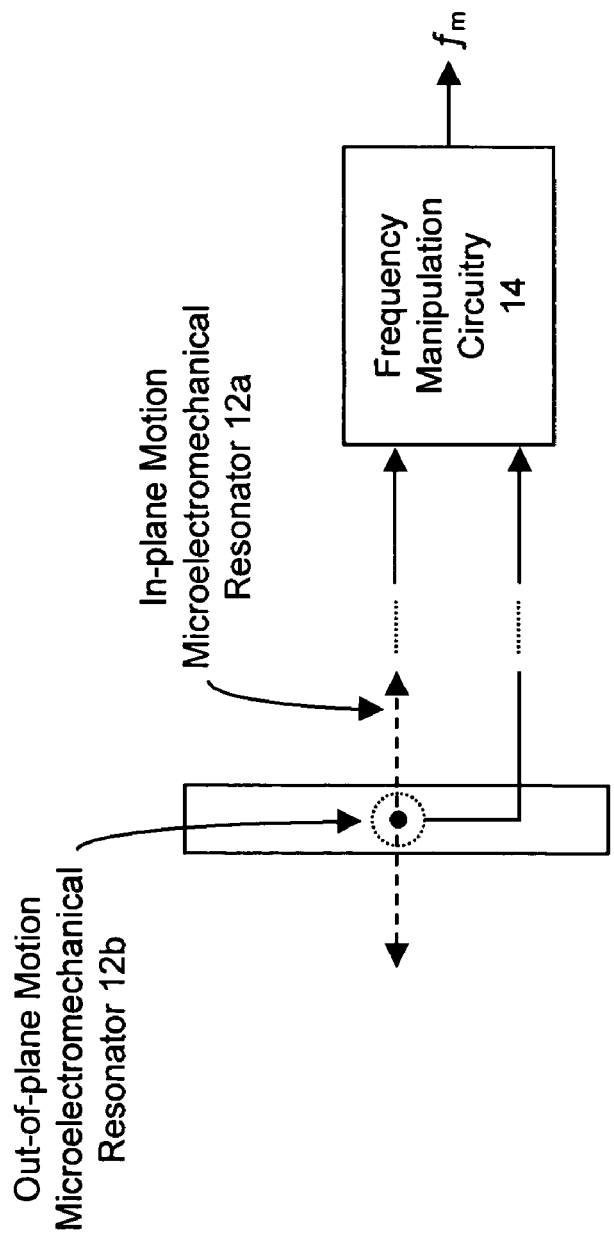
FIG. 7D is a block diagram representation of a microelectromechanical oscillator system according to an embodiment of one aspect of the present inventions, wherein the microelectromechanical resonators are the same resonating beam of the same physical structure which resonate in multiple, different eigen-modes of operation, for example, in-plane and out-of-plane or combinations of lateral or rotational modes that exhibit different temperature coefficients.

The microelectromechanical resonators 12 may employ any type of microelectromechanical resonator design, architecture and/or control, whether now known or later developed; and all such microelectromechanical resonator designs, architectures and/or control techniques are intended to fall within the scope of the present inventions. (See, for example, FIGS. 7A-7C). For example, microelectromechanical resonators 12 may include a resonating beam which is anchored at both ends. (See, for example, FIG. 7A). Moreover, microelectromechanical resonators 12 may include a paddle-like design. (See, for example, FIG. 7B). Indeed, microelectromechanical resonators 12 may be components or portions of the same physical structure (see, for example, FIG. 7C) and/or microelectromechanical resonators 12 may be the same component or portion of the same physical structure that resonate in multiple, different modes of operation, for example, in-plane and out-of-plane (see, for example, FIG. 7D). Again, all microelectromechanical resonator designs, structures, architectures and/or control techniques, whether now known or later developed, are intended to fall within the scope of the present inventions.

Further, microelectromechanical resonators 12 may be fabricated and/or packaged using any fabrication and/or packaging techniques whether now known or later developed. Indeed, all such fabrication and/or packaging techniques are intended to fall within the scope of the present inventions.

Figure 8A:
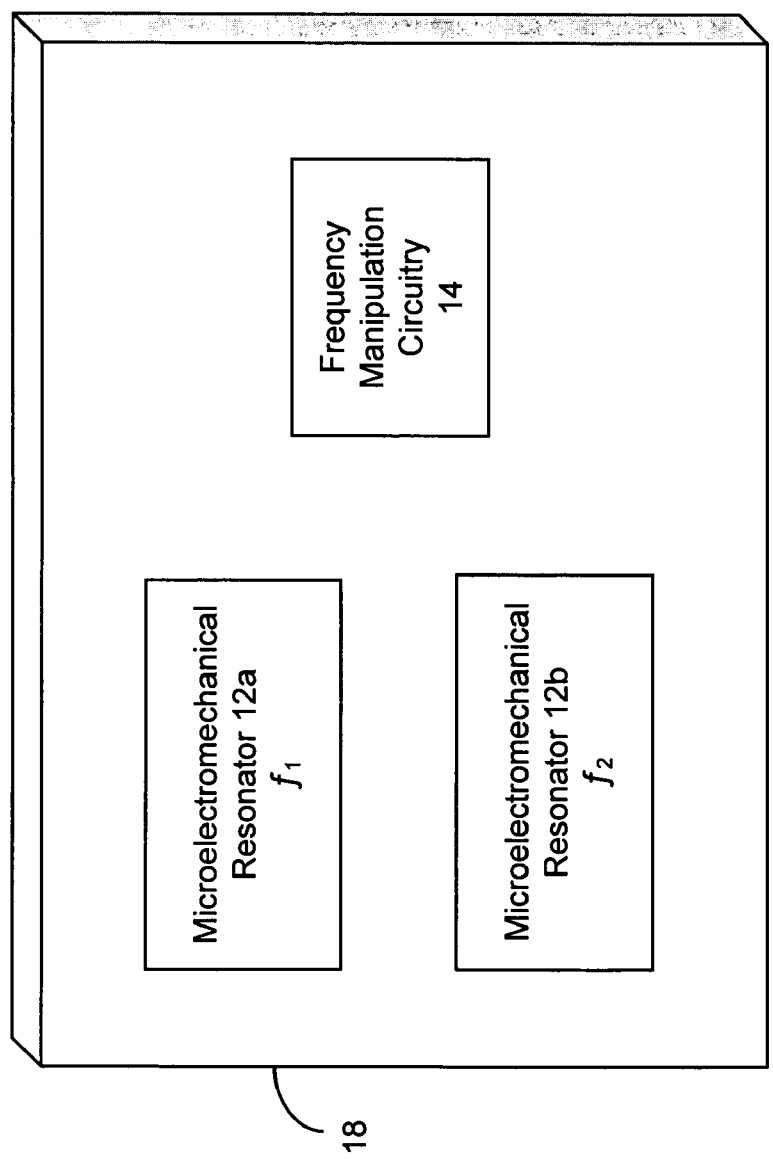
FIGS. 8A-8D illustrate three-dimensional block diagram representations of a plurality of exemplary embodiments of the microelectromechanical oscillator having microelectromechanical resonators and/or frequency manipulation circuitry integrated on/in a common and/or different substrates, according to certain aspects of the present inventions.
Figure 8B:
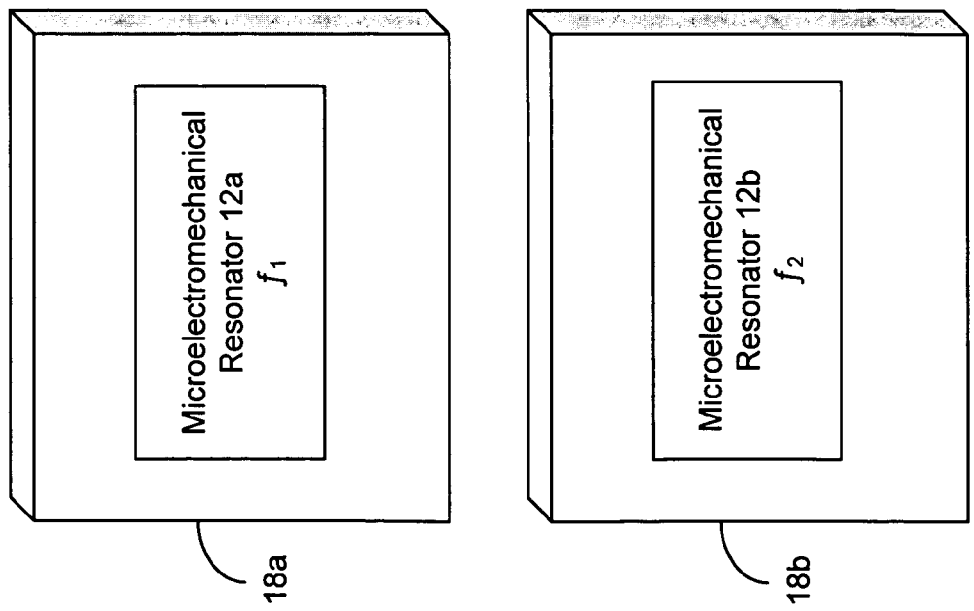
Figure 8C:
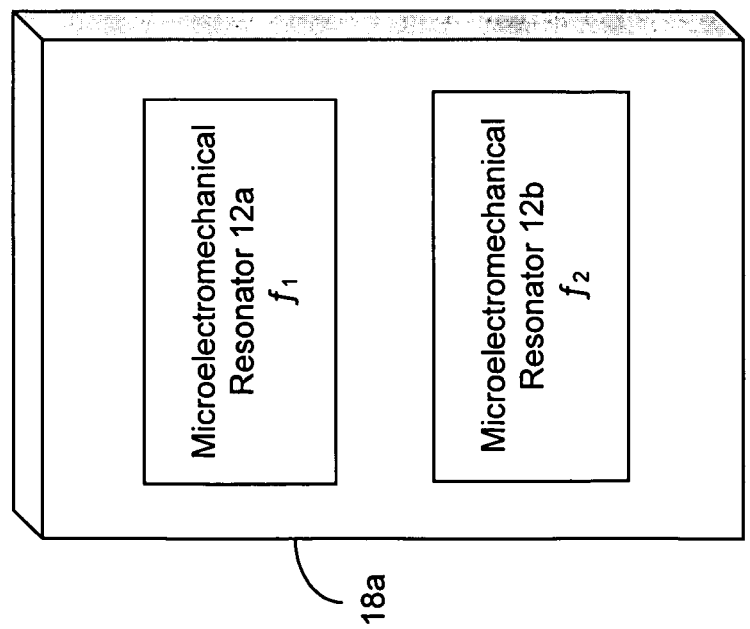
Figure 8D:
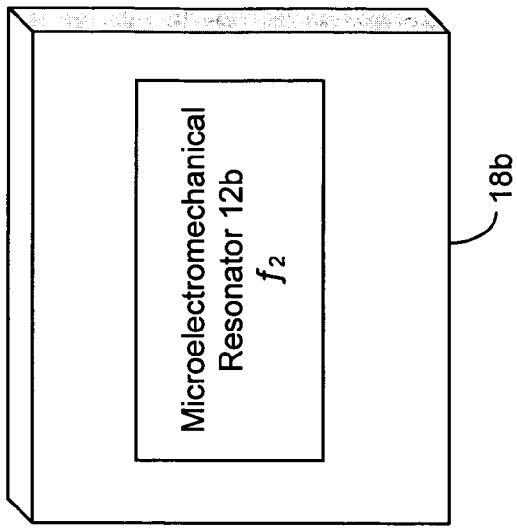
Figure 8D:
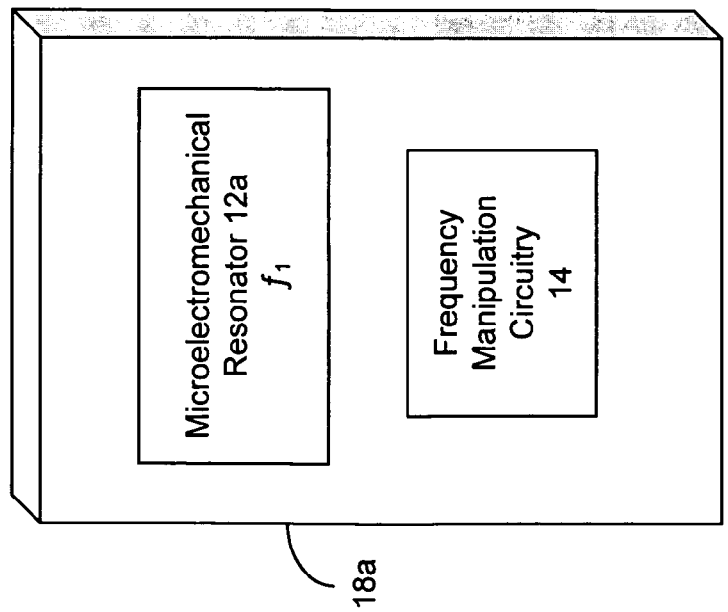

The microelectromechanical resonators 12 may be disposed on/in the same substrate or on/in different substrates. Moreover, frequency manipulation circuitry 14 may be disposed on/in the same substrates as one or more microelectromechanical resonators 12, or on/in a different substrate. In particular, microelectromechanical resonators 12 and/or frequency manipulation circuitry 14 may be integrated on/in the same substrate 18 (see, for example, FIG. 8A), on/in different substrates 18a, 18b and 18c (see, for example, FIG. 8B), on/in different substrates 18a and 18b (see, for example, FIGS. 8C and 8D). All permutations and combinations thereof are intended to fall within the scope of the present inventions.

Figure 8E:
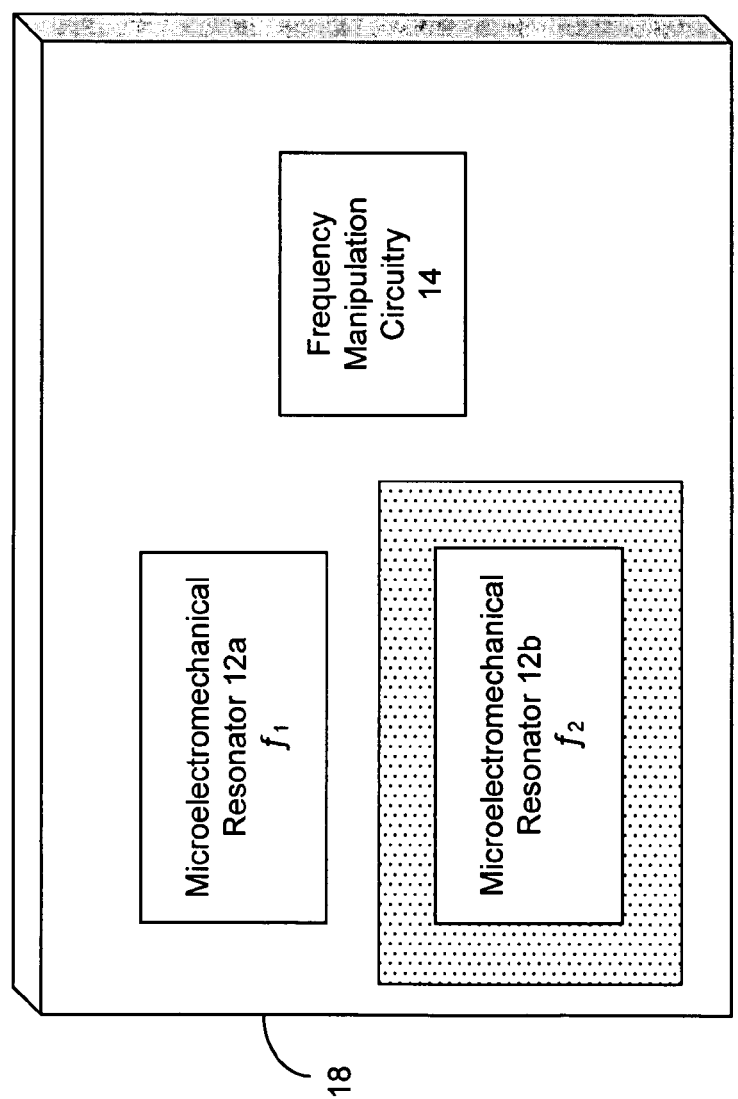
Figure 8F:
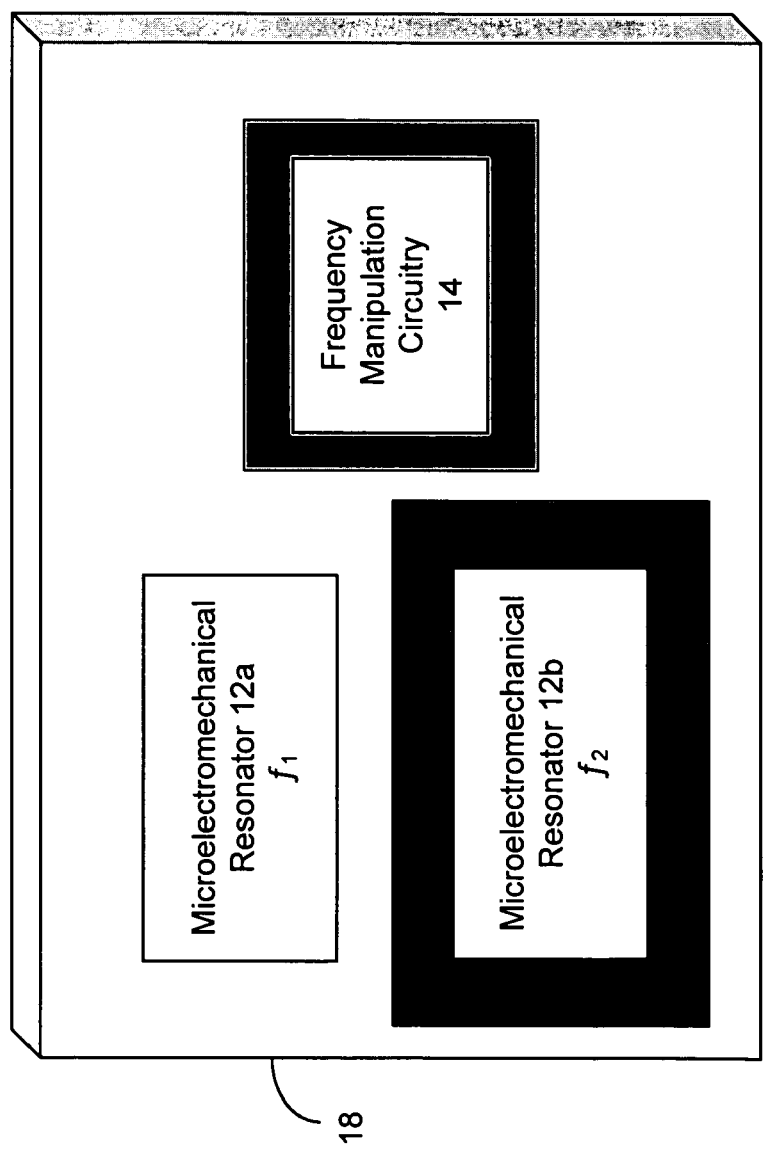
Figure 8H:
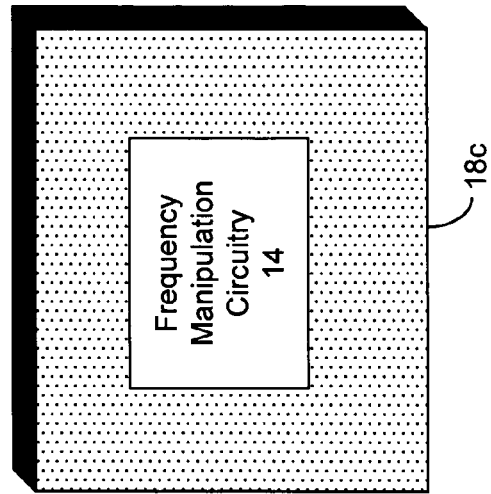
Figure 8H:
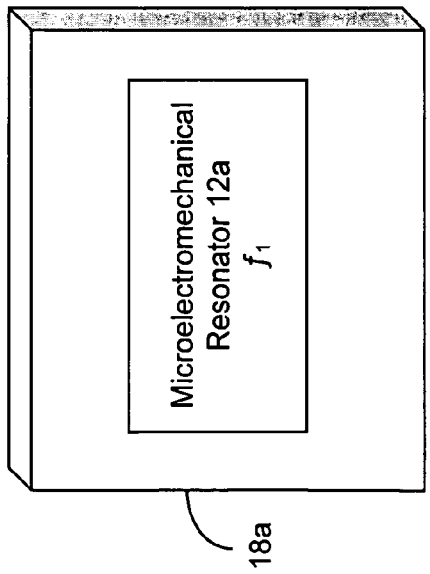
Figure 8H:
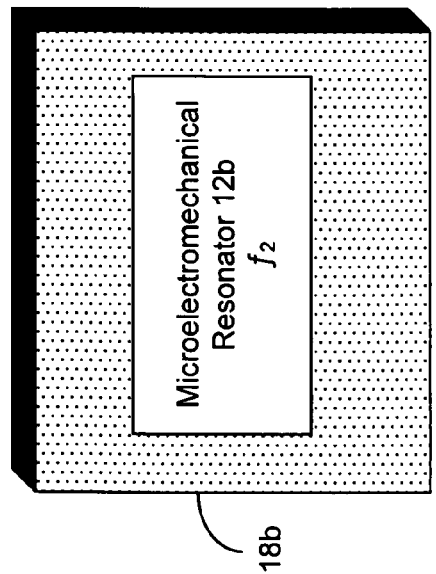
Figure 8I:
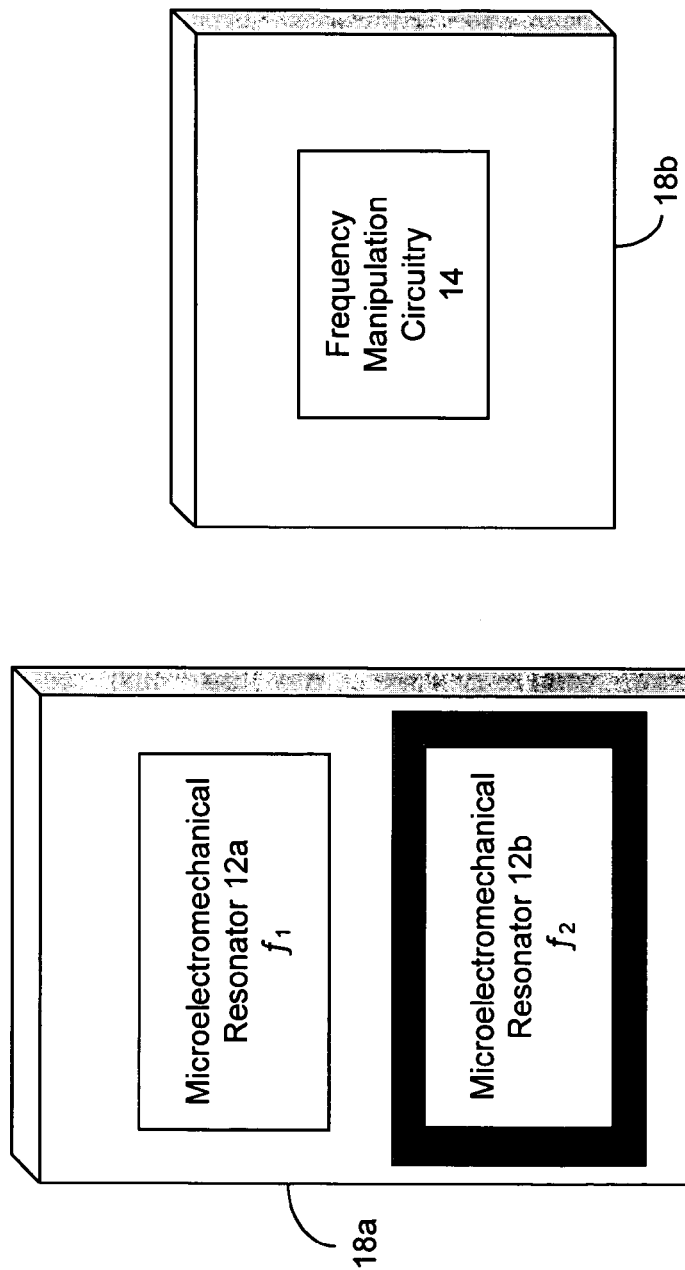
Figure 8J:
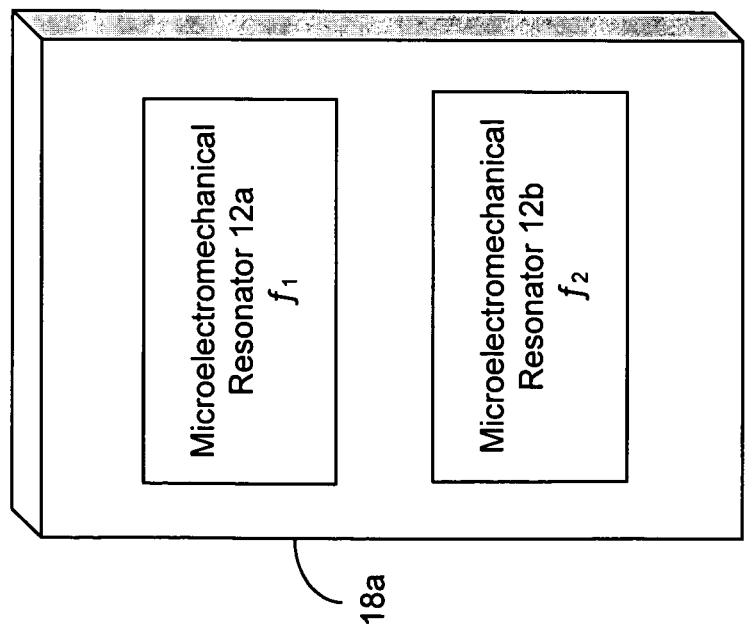
Figure 8K:
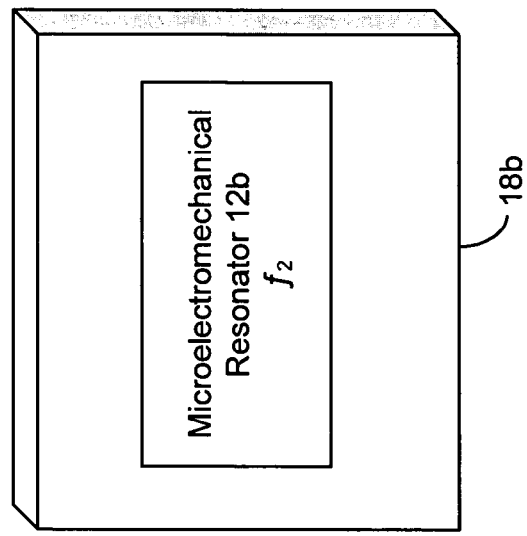
Figure 8K:
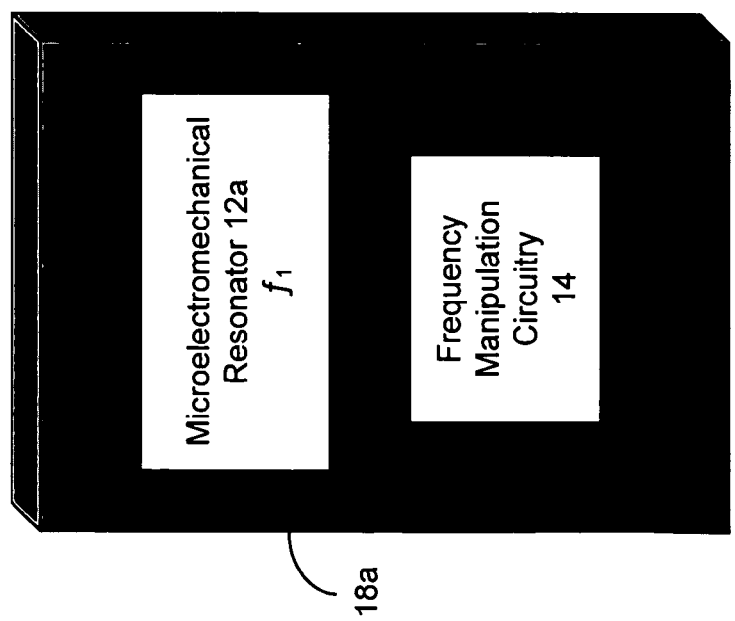

Moreover, microelectromechanical resonators 12 may be fabricated, in whole or in part, in/from the same materials or different materials. (See, for example, FIGS. 8E-8K). For example, microelectromechanical resonators 12 may be integrated on/in the same substrate 18 and in/from different materials (see, for example, FIGS. 8E, 8F and 8I) such as a substrate having monocrystalline silicon and polycrystalline silicon wherein microelectromechanical resonator structure 12a is fabricated in/on monocrystalline silicon and microelectromechanical resonator structure 12b is fabricated in/on polycrystalline silicon. Further, microelectromechanical resonators 12 may be integrated on/in different substrates 18a and 18b and in/from different materials (see, for example, FIGS. 8G and 8H). Moreover, frequency manipulation circuitry 14 and one or more microelectromechanical resonators 12 may also be fabricated in/from the same or different materials (see, for example, FIGS. 8J and 8K). All permutations and combinations thereof are intended to fall within the scope of the present inventions. Moreover, as mentioned above, any fabrication and packaging technique and/or process may be implemented.

Notably, in those instances where microelectromechanical resonators 12 and/or frequency manipulation circuitry 14 (and/or clock alignment circuitry) are fabricated in/on separate substrates, the various signals may be provided using electrical interconnects (not illustrated) connecting bond pads (not illustrated) located in/on substrates and/or flip-chip techniques. Where microelectromechanical resonators 12 and/or frequency manipulation circuitry 14 are fabricated in/on the same substrate, the various signals may be provided using interconnections disposed in/on the substrates. The present inventions may employ any interconnect or interconnection technique/architecture whether now known (for example, wire bonding) or later developed. All such techniques/architectures are intended to fall within the scope of the present inventions.

The output signal of microelectromechanical oscillator system 10 may be single ended or double ended (i.e., differential signaling). The "shape" of the output signal (for example, square, pulse, sinusoidal or clipped sinusoidal) may be predetermined and/or programmable. In this regard, information which is representative of the "shape" of the output signal may be stored or programmed in memory (which is resident in frequency manipulation circuitry 14 and/or the clock alignment circuitry (if any) during fabrication, test, calibration and/or operation. In this way, frequency manipulation circuitry 14 and/or the clock alignment circuitry (if any) may access a resident memory to obtain such information during start-up/power-up, initialization, re-initialization and/or during normal operation of frequency manipulation circuitry 14 and/or the clock alignment circuitry.

Figure 9:
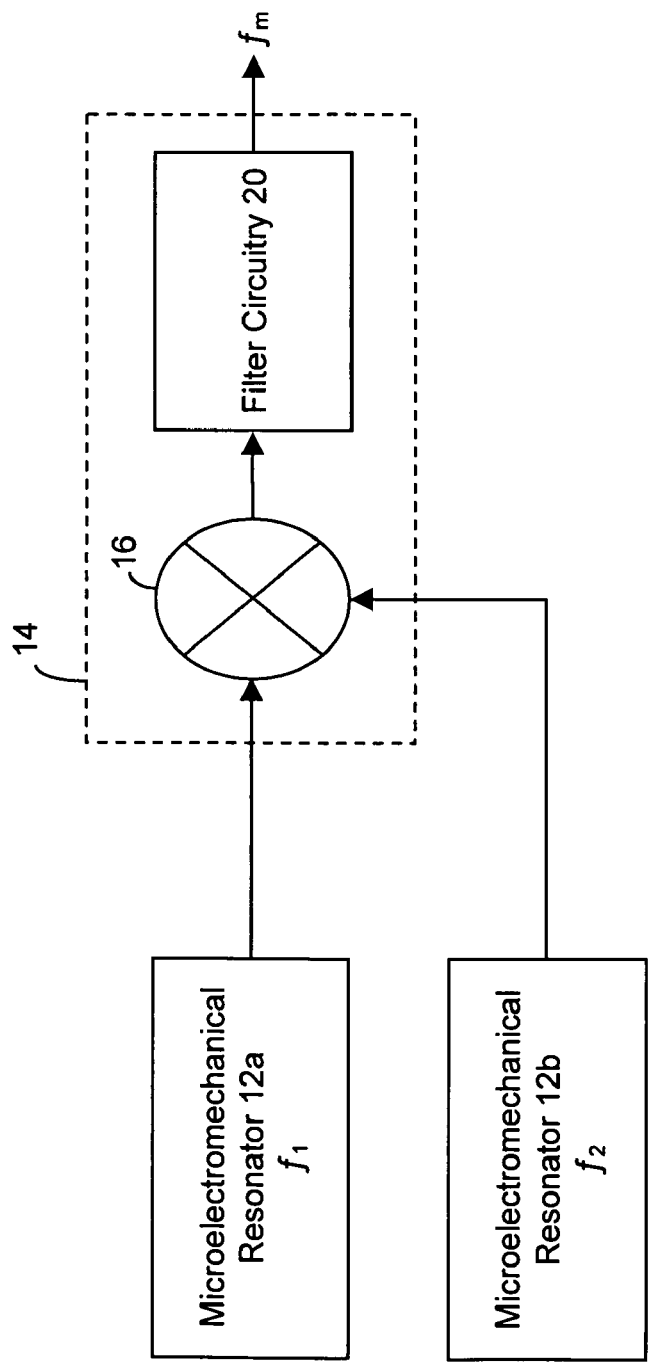
FIG. 9 is a block diagram representation of a microelectromechanical oscillator system, wherein the frequency subtraction circuitry includes frequency mixer circuitry and filter circuitry, according to certain aspects of the present inventions.

With reference to FIG. 9, in one embodiment, frequency manipulation circuitry 14 includes frequency mixer circuitry 16 and filter circuitry 20. In this embodiment, frequency mixer circuitry 16 provides, generates and/or produces a signal having a frequency that is representative of the "difference" between the frequencies of the two input signals and a signal having a frequency that is representative of the "sum" of the frequencies of the two input signals. The filter circuitry 20 may attenuate/filter the output of frequency mixer circuitry 16 to provide either the "frequency difference component" or the "frequency sum component" of the output signal of frequency mixer circuitry 16. For example, where an output signal having a substantially stable frequency over temperature is desired (and, for example, the change in Young's modulus over temperature of microelectromechanical resonators 12a and 12b is the same or substantially the same), a lowpass or bandpass filter may be employed to attenuate the frequency sum component of the output signal of frequency mixer circuitry 16. In this way, any interference by the frequency sum component to further processing of the frequency difference component of the output signal (which includes a substantially stable frequency over temperature) of frequency mixer circuitry 16 may be minimized and/or reduced.

In contrast, where an output signal having a frequency response that changes over operating temperature is desired, a highpass or bandpass filter may be employed to attenuate the frequency difference component of the output signal of frequency mixer circuitry 16. Thus, in this embodiment, interference by the frequency difference component of the output signal to additional processing of the frequency sum component is minimized and/or reduced.

Notably, all forms, types and architectures of (i) filter circuitry, including digital or analog circuitry, and (ii) processing, including digital or analog, whether now known or later developed, are intended to fall within the scope of the present inventions.

In one embodiment, frequency manipulation circuitry 14 may, in addition to or in lieu thereof, generate an output signal having a predetermined frequency that changes over temperature in a predetermined manner. For example, where frequency manipulation circuitry 14 is frequency mixer circuitry 16, the frequency sum component may be employed as a signal which is representative of the operating temperature of microelectromechanical resonator structure 12a and/or microelectromechanical resonator structure 12b. In this regard, the frequency of the signal which is the frequency sum component is dependent on the operating temperature of microelectromechanical resonator structure 12a and/or microelectromechanical resonator structure 12b and, as such, control circuitry may be employed to interpret, analyze and/or correlate the frequency of the signal which is the frequency sum component to an operating temperature.

Figure 10A:
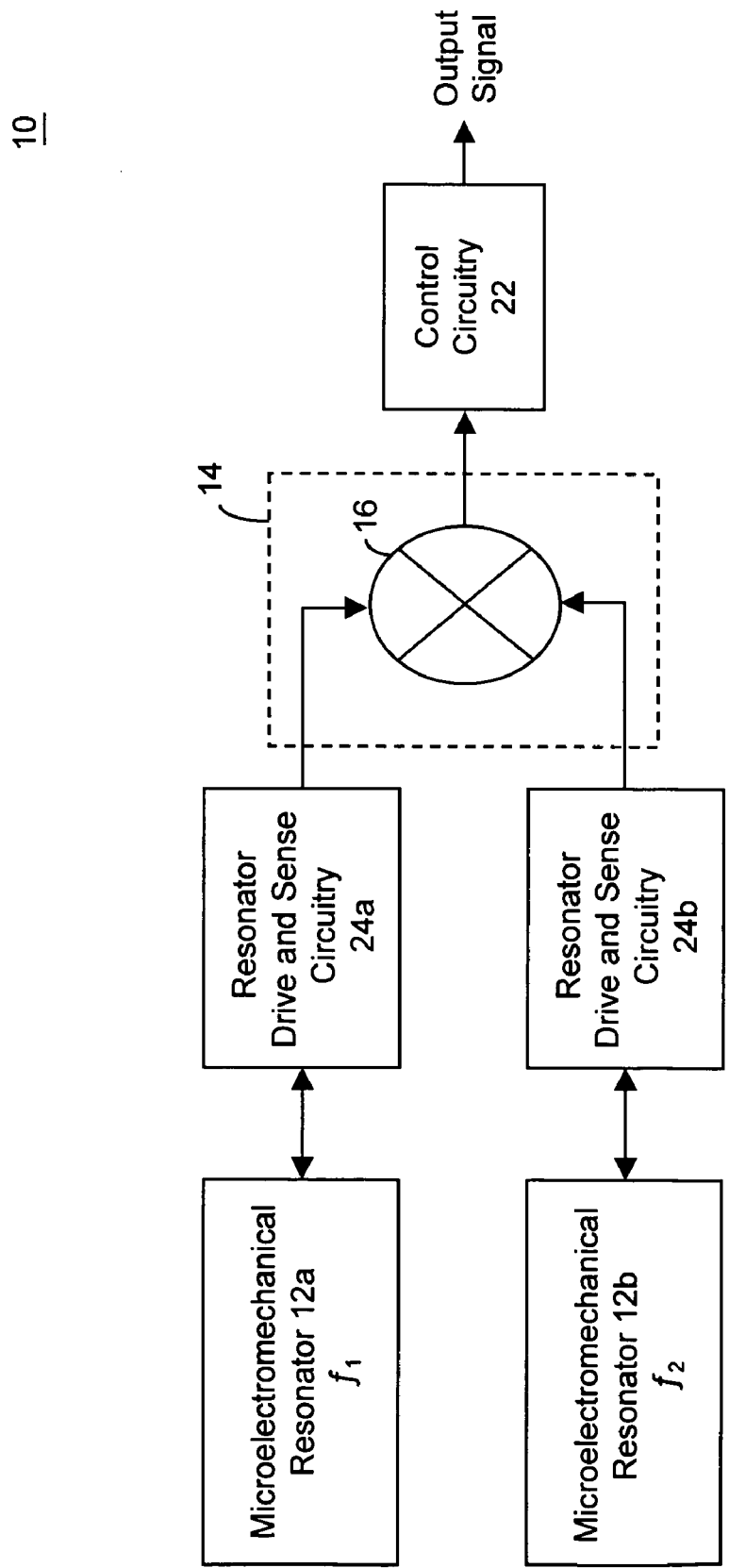
FIG. 10A is a block diagram representation of a microelectromechanical oscillator system having two microelectromechanical resonators, frequency manipulation circuitry (here, frequency mixer circuitry) and control circuitry to provide, generate and/or output a signal which is representative of an operating temperature, according to certain aspects of the present inventions.

With reference to FIG. 10A, in one embodiment, oscillator system 10 employs control circuitry 22 to interpret, analyze and/or correlate the frequency of the signal which is the frequency sum component to an operating temperature. The control circuitry 22, in one embodiment, employs a look-up table (based on empirical and/or theoretical data) and/or a predetermined or mathematical relationship to interpret, analyze and/or correlate the frequency of the frequency sum component to an operating temperature. The control circuitry 22 may generate and/or provide temperature sensor data which is representative of the operating temperature to other circuitry.

Moreover, with continued reference to FIG. 10A, resonator drive and sense circuitry 24 drives an associated microelectromechanical resonator 12 and senses an output signal therefrom. The resonator drive and sense circuitry 24, as well as drive and sense electrodes (not illustrated), may be conventional well-known drive and sense circuitry. Indeed, drive and sense circuitry 24 may be any microelectromechanical drive and sense circuitry whether now known or later developed. For example, drive and sense circuitry 24 may be configured to provide a single-ended output signal or differential output signals.

Notably, drive and sense circuitry 24 may be integrated on the same substrate in which the associated microelectromechanical resonator 12 resides (or is fabricated in). In addition, or in lieu thereof, drive and sense circuitry 24 may be integrated on a substrate that is physically separate from (and electrically connected with) the substrate in which the associated microelectromechanical resonator 12 resides.

In addition, drive and sense electrodes (not illustrated), may be of a conventional, well known type or may be any type and/or shaped electrode whether now known or later developed. Further, the physical electrodes and/or other portions of microelectromechanical resonator 12 may include, for example, capacitive, piezoresistive, piezoelectric, inductive, magnetorestrictive and/or thermal transduction mechanisms. Indeed, all physical transduction mechanisms whether now known or later developed for microelectromechanical systems are intended to fall within the scope of the present inventions.

Figure 10B:
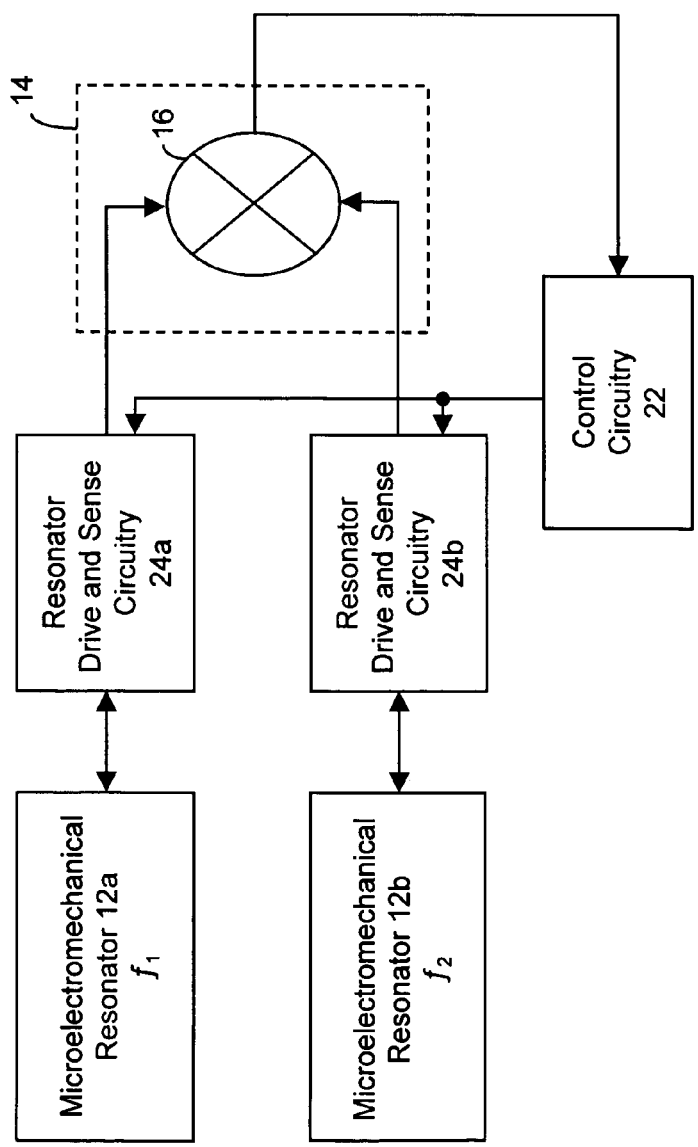
FIG. 10B is a block diagram representation of a microelectromechanical oscillator system having two microelectromechanical resonators, frequency manipulation circuitry (here, frequency mixer circuitry) and control circuitry configured in a feedback architecture with drive and sense circuitry, according to certain aspects of the present inventions.

In one embodiment, control circuitry 22, in response to such temperature data, may adjust and/or control the operation of one or more of microelectromechanical resonators 12 (via the associated resonator drive and sense circuitry 24) to compensate, address and/or correct for, for example, variations of the material properties and/or manufacturing variances of the fabrication processes (and/or for changes in operating temperature of microelectromechanical resonators 12). (See, for example, FIG. 10B). In this regard, the actual frequency of the output of one or more microelectromechanical resonators 12 may require modification and/or adjustment and/or the materials may include differing mechanical properties from anticipated/designed. Accordingly, in one embodiment, control circuitry 22 may instruct and/or cause resonator drive and sense circuitry 24 to adjust, for example, the bias drive for one or more of microelectromechanical resonators 12. In this way, the characteristics of the output signal (for example, frequency) of one or more of microelectromechanical resonators 12 may be adjusted and/or controlled after fabrication and/or in situ. Notably, this process may be repeated until a predetermined (whether before or after fabrication) and/or more desirable or optimum performance of oscillator system 10 is obtained.

Figure 10C:
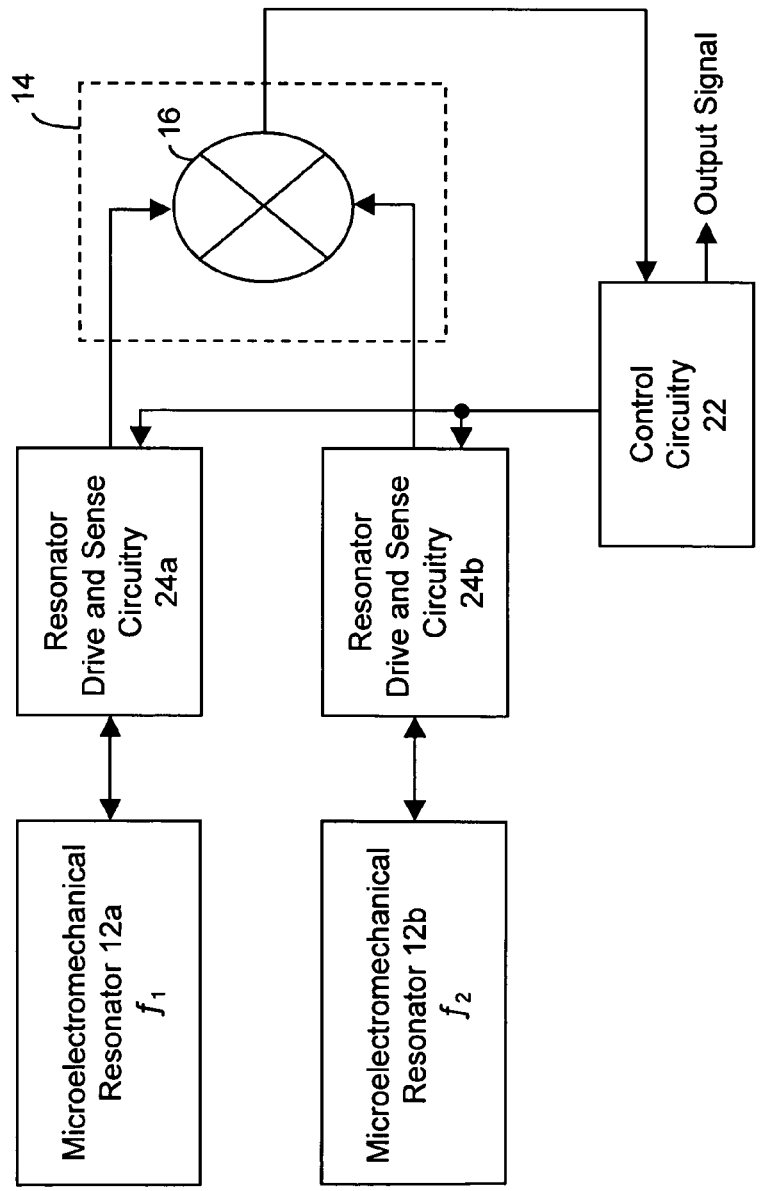
FIG. 10C is a block diagram representation of a microelectromechanical oscillator system having two microelectromechanical resonators, frequency manipulation circuitry (here, frequency mixer circuitry) and control circuitry to provide, generate and/or output a signal which is representative of an operating temperature as well as to provide control information to drive and sense circuitry, according to certain aspects of the present inventions.

With reference to FIG. 10C, in another embodiment, control circuitry 22, in addition to adjusting and/or controlling the operation of one or more of microelectromechanical resonators 12 (via the associated resonator drive and sense circuitry 24) using temperature data from frequency manipulation circuitry, may also provide an output signal which is representative of the operating temperature of microelectromechanical resonators 12. In this way, other circuitry may employ the temperature related data to control, adjust and/or change such circuitry in accordance with operating temperature.

Figure 10D:
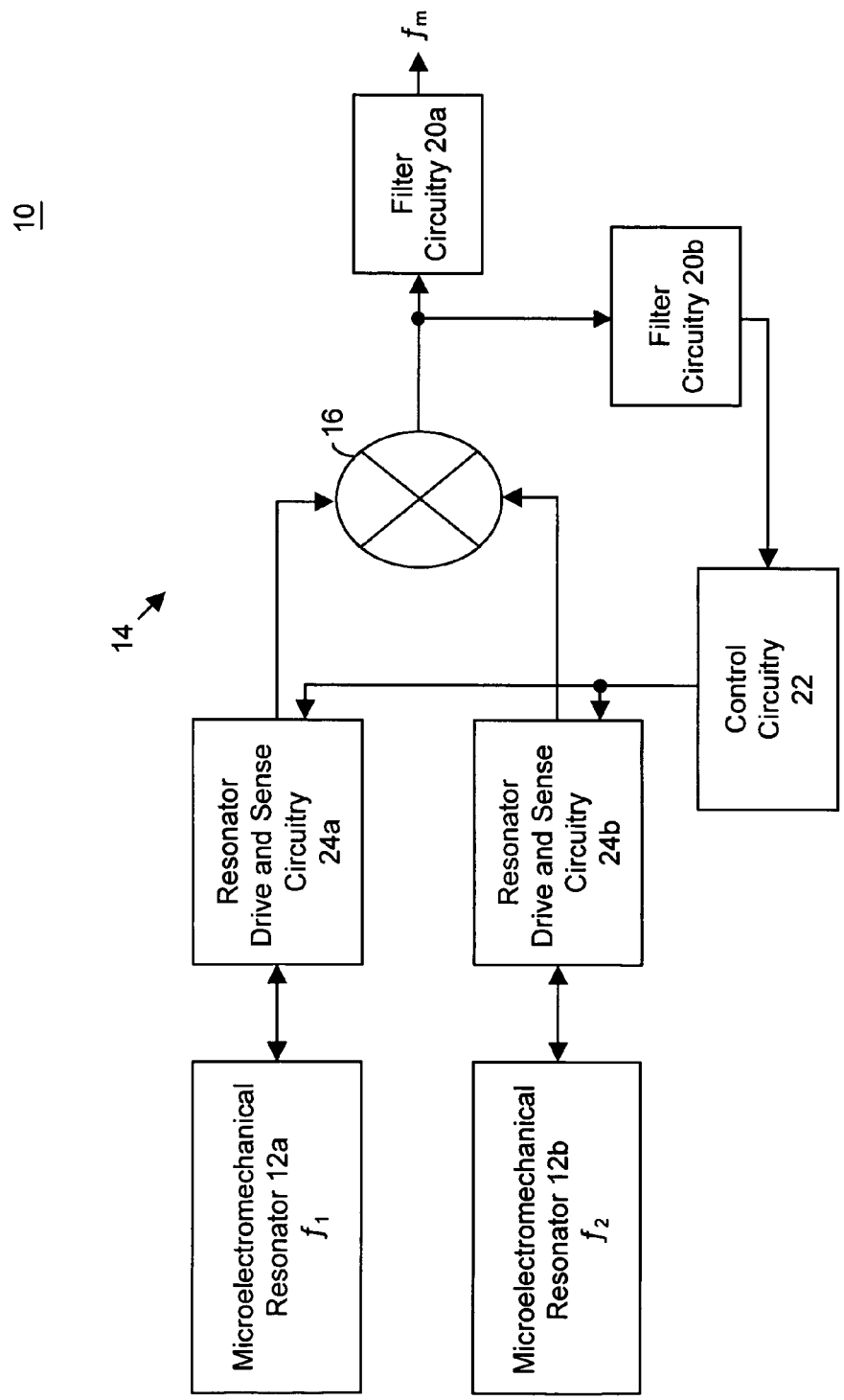
FIG. 10D is a block diagram representation of a microelectromechanical oscillator system having two microelectromechanical resonators, frequency manipulation circuitry (here, frequency mixer circuitry), control circuitry and filter circuitry to provide, generate and/or output control information to drive and sense circuitry and provide, generate and/or output a signal which is relatively stable over at least a given operating temperature range, according to certain aspects of the present inventions.

In addition, with reference to FIG. 10D, in another embodiment, oscillator 10 includes filter circuitry 20a and filter circuitry 20b to selectively attenuate one of the signals generated by frequency manipulation circuitry 14. For example, where frequency mixer circuitry 16 generates a difference signal which includes a frequency that is relatively stable over a predetermined operating temperature, filter circuitry 20a may attenuate the "frequency sum component" of the output signal of frequency mixer circuitry 16 and output the "frequency difference component". In contrast, filter circuitry 20b may attenuate the "frequency difference component" of the output signal of frequency mixer circuitry 16 and provide the "frequency sum component" of the output signal to control circuitry 22 to adjust and/or control the operation of one or more of microelectromechanical resonators 12 (via the associated resonator drive and sense circuitry 24) using temperature data from frequency manipulation circuitry, may also provide an output signal which is representative of the operating temperature of microelectromechanical resonators 12. In this way, for example, other circuitry may employ the temperature related data to control, adjust and/or change such circuitry in accordance with operating temperature.

Figure 10E:
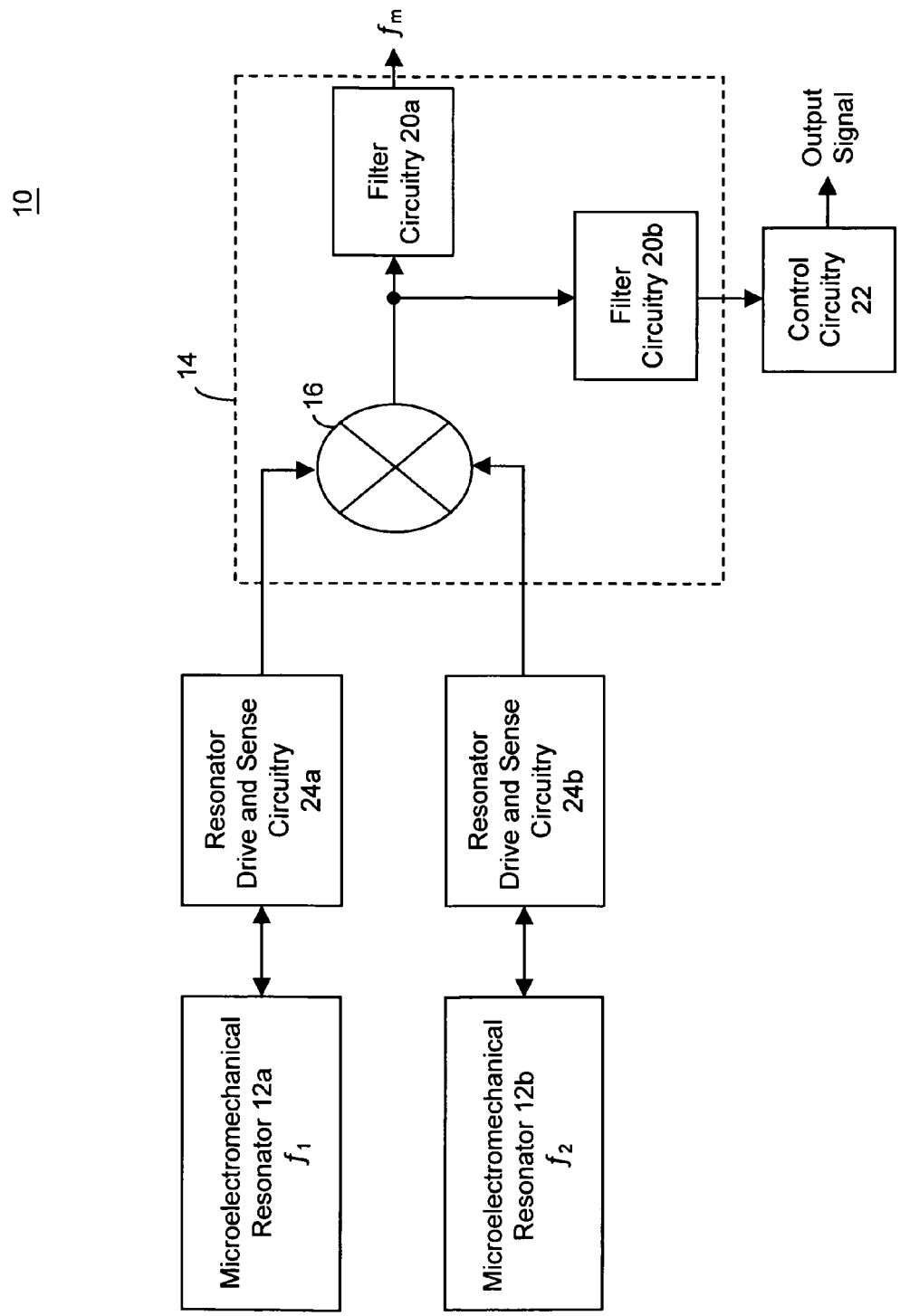
FIG. 10E is a block diagram representation of a microelectromechanical oscillator system having two microelectromechanical resonators, frequency manipulation circuitry (here, frequency mixer circuitry) and control circuitry and filter circuitry to provide, generate and/or output a signal which is relatively stable over at least a given operating temperature range as well as a signal which is representative of the operating temperature of microelectromechanical resonators 12, according to certain aspects of the present inventions.

With reference to FIG. 10E, in another embodiment, oscillator 10 includes filter circuitry 20a and filter circuitry 20b to selectively attenuate one of the signals generated by frequency manipulation circuitry 14 (here illustrated as frequency mixer circuitry 16). In this regard, frequency mixer circuitry 16 generates a "frequency sum component" and a "frequency difference component". The filter circuitry 20a may attenuate one of the components (for example, the "frequency sum component" of the output signal of frequency mixer circuitry 16) and output the "frequency difference component" as a signal having a relatively stable frequency over temperature. The filter circuitry 20b may attenuate the other component (in this example, the "frequency difference component" of the output signal of frequency mixer circuitry 16) and provide the "frequency sum component" of the output signal to control circuitry 22 to provide an output signal which is representative of the operating temperature of microelectromechanical resonators 12. In this way, for example, other circuitry may employ the temperature related data to control, adjust and/or change such circuitry in accordance with operating temperature.

Figure 10F:
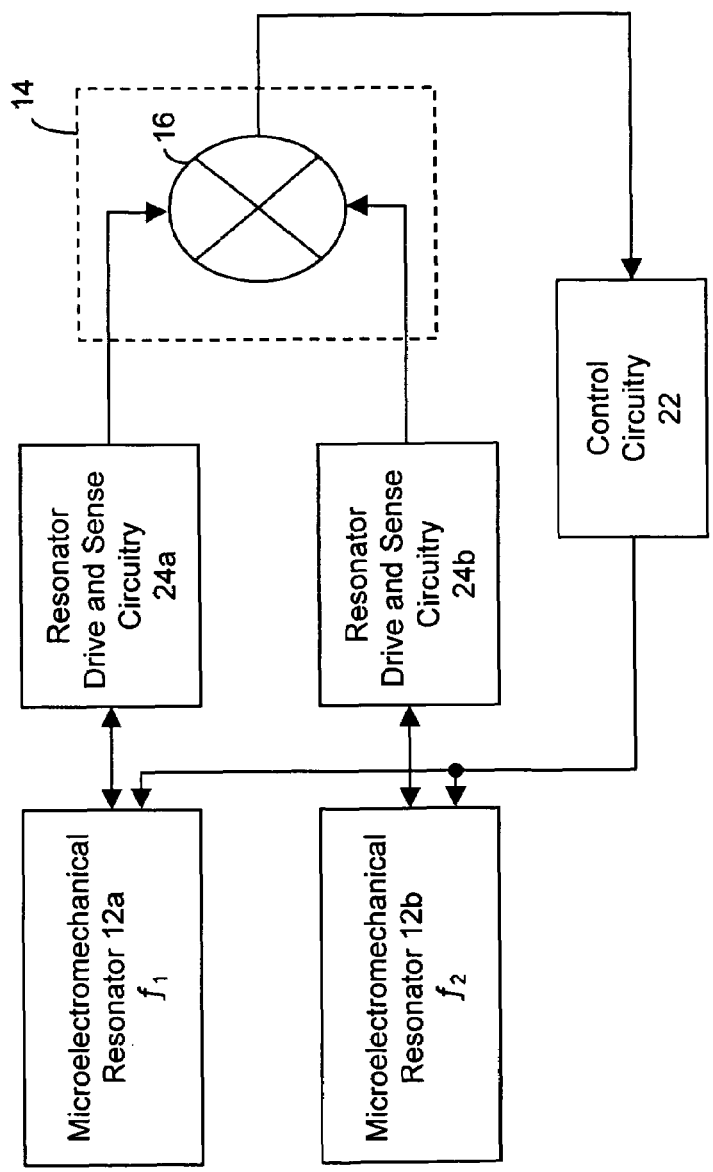
FIG. 10F is a block diagram representation of a microelectromechanical oscillator system having two microelectromechanical resonators, frequency manipulation circuitry (here, frequency mixer circuitry) and control circuitry configured to provide feedback to the microelectromechanical resonators (for example, to adjust a bias voltage of one or more of the microelectromechanical resonators), according to certain aspects of the present inventions.
Figure 11A:
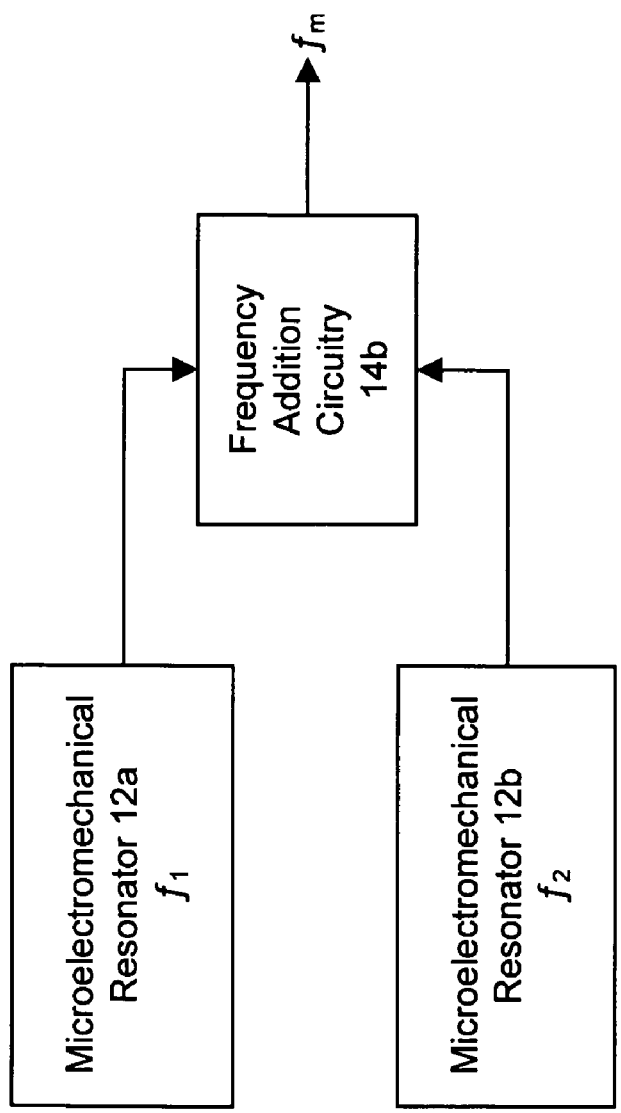
FIGS. 11A and 11B are block diagram representations of microelectromechanical oscillator systems having two microelectromechanical resonators and frequency addition circuitry (FIG. 11A), wherein the frequency addition circuitry may be frequency mixer circuitry (FIG. 11B), according to certain aspects of the present inventions.
Figure 11B:
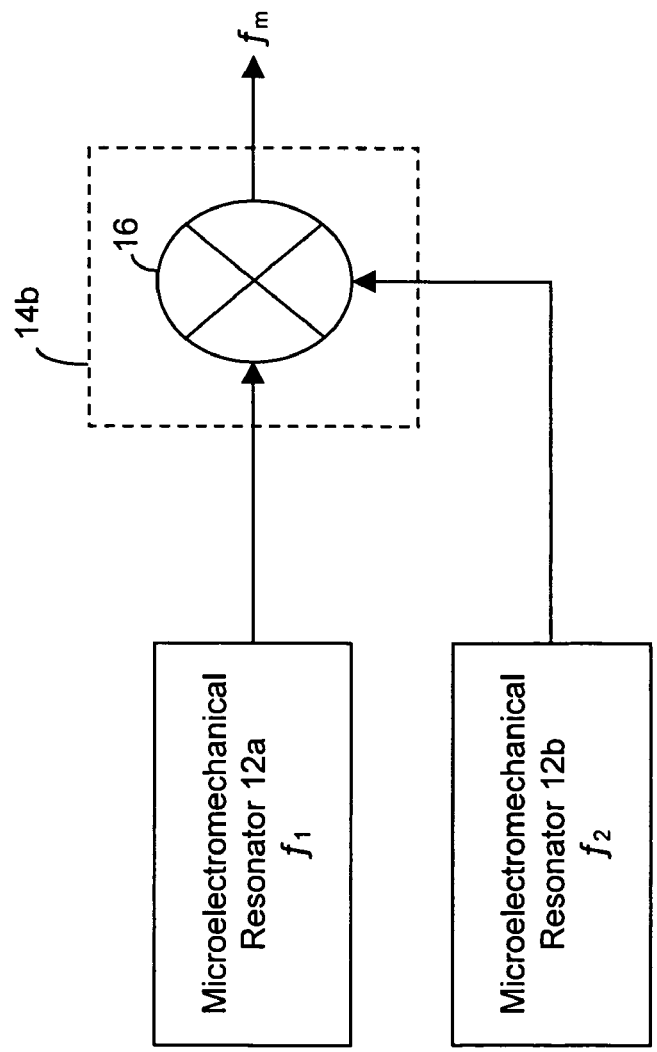

Although the discussion above indicates that control circuitry 22 may provide feedback related information to one or more of resonator drive and sense circuitry 24 in order to adjust and/or control the operation of one or more of microelectromechanical resonators 12 (via the associated resonator drive and sense circuitry 24), the feedback related information may be applied directly to one or more of microelectromechanical resonators 12 to compensate, address and/or correct, for example, variations of the material properties and/or manufacturing variances of the fabrication processes and/or for changes in operating temperature of microelectromechanical resonators 12). (See, for example, FIG. 10F).

Notably, all permutations and combinations of employing the output of frequency manipulation circuitry 14 (for example, the "frequency sum component" and the "frequency difference component" of frequency mixer circuitry 16) in conjunction with, for example, control circuitry 20 and resonator drive and sense circuitry 24, are intended to fall within the scope of the present inventions. For the sake of brevity, such permutations and combinations with not be discussed in detail.

As mentioned above, all types and techniques of control and sense, whether now known or later developed, may be employed with respect to one or more of microelectromechanical resonators 12. All such techniques and circuitry are intended to fall within the scope of the present inventions.

As mentioned above, frequency manipulation circuitry 14 may include circuitry to perform and/or implement subtraction (wherein circuitry 14 includes frequency subtraction circuitry 14a to generate an output signal which is representative of the difference of the frequencies of resonator structures 12) and/or addition (wherein circuitry 14 includes frequency addition circuitry 14b, for example, frequency mixer circuitry 16 (as discussed above), to generate an output signal which is representative of the sum of the frequencies of resonator structures 12). (See, for example, FIGS. 5A, 5B, 11A and 11B). In these embodiments, depending upon the temperature dependence of the frequencies of each microelectromechanical resonator 12 and the desired qualities of the output signal, frequency manipulation circuitry 14 may generate an output signal having a frequency ($f_m$) that is relatively stable over a given or predetermined temperature range and/or that changes over a given or predetermined temperature range in a predetermined manner. As such, frequency manipulation circuitry 14 may provide a signal or signals having a frequency or frequencies that is/are relatively stable over a given or predetermined temperature range and/or representative of the operating temperature of microelectromechanical resonator structure 12a and/or microelectromechanical resonator structure 12b.

Notably, frequency manipulation circuitry 14 may be implemented as digital and/or analog circuitry. As such, the addition and subtraction operations may be performed in the digital domain and/or analog domain. Again, all forms, types and architectures of frequency subtraction circuitry 14a and frequency addition circuitry 14b, whether now known or later developed, are intended to fall within the scope of the present inventions.

Although not illustrated in detail, oscillator system 10 implementing frequency addition circuitry 14b may include control circuitry 22 to interpret, analyze and/or correlate the frequency of the output signal of frequency manipulation circuitry 14 to an operating temperature of one or more of resonator structures 12. The control circuitry 22, in one embodiment, may employ a look-up table (based on empirical and/or theoretical data) and/or a predetermined or mathematical relationship to interpret, analyze and/or correlate the frequency of the output signal to an operating temperature. The control circuitry 22 may generate and/or provide temperature sensor data which is representative of the operating temperature to other circuitry and/or drive and sense circuitry 24 (as mentioned above).

Notably, in one embodiment, the resonant frequency ($f_1$) of resonator structure 12a and the resonant frequency ($f_2$) of resonator structure 12b are the same frequency. In this embodiment, frequency manipulation circuitry 14 may generate an output signal having a frequency ($f_m$) that changes over temperature in a predetermined manner. As mentioned above, under these circumstances, the frequency manipulation circuitry 14 may generate and/or output a signal which is representative of the operating temperature of microelectromechanical resonator structure 12a and/or microelectromechanical resonator structure 12b.

In one embodiment, oscillator system 10 employs control circuitry 22 to interpret, analyze and/or correlate the frequency of the output signal to an operating temperature. The control circuitry 22, as mentioned above, employs a look-up table (based on empirical and/or theoretical data) and/or a predetermined or mathematical relationship to interpret, analyze and/or correlate the frequency of the frequency sum component to an operating temperature. The control circuitry 22 may generate and/or provide temperature sensor data which is representative of the operating temperature to other circuitry.

In another embodiment, control circuitry 22 may adjust, correct and/or control one or more of microelectromechanical resonators 12 to, for example, provide a signal having a frequency within a given, predetermined and/or desired range. For example, control circuitry 22 may adjust, correct and/or control the frequency of the output of resonator structure 12a and/or the frequency of the output of resonator structure 12b. In this regard, based on the frequency of the temperature dependent signals, control circuitry 22, in one embodiment, may employ a look-up table (based on empirical and/or theoretical data) and/or a predetermined or mathematical relationship to adjust and/or control the operation of one or more of resonator structure 12a and/or the frequency of the output of resonator structure 12b. In this way, a more enhanced, desired and/or optimum performance of oscillator system 10, and/or a predetermined frequency of the output signal of frequency manipulation circuitry 14 may be obtained and/or provided given the operating performance, conditions and/or environment of resonators 12 and/or frequency manipulation circuitry 14.

Figure 12A:
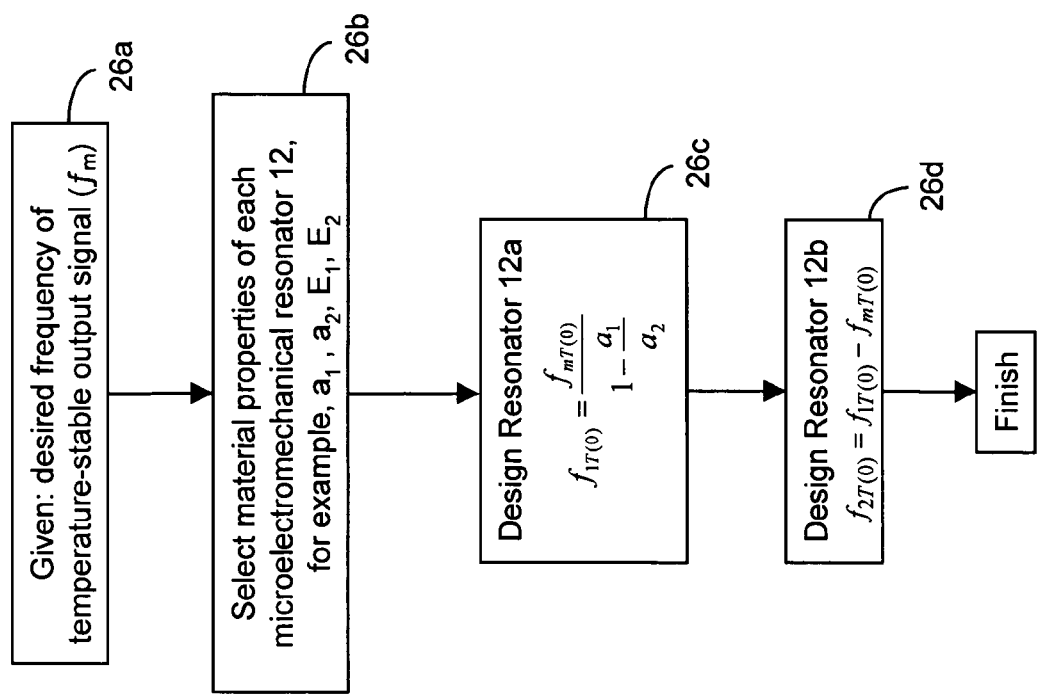
FIGS. 12A and 12B are flow diagrams of exemplary processes to determine and/or identify a plurality of parameters to provide an output signal having a substantially stable frequency (i.e., constant, substantially constant and/or essentially constant frequency) over a predetermined range of operating temperatures, according to certain exemplary embodiments of the present inventions.

In another aspect, the present inventions are directed to a method of designing, determining and/or selecting parameters and/or features of one or more aspects of oscillator system 10. With reference to FIG. 12A, in one embodiment, the method includes identifying a desired frequency ($f_m$) of the temperature-stable output signal. (See, 26a). For example, a substantially stable frequency ($f_m$) over temperature of approximately 100 kHz.

Thereafter, the exemplary method may select and/or identify the materials, the material properties and/or resonator characteristics of each microelectromechanical resonator, (for example, $a_1$, $a_2$, $E_1$, $E_2$). (See, 26b). For example, as mentioned above, as reported in literature or derived/obtained from data reported in literature, for monocrystalline silicon (1) $E_1$=168.9 GPa, and (2) $E_2$=130.2 GPa. Notably, other parameters have recently been measured as $a_1$=−19.0× $10^{-6}$/C, $a_2$=−28.5×$10^{-6}$/C.

After selecting and/or identifying the materials and material properties and/or resonator characteristics, design microelectromechanical resonator structure 12a to provide a frequency ($f_{1T(0)}$) using, for example, $$f_{1T(0)} = \frac{f_{mT(0)}}{1 - \frac{a_1}{a_2}}.$$

In this exemplary embodiment, microelectromechanical resonator structure 12a provides an output signal having a frequency ($f_{1T(0)}$) of approximately 300 kHz. (See, 26c).

With continued reference to FIG. 12A, microelectromechanical resonator structure 12b may be designed/defined using, for example, $f_2=f_1-f_m$, microelectromechanical resonator structure 12b provides an output signal having a frequency ($f_{2T(0)}$) of approximately 200 kHz. (See, 26d).

Thus, using the exemplary process flow of FIG. 12A, the output signal of microelectromechanical resonator 12a includes a resonant frequency $f_1$ which varies over operating temperature, and (ii) the output signal of microelectromechanical resonator 12b includes a resonant frequency $f_2$ which also varies over operating temperature, an output signal having a frequency ($f_m$) that is substantially stable over temperature.

Figure 12B:
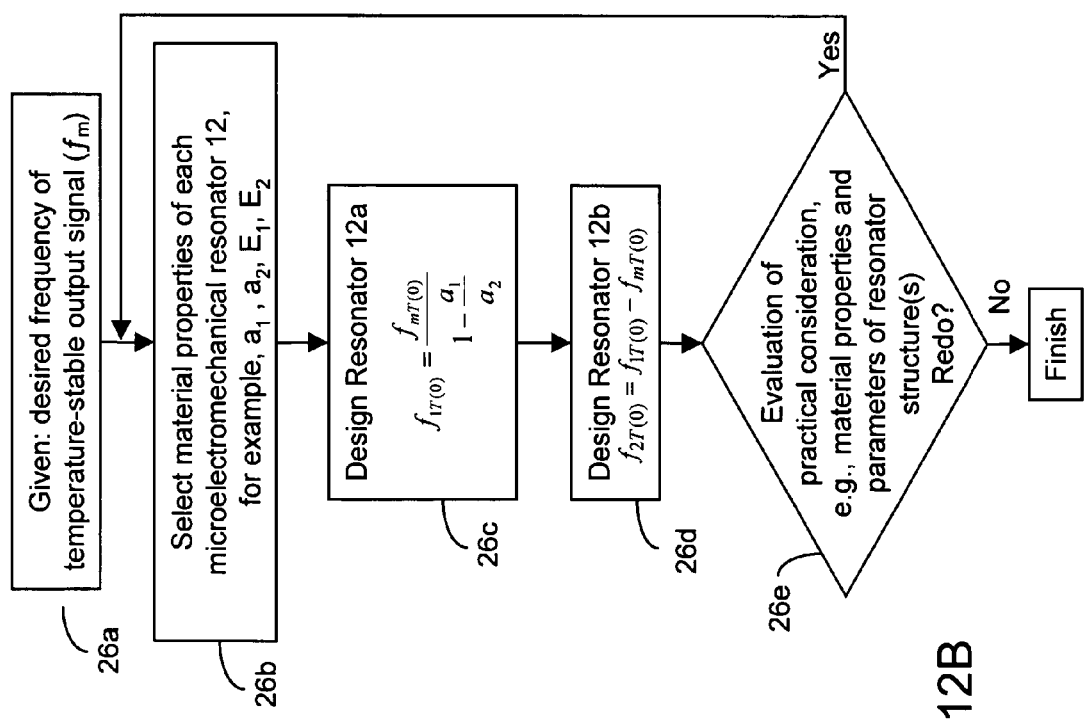

Notably, with reference to FIG. 12B, it may be advantageous to reconsider and/or evaluate the practical consideration of the design of oscillator system 10 after designing/defining features of oscillator system 10. For example, should the design present challenging process constraints, frequency ranges, frequency tolerances, and a limited operating temperature range for one or more of the resonator structures, it may be advantageous to reconsider one or more of the material properties and/or parameters of the resonator structure(s). (See, 26e).

The process flows of FIGS. 12A and 12B are merely exemplary in the context of microelectromechanical resonators 12 having the same temperature dependence characteristics (for example, having the same sign of the first order derivative with respect to temperature). Where the temperature dependence characteristics of microelectromechanical resonators 12 are opposite (for example, having the different signs of the first order derivative with respect to temperature), the design of microelectromechanical resonators 12 assume the implementation of the "sum" component of frequency manipulation circuitry 14. All techniques, processes, and/or criteria, to determine appropriate features of oscillator system 10 for a given frequency response, whether now known or later developed, are intended to fall within the scope of the present inventions.

Notably, further stability of the frequency ($f_m$) of the output signal of frequency manipulation circuitry 14 (relative to temperature variations) may be obtained upon consideration of second and higher order terms. With respect to the second order terms, the adverse impact of the second order terms may be minimized, eliminated and/or reduced by providing $$\frac{f_{1T(0)}}{f_{2T(0)}}$$

equal to, or approximately equal to, $$\frac{b_2}{b_1}.$$

Under these circumstances, the stability of the frequency ($f_{mT(0)}$) of the output signal of frequency manipulation circuitry 14 (relative to temperature variations) may be enhanced thereby further reducing, limiting and/or minimizing the temperature dependence thereof.

Thus, providing a configuration whereby $$\frac{a_1}{b_1} = \frac{a_2}{b_2}$$

may enhance the stability of the frequency ($f_m$) of the output signal of frequency manipulation circuitry 14 (relative to temperature variations) thereby further reducing, limiting and/or minimizing the temperature dependence thereof. Indeed, further stability may be obtained with consideration of third or larger order terms.

Notably, in one embodiment, the output signal of oscillator system 10 in each instance includes desired, selected and/or predetermined characteristics (for example, desired, selected and/or predetermined frequency) at a given, predetermined and/or particular frequency and/or temperature. The output signal of oscillator system 10 in each instance may also include desired, selected and/or predetermined characteristics for a frequency, over a set or range of frequencies and/or set or range of temperatures. For example, with reference to FIG. 5A, the frequency versus temperature of the output signal of oscillator system 10 is substantially stable (i.e., constant, substantially constant and/or essentially constant) and, as such, the frequency remains constant (or substantially constant) over a range of temperatures (for example, the operating temperatures of oscillator system 10 and/or one or more of resonators 12).

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims (are possible by one skilled in the art after consideration and/or review of this disclosure). As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present inventions.

Figure 13:
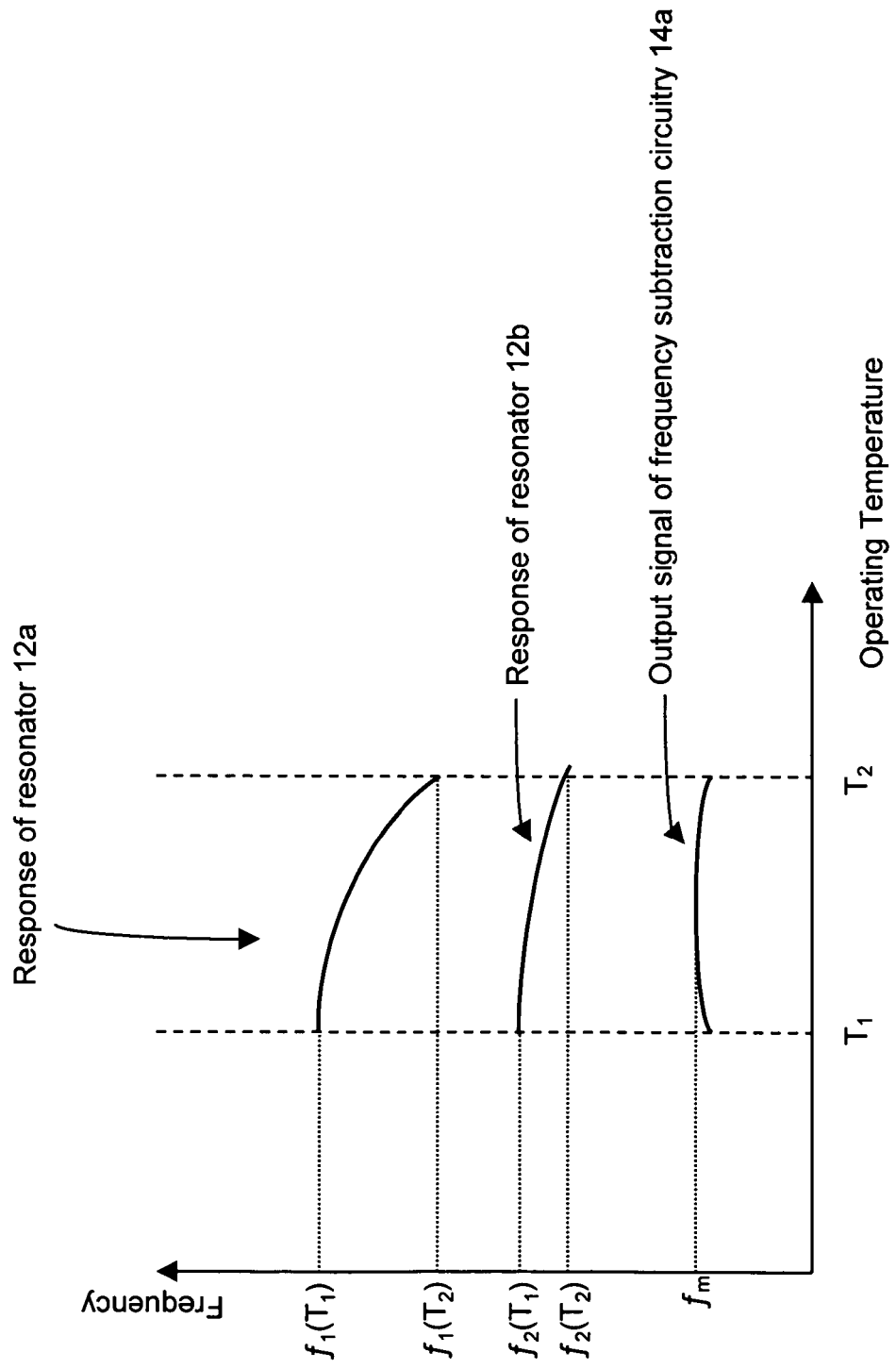
FIG. 13 is a graphical illustration of the change of frequency of the output signal of the two microelectromechanical resonators of FIG. 3 wherein an offset is incorporated into configuring the oscillator system to provide a "shaping" of the frequency response of the output of the frequency manipulation circuitry to provide a turn-over region or frequency around $f_m$.

For example, in one embodiment, the frequency spectrum of the output signal of frequency manipulation circuitry 14 may be "shaped" in order to provide a predetermined response that varies over operating temperature. In this regard, with reference to FIG. 13, the temperature-dependent response of the output signal of frequency manipulation circuitry 14 may be selected to provide a desired response over a predetermined temperature range and/or at one or more particular temperatures.

The frequency manipulation circuitry 14 providing "shaped" frequency response over operating temperature generates a signal that is dependent on the operating temperature of one or more of resonators 12a and 12b. The control circuitry 22 may be employed to interpret, analyze and/or correlate the frequency of the output signal to an operating temperature. The control circuitry 22, as mentioned above, may employ a look-up table (based on empirical and/or theoretical data) and/or a predetermined or mathematical relationship to interpret, analyze and/or correlate the frequency of the output signal to an operating temperature. The control circuitry 22 may generate and/or provide temperature sensor data which is representative of the operating temperature to other circuitry.

In another embodiment, control circuitry 22 may adjust, correct and/or control one or more of resonators 12 to, for example, provide a signal having a frequency within a given, predetermined and/or desired range. In this regard, in one embodiment, control circuitry 22 may instruct and/or cause resonator drive and sense circuitry 24 to adjust, for example, the bias drive for one or more of microelectromechanical resonators 12. In this way, control circuitry 22 may "force" the characteristics of the output signal (for example, frequency) of one or more of microelectromechanical resonators 12 to adjust the output signal of frequency manipulation circuitry 14 to provide a desired and/or predetermined frequency (for example, where the frequency provides a zero slope (here, $f_m$) or "turn-over" region or frequency around frequency $f_m$.

The control circuitry 22 may adjust and/or control frequency manipulation circuitry 14 and/or resonators 12 in situ. Notably, all operations and/or functions described above with respect to control circuitry 22 are applicable to this embodiment. For the sake of brevity, those discussions will not be repeated.

In certain embodiments, incorporating an "offset term" may also facilitate compensating and/or addressing any second or higher temperature dependent terms. For example, not entirely canceling the first-order frequency function of temperature may facilitate shaping of the residual second order response, reducing the maximum absolute change over temperature of the output frequency function of temperature. In this case, the residual first-order term is referred to as an "offset term". As mentioned above, although $$\frac{a_1}{a_2} = \frac{b_1}{b_2}$$

may enhance the stability of the frequency ($f_m$) of the output signal of frequency manipulation circuitry 14 (relative to temperature variations) by reducing, limiting, minimizing and/or eliminating the adverse affects of second or larger order terms, where the characteristics of the material and/or the architecture or design of one or more microelectromechanical resonators 12 prohibit, limit and/or prevent the effects of the second or larger order terms (regardless of reason), an "offset term" may be employed to adjust, address and/or compensate for the temperature impact on the frequency of the output of frequency manipulation circuitry 14 due to second or higher temperature dependent terms.

Notably, the frequency vs. temperature curve may be shaped by selectively canceling, partially-canceling, or adjusting the temperature-dependent terms. For instance, the first and third-order temperature dependence may be "canceled", but the second-order dependence may not be canceled, or fully canceled, thereby providing a frequency turnover point for temperature-controlled oscillator applications. Moreover, a portion of the first-order temperature dependence may be used to "shift" the position of the turnover point.

Figure 14A:
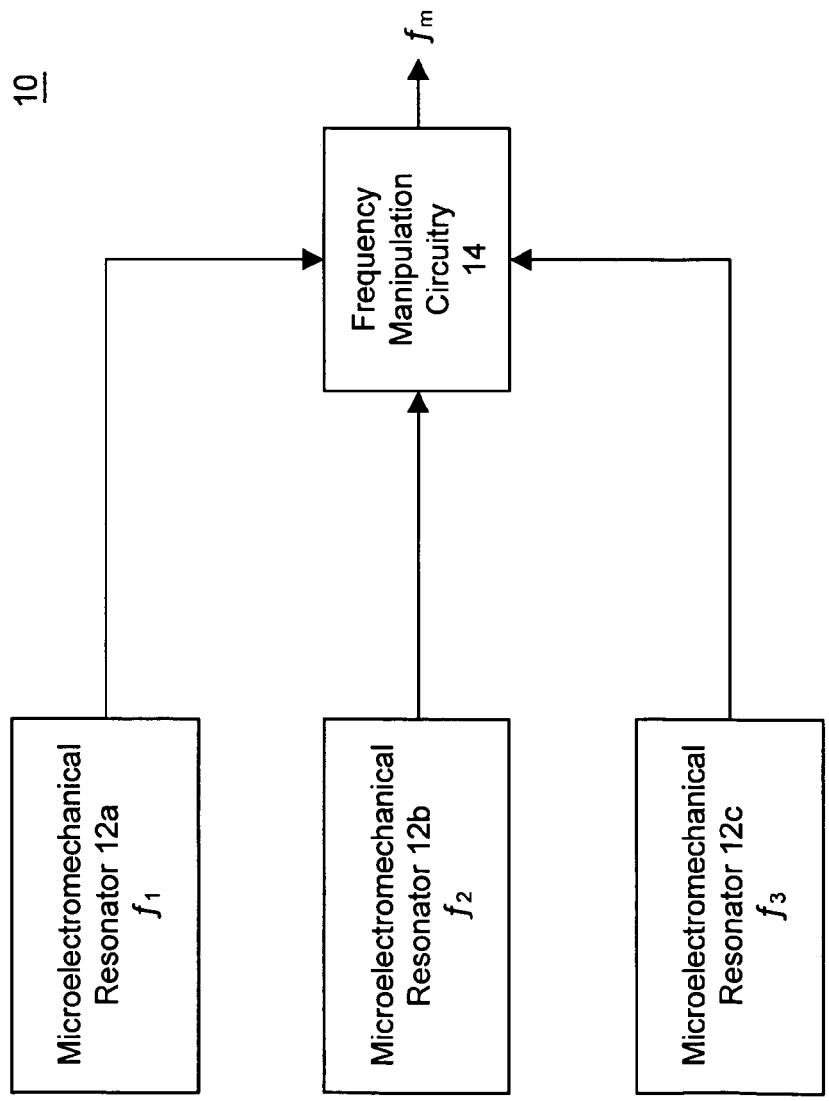
Figure 14B:
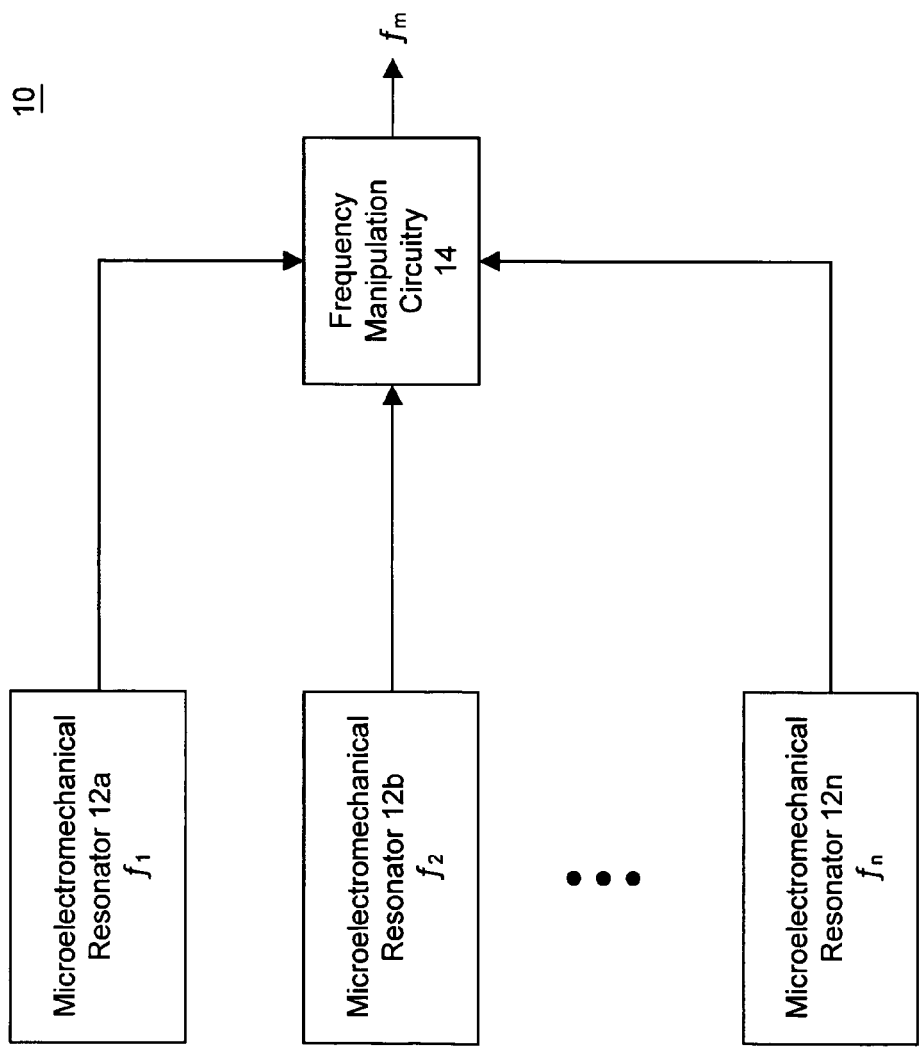

For temperature-stable oscillators, where microelectromechanical resonators 12a and 12b of oscillator 10 do not have the characteristics to eliminate, minimize and/or reduce both first and second-order temperature dependence, oscillator 10 may include three or more microelectromechanical resonators 12. With reference to FIGS. 14A and 14B, in this embodiment, the output signals from three or more microelectromechanical resonators 12 may be applied to frequency manipulation circuitry 14 and thereby "combined" (for example, added or subtracted in appropriate combinations) to eliminate, minimize and/or reduce first and second-order (and/or higher order terms) temperature dependence. In this regard, one or more additional microelectromechanical resonators 12c or 12c-12n, respectively, may be employed, as represented in the equation immediately below, to cancel, minimize, reduce and/or eliminate at least one of the higher order temperature-dependent terms in the equation:

$$f_m(T) = \pm f_1(T) \pm f_2(T) \pm f_3(T) \pm \ldots$$

Notably, the sign in the equation immediately above may be "selected" to provide for one or more predetermined temperature-dependence terms to cancel, offset and/or reduce, eliminate and/or minimize its impact on the output frequency.

As an example, it may be advantageous to subtract the frequencies of each of microelectromechanical resonators 12b and 12c from microelectromechanical resonator 12a (where oscillator 10 includes resonators 12a-12c) from 12a. As such, $f_m(T) = f_1(T) - f_2(T) - f_3(T)$. Under these circumstances, $$a_1 f_{1T(0)} - a_2 f_{2T(0)} - a_3 f_{3T(0)} = 0$$

$$b_1 f_{1T(0)} - b_2 f_{2T(0)} - b_3 f_{3T(0)} = 0$$

$$F_{1T(0)} - f_{2T(0)} - f_{3T(0)} = f_{mT(0)}$$

Thereafter, the equations may be solved for $f_{1T(0)}$, $f_{2T(0)}$, and $f_{3T(0)}$. Notably, the solution to these equations may be, in part, dependent upon the materials selected for each resonator, and the relationship between the parameters $a_1$, $a_2$, $a_3$, $b_1$, $b_2$, $b_3$ in these materials.

Further, cancellation of first and higher-order temperature terms need not be done sequentially. For example, microelectromechanical resonators 12a and 12b may be used to cancel the second-order temperature dependence, and not cancel the first-order temperature dependence. That is, the output signals microelectromechanical resonators 12a and 12b may be applied to frequency manipulation circuitry 14 and thereby "combined" (for example, added or subtracted in appropriate combinations) to eliminate, minimize and/or reduce second-order (and/or higher order terms) temperature dependence and not the first-order temperature dependence term. Notably, canceling the second and higher-order terms while not canceling the first-order may be used to sense the operating temperature of the microelectromechanical resonators. In this case, a large change in the output frequency with respect to temperature is desired, and a linear response is desired. The methods employed above may be used to minimize, cancel, or reduce the effect of the second-order terms, while substantially leaving the first-order terms of the frequency function of temperature.

As mentioned above, microelectromechanical resonators 12 may employ any type of microelectromechanical resonator design, architecture and/or control, whether now known or later developed. Indeed, microelectromechanical resonators 12 may be components or portions of the same physical structure (see, for example, FIG. 7C) and/or microelectromechanical resonators 12 may be the same component or portion of the same physical structure that resonate in multiple, different modes of operation, for example, in-plane and out-of-plane (see, for example, FIG. 7D). Further, microelectromechanical resonator 12 may be fabricated and/or packaged using any fabrication and/or packaging techniques, whether now known or later developed. As such, all such fabrication and/or packaging techniques are intended to fall within the scope of the present inventions.

The microelectromechanical resonators 12 may or may not include control circuitry that monitors, alters, controls and/or adjusts the operating temperature of microelectromechanical resonators 12 and/or frequency of the output signal of structure 12. All techniques for altering, controlling and/or adjusting the operation of microelectromechanical resonator structure 12, whether now known or later developed, are intended to be within the present inventions.

Figure 15A:
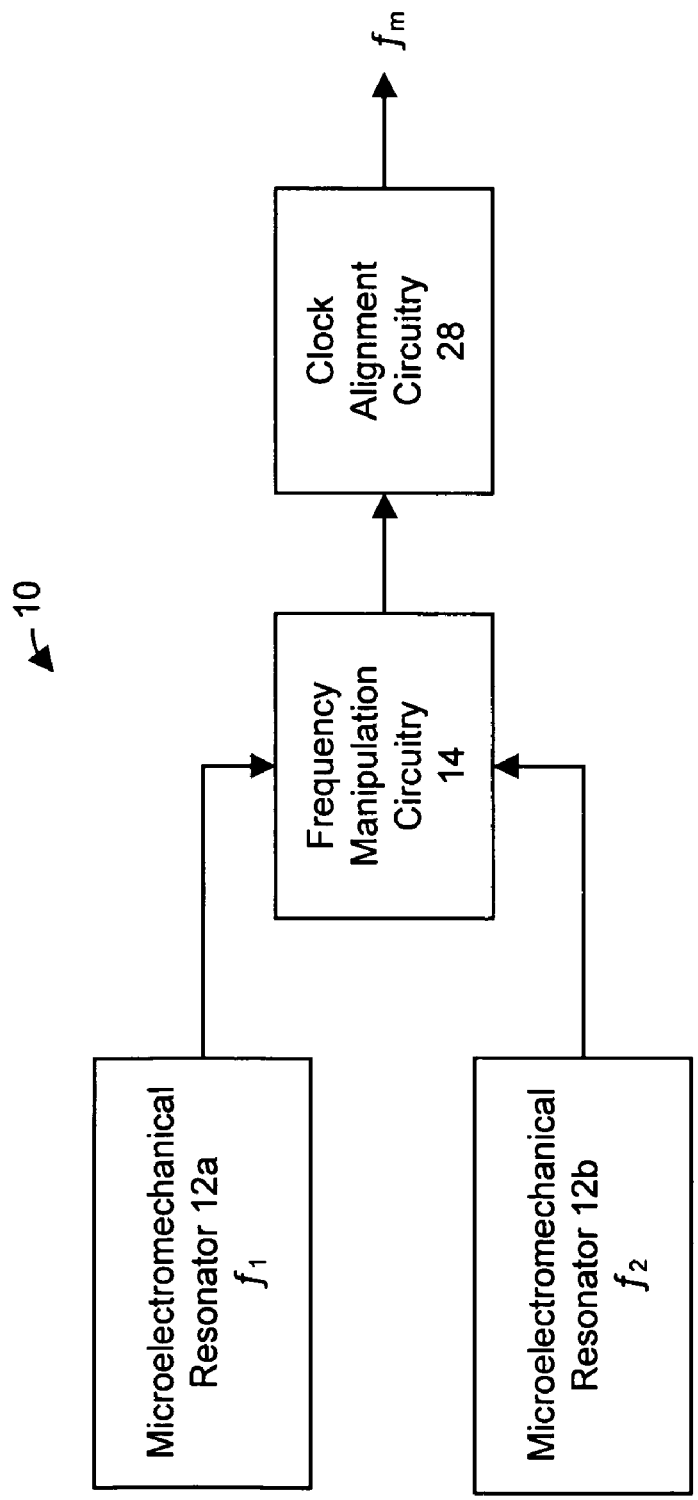
FIGS. 15A and 15B are block diagram representations of a microelectromechanical oscillator system, including two microelectromechanical resonators and frequency manipulation circuitry, in conjunction with clock alignment circuitry, according to certain aspects of the present inventions.
Figure 15B:
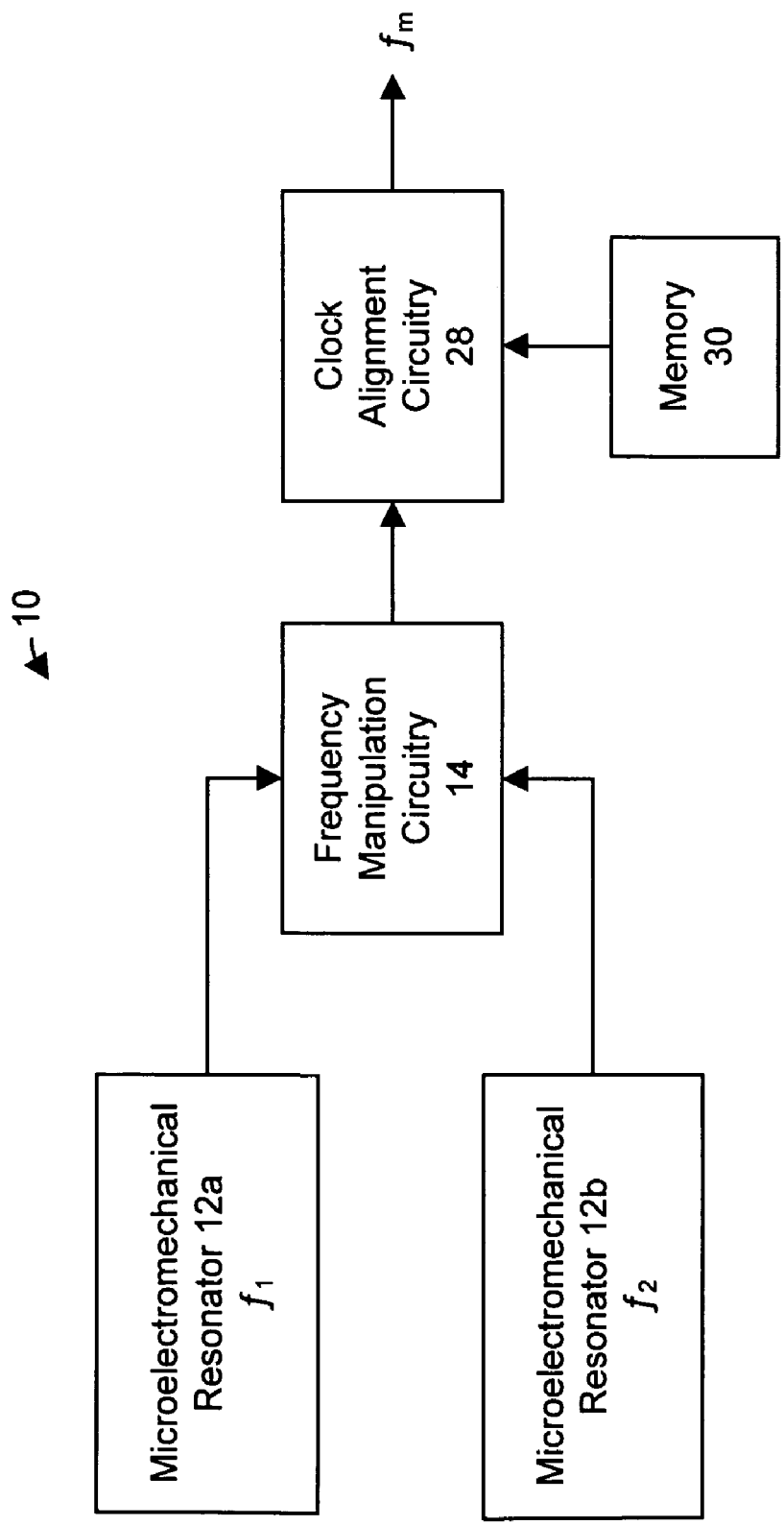

Moreover, with reference to FIGS. 15A and 15B, as mentioned above, in one embodiment, the output signal of oscillator system 10 (having the substantially stable frequency over operating temperature) may be employed as an output signal and/or may be applied to signal or clock alignment circuitry 28. Indeed, clock alignment circuitry 28, for example, FLL(s), PLL(s), DLL(s) and/or digital/frequency synthesizer(s), may be cascaded in series so that a particular, precise and/or selectable frequency and phase are obtained. Notably, the operation and implementation of FLL(s), PLL(s), DLL(s), and/or digital/frequency synthesizer(s) (for example, DDS(s)) are well known to those skilled in the art. Any FLL, PLL (whether fractional or integer), DLL (whether fractional or integer) and/or digital/frequency synthesizers, as well as configuration thereof or alternatives therefore, whether now known or later developed, is intended to fall within the scope of the present inventions. Indeed, any clock or signal alignment circuitry 28, whether now known or later developed, may be employed to generate an output signal having precise and stable characteristics (for example, frequency and/or phase).

Moreover, the PLL, DLL, digital/frequency synthesizer and/or FLL may also compensate using multiplication and/or division to adjust, correct, compensate and/or control the characteristics (for example, the frequency, phase and/or jitter) of the output signal of microelectromechanical resonators 12 and/or the frequency manipulation circuitry 14. The multiplication or division (and/or phase adjustments) by clock alignment circuitry 28 may be in fine or coarse increments. For example, clock alignment circuitry 28 may include an integer PLL, a fractional PLL and/or a finefractional-N PLL to precisely select, control and/or set the output signal of microelectromechanical oscillator system 10. In this regard, the output of frequency manipulation circuitry 14 may be provided to the input of the fractional-N PLL and/or the fine-fractional-N PLL (hereinafter collectively "fractional-N PLL"), which may be pre-set, pre-programmed and/or programmable (in memory 30) to provide an output signal having a desired, selected and/or predetermined frequency and/or phase.

Notably, in one embodiment, the parameters, references (for example, frequency and/or phase), values and/or coefficients employed by clock alignment circuitry 28 in order to generate and/or provide a predetermined, adjusted, corrected and/or controlled output having, for example, a desired, selected and/or predetermined frequency and/or phase (i.e., the function of clock alignment circuitry 28), may be externally provided to clock alignment circuitry 28 either before or during operation of microelectromechanical oscillator system 10. In this regard, a user or external circuitry/devices/systems may provide information representative of the parameters, references, values and/or coefficients to set, change, enhance and/or optimize the performance of clock alignment circuitry 28 and/or microelectromechanical oscillator system 10.

As mentioned above, the output signal of microelectromechanical oscillator system 10 may be single ended or double ended (i.e., differential signaling). The "shape" of the output signal (for example, square, pulse, sinusoidal or clipped sinusoidal) may be predetermined and/or programmable. In this regard, information which is representative of the "shape" of the output signal may be stored or programmed in memory (which is resident in frequency manipulation circuitry 14 and/or clock alignment circuitry 28 (if any) during fabrication, test, calibration and/or operation). In this way, frequency manipulation circuitry 14 and/or clock alignment circuitry 28 may access resident memory 30 (which may be integrated on the substrate with clock alignment circuitry 28) to obtain such information during start-up/power-up, initialization, re-initialization and/or during normal operation of frequency manipulation circuitry 14 and/or clock alignment circuitry 28.

Figure 16A:
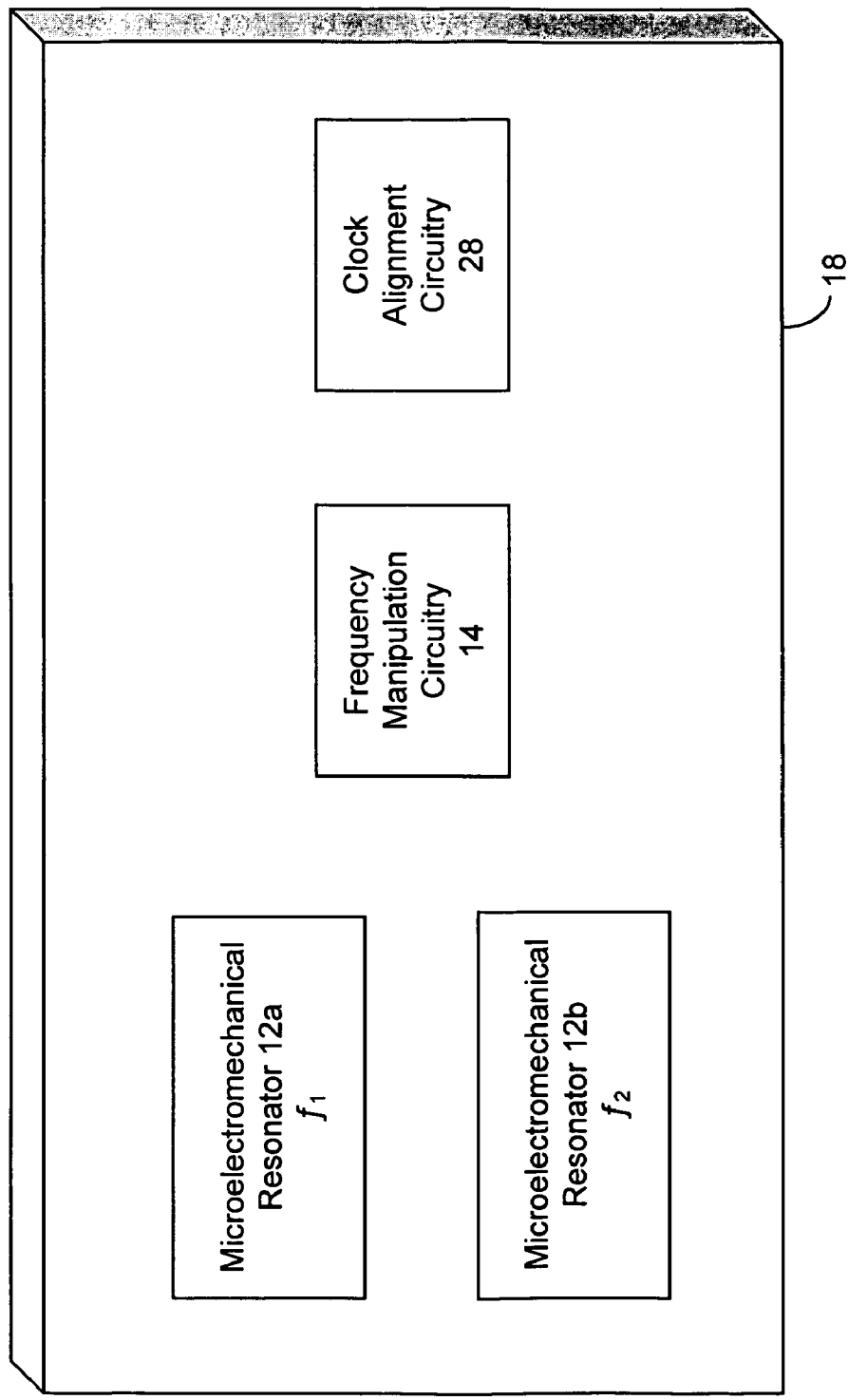
FIGS. 16A and 16B illustrate three-dimensional block diagram representations of a plurality of exemplary embodiments of the microelectromechanical oscillator having (i) microelectromechanical resonators and frequency manipulation circuitry and (ii) signal or clock alignment circuitry integrated on/in a common and/or different substrates, according to certain aspects of the present inventions.
Figure 16B:
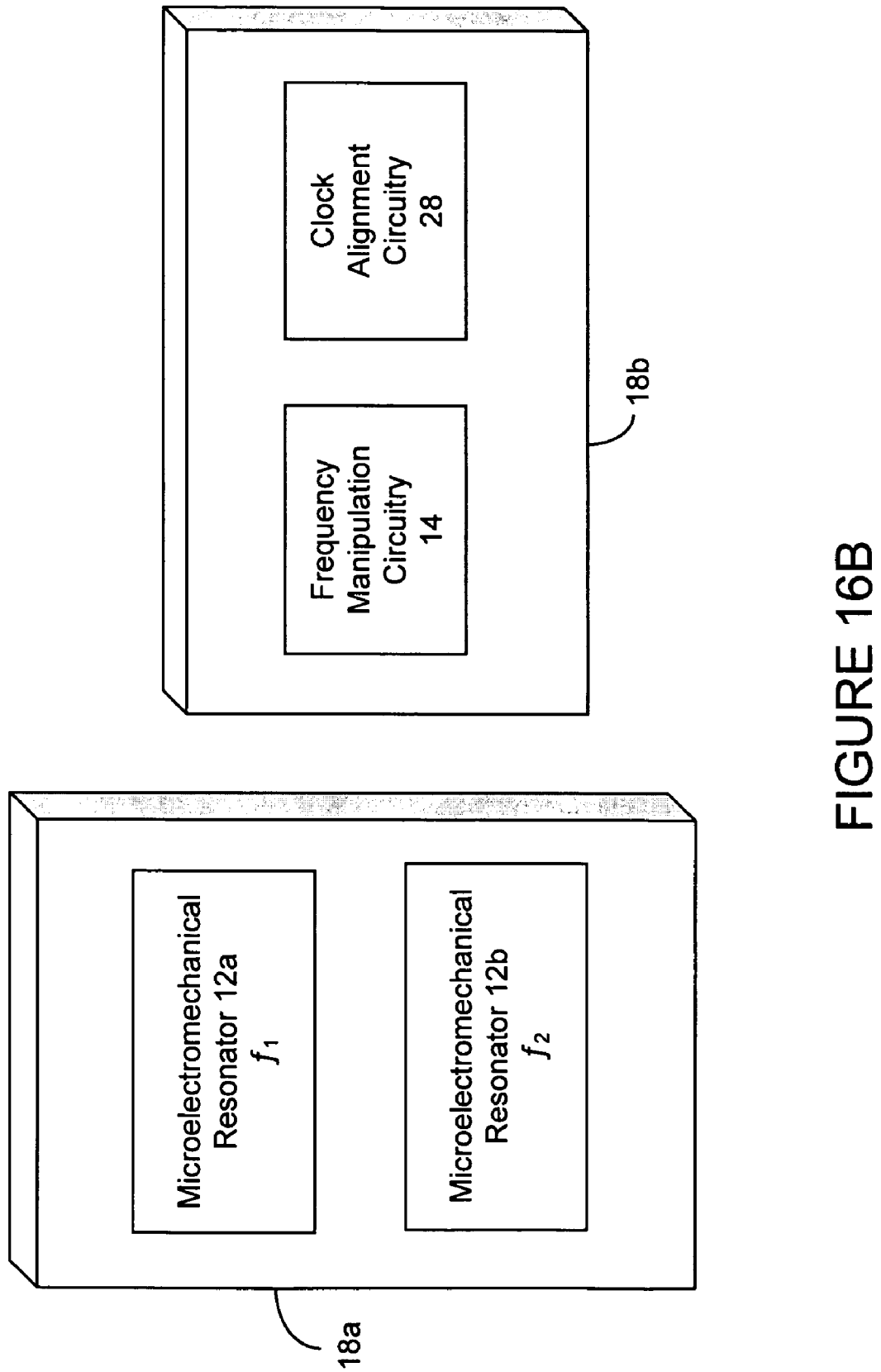
Figure 16C:
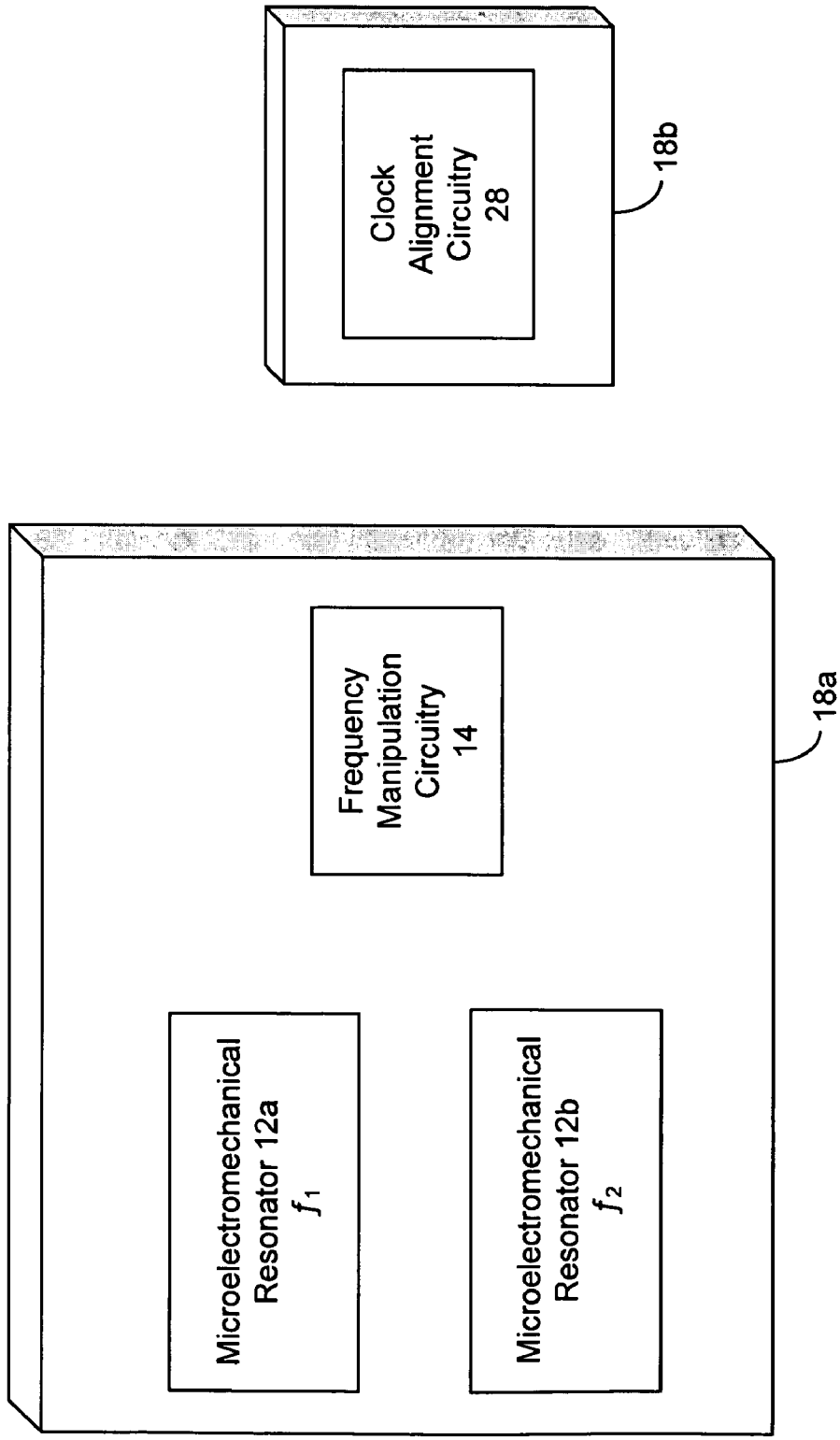
FIG. 16C illustrates a three-dimensional block diagram representation of an exemplary embodiment of the microelectromechanical oscillator having microelectromechanical resonators and frequency manipulation circuitry integrated on/in a common and signal or clock alignment circuitry integrated on/in a different substrate.

The clock alignment circuitry 28 may be disposed on/in the same substrate or on/in different substrates as microelectromechanical resonators 12 and/or frequency manipulation circuitry 14. (See, for example FIGS. 16A-C). All permutations and combinations thereof are intended to fall within the scope of the present inventions. Moreover, the present inventions may employ any interconnect or interconnection technique/architecture whether now known or later developed; all such techniques/architectures are intended to fall within the scope of the present inventions.

Figure 17A:
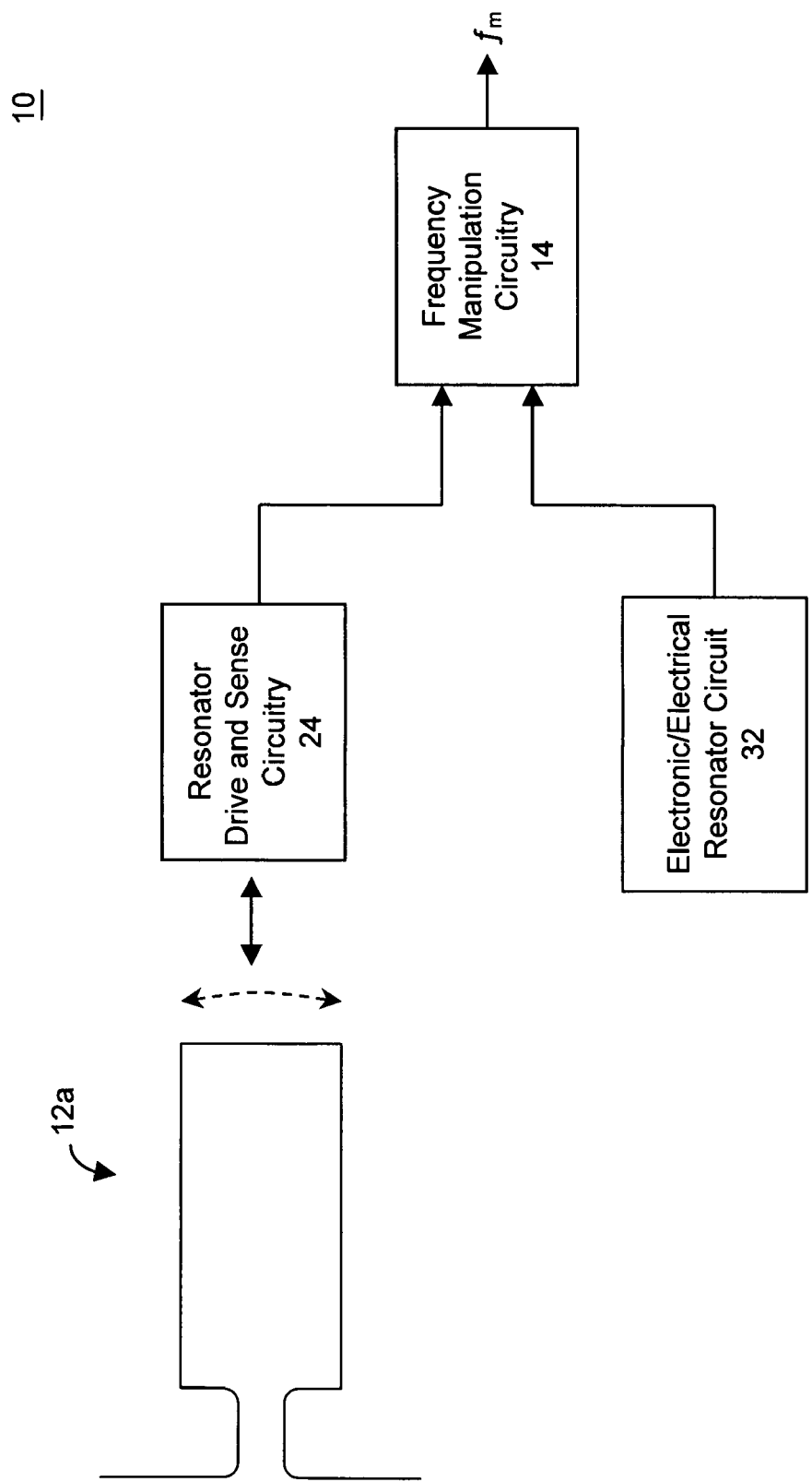
FIGS. 17A-17M are block diagram illustrations of an oscillator system according to aspects and/or embodiments of the present inventions wherein one or more electronic/electrical resonators each provide an output signal to the frequency manipulation circuitry, according to certain aspects and/or embodiments of the present inventions.
Figure 17B:
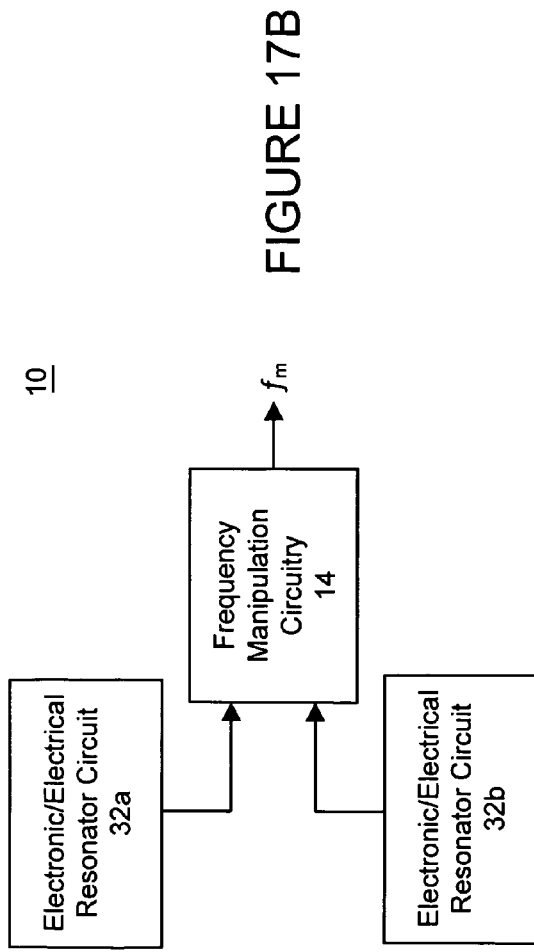
Figure 17C:
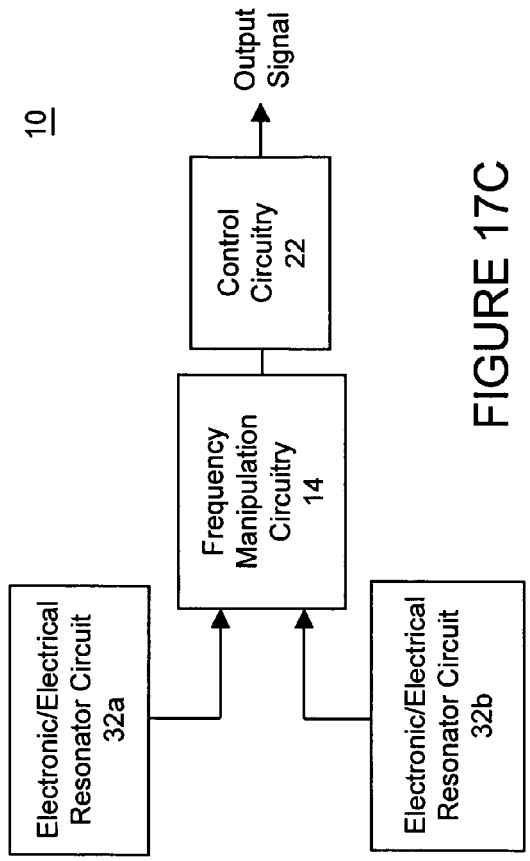
Figure 17D:
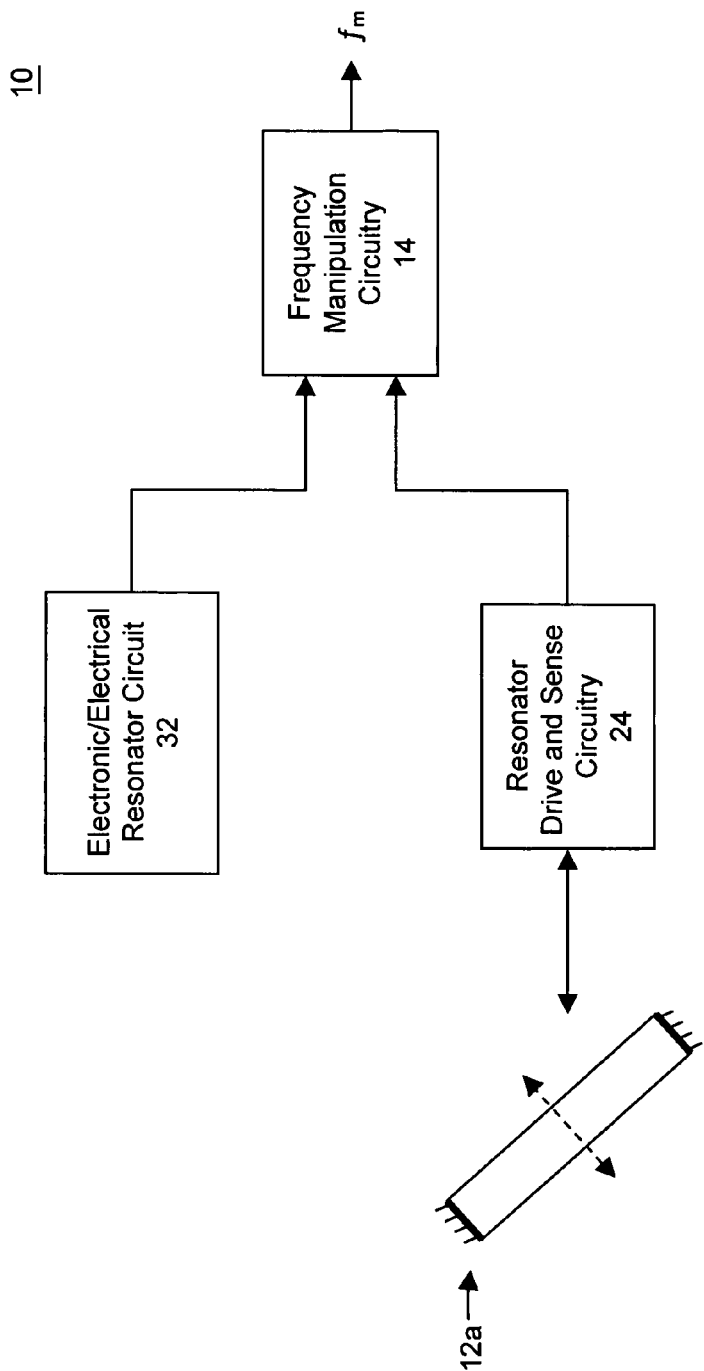
Figure 17E:
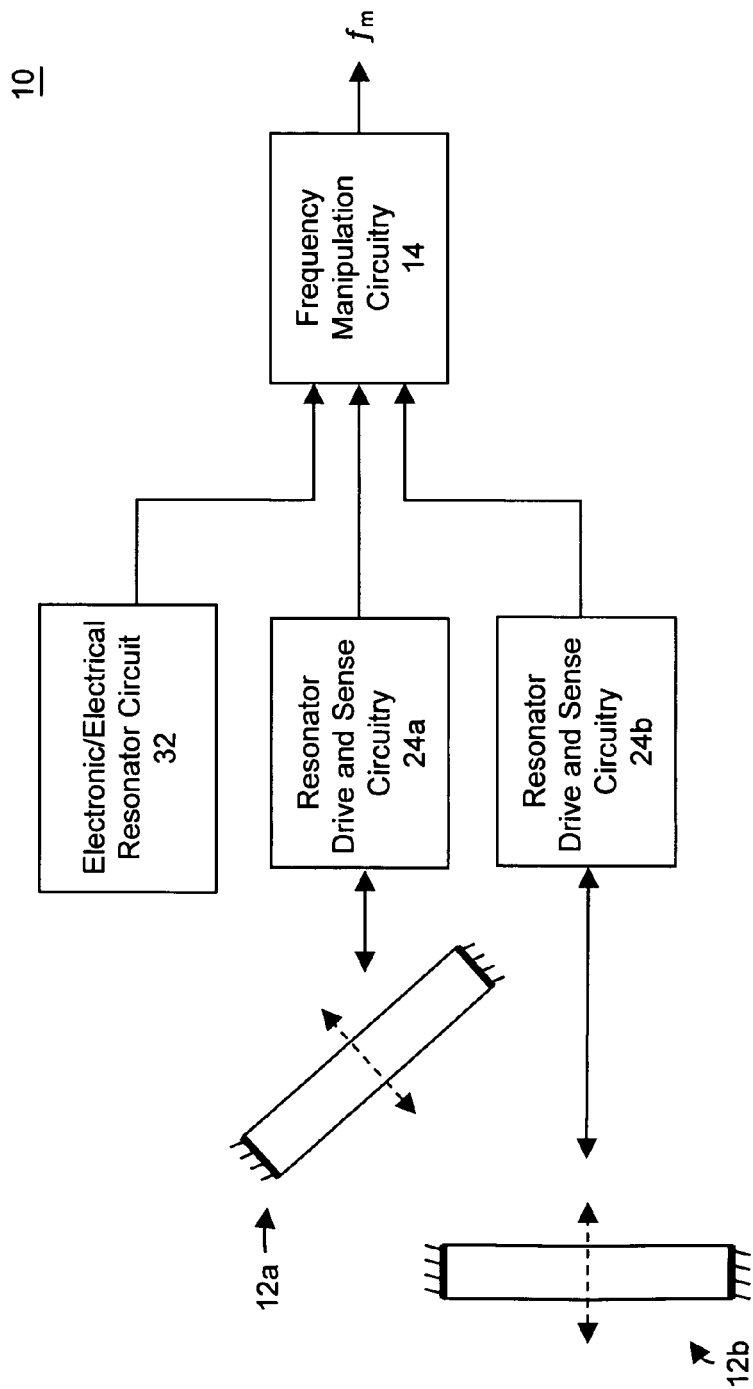
Figure 17F:
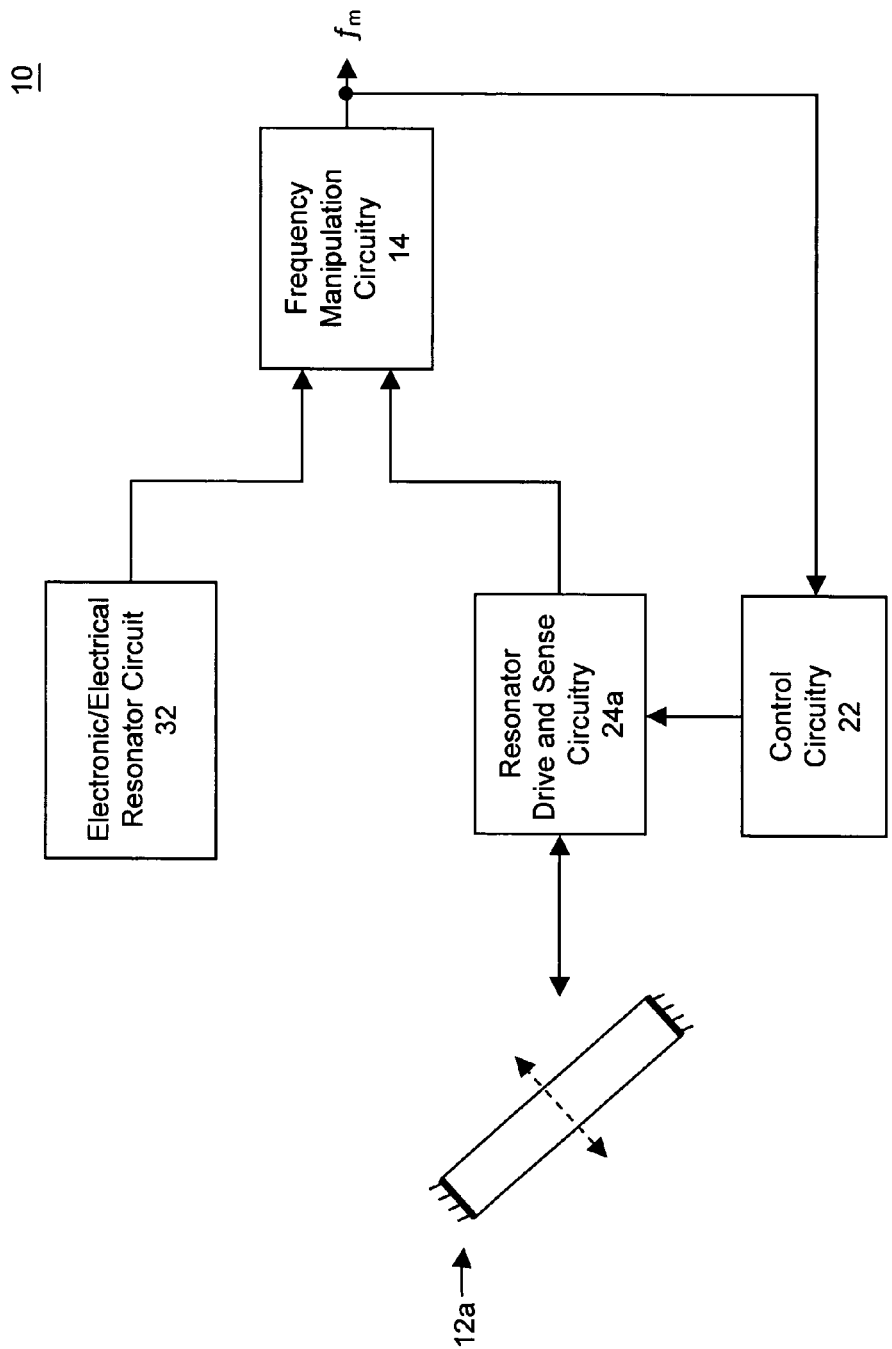
Figure 17G:
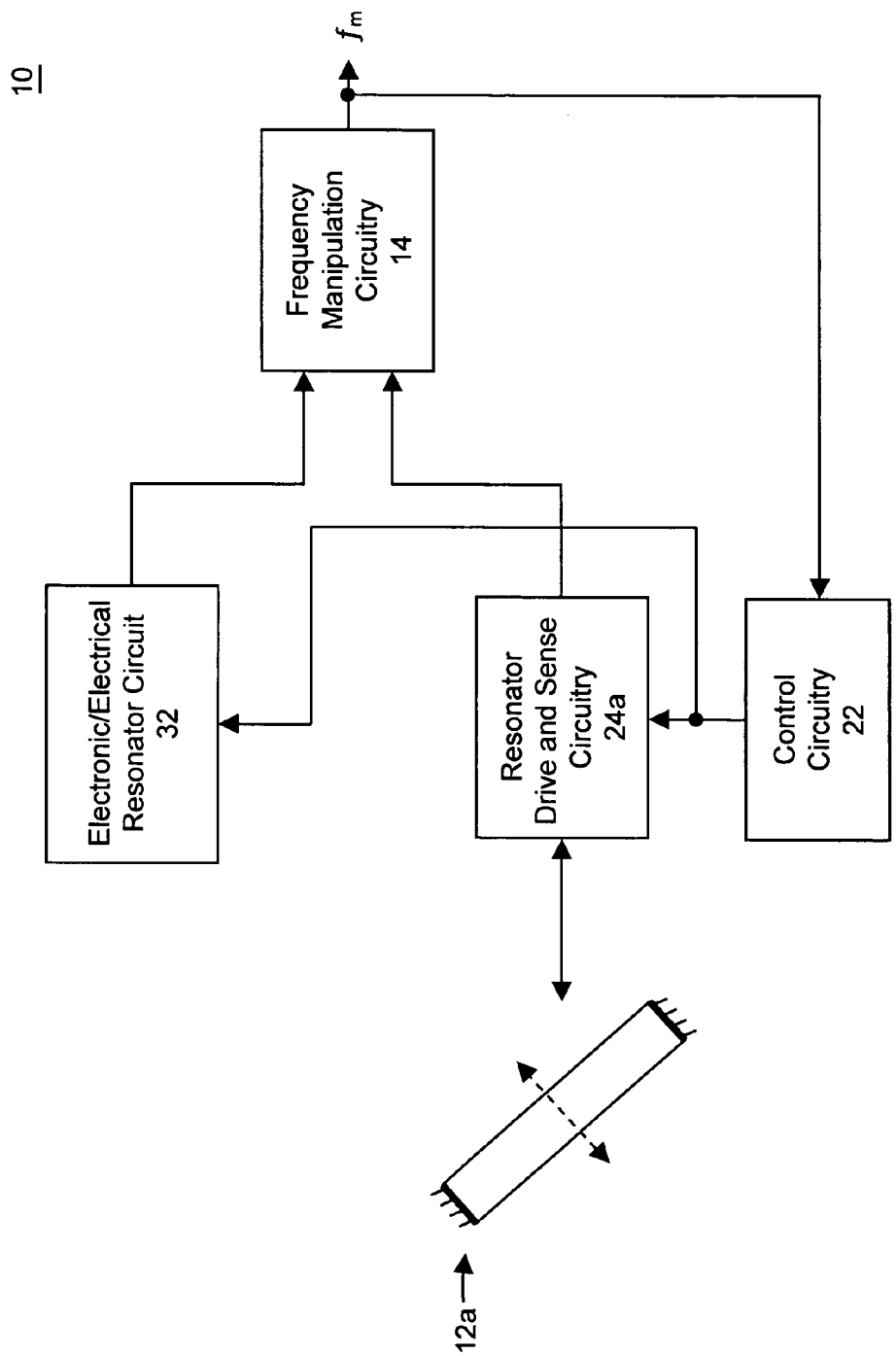
Figure 17H:
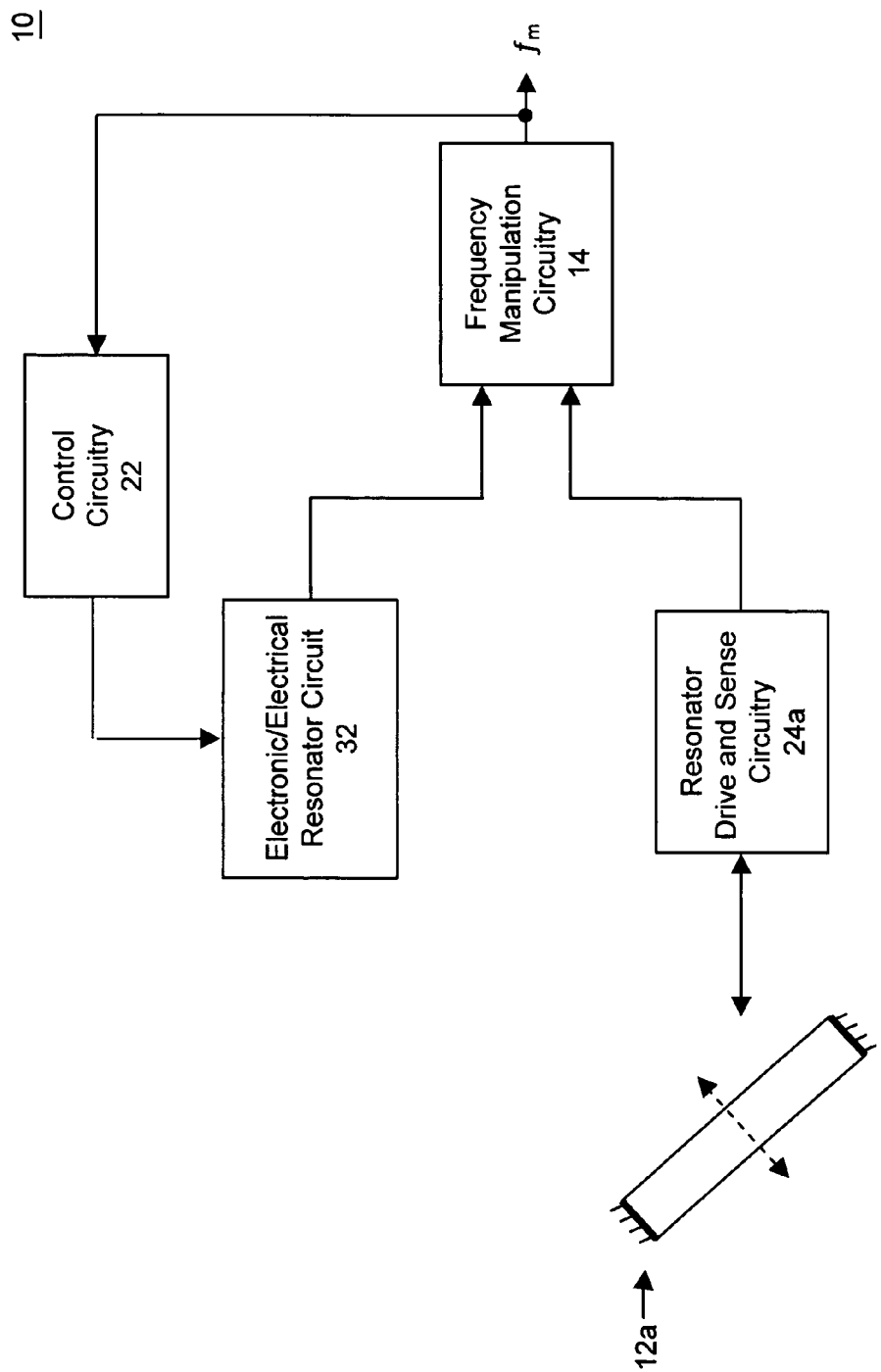
Figure 17I:
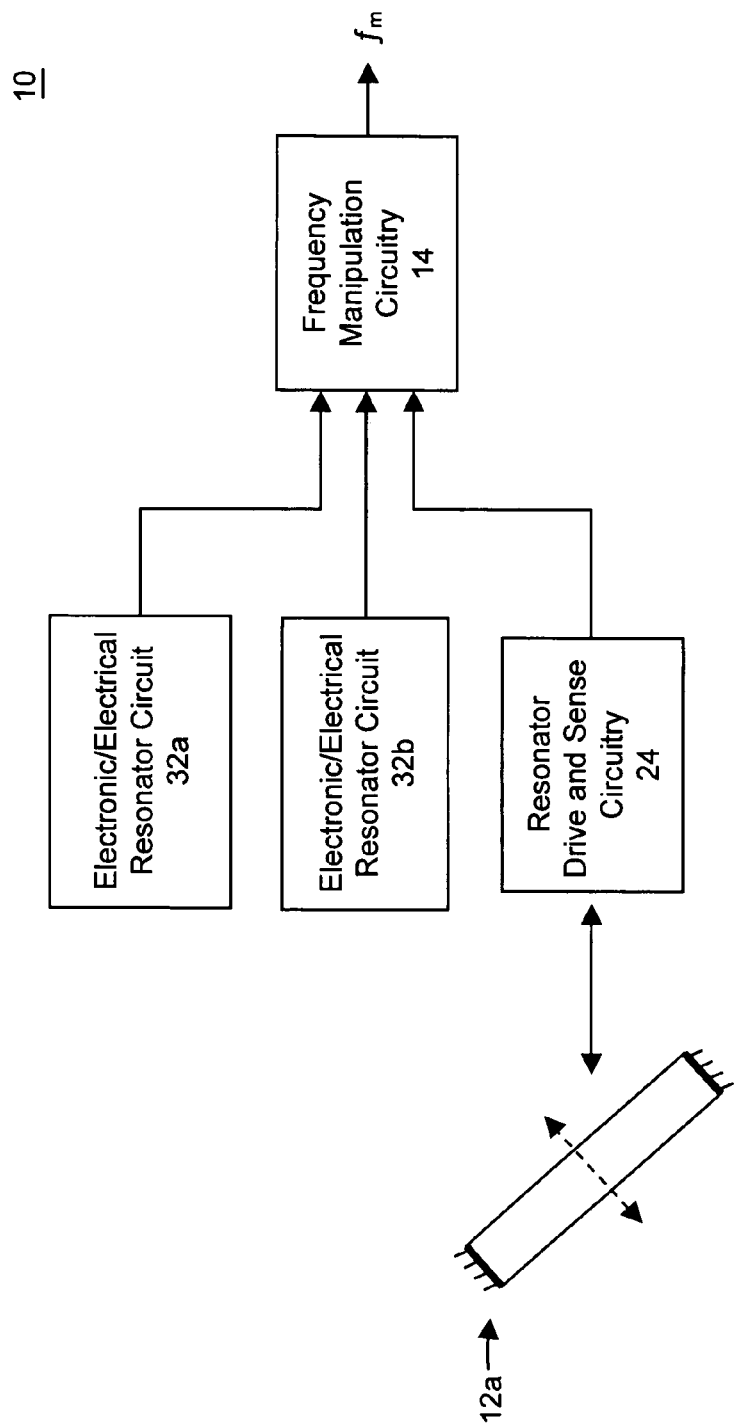
Figure 17J:
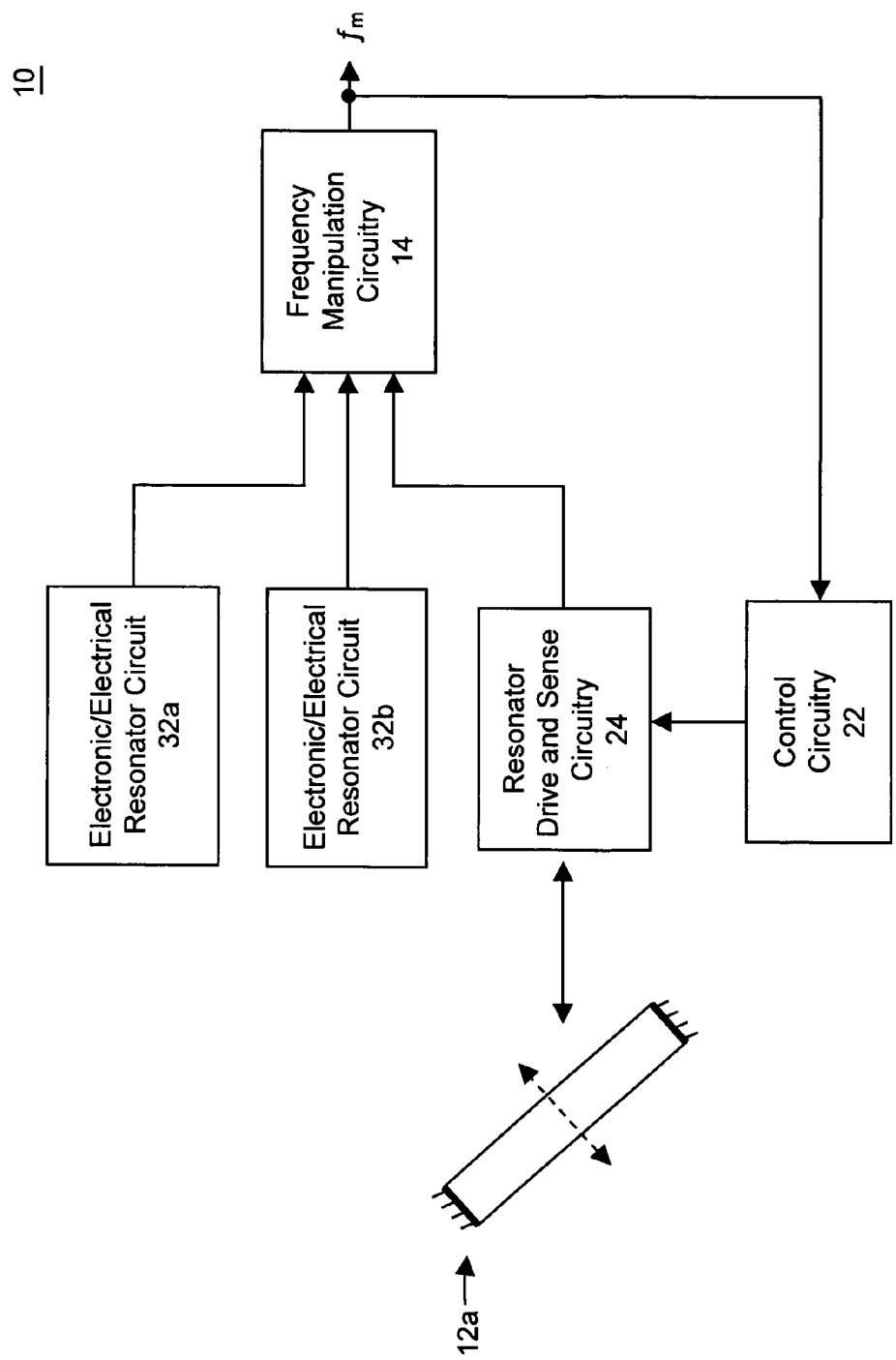
Figure 17K:
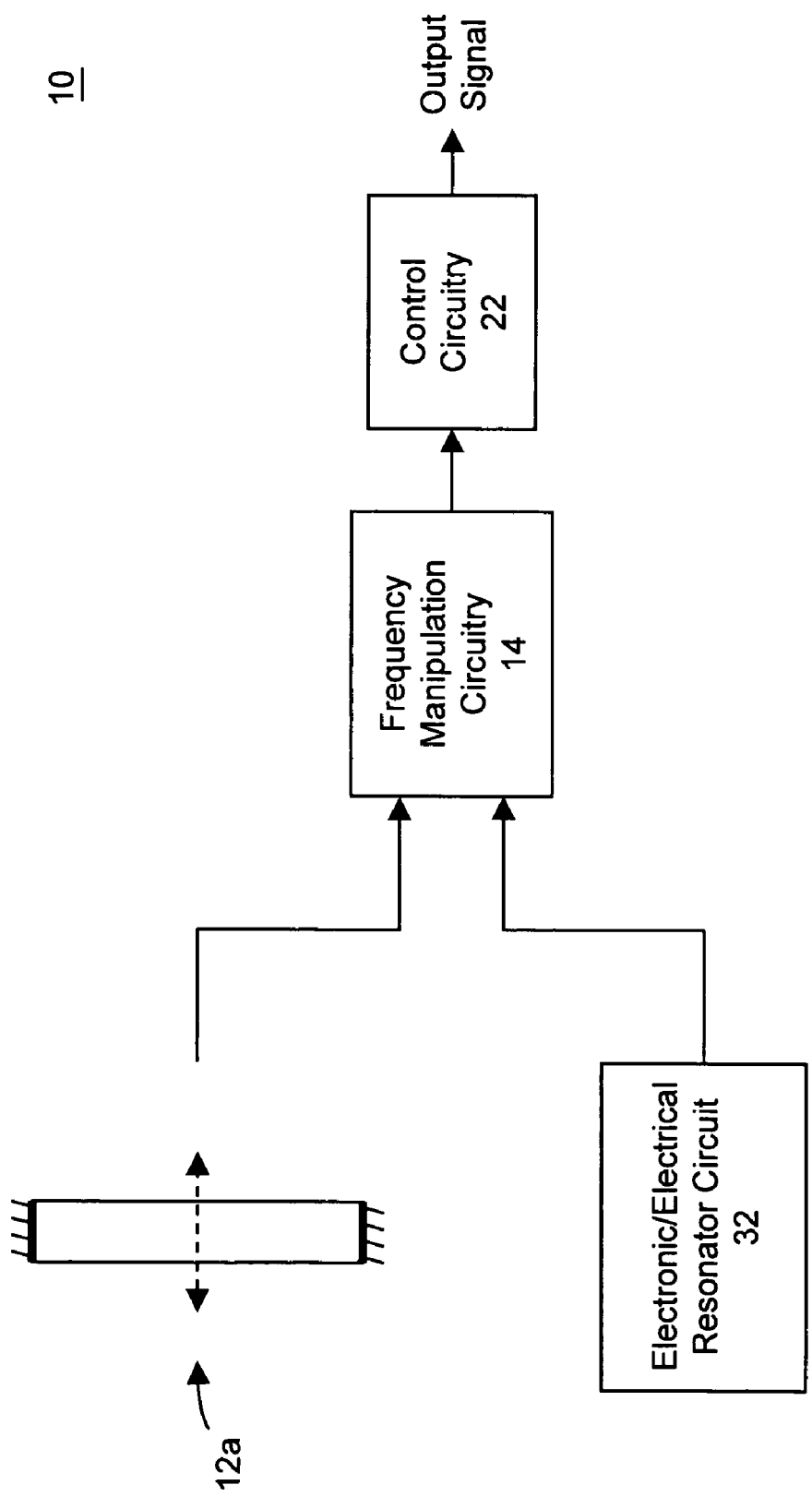
Figure 17L:
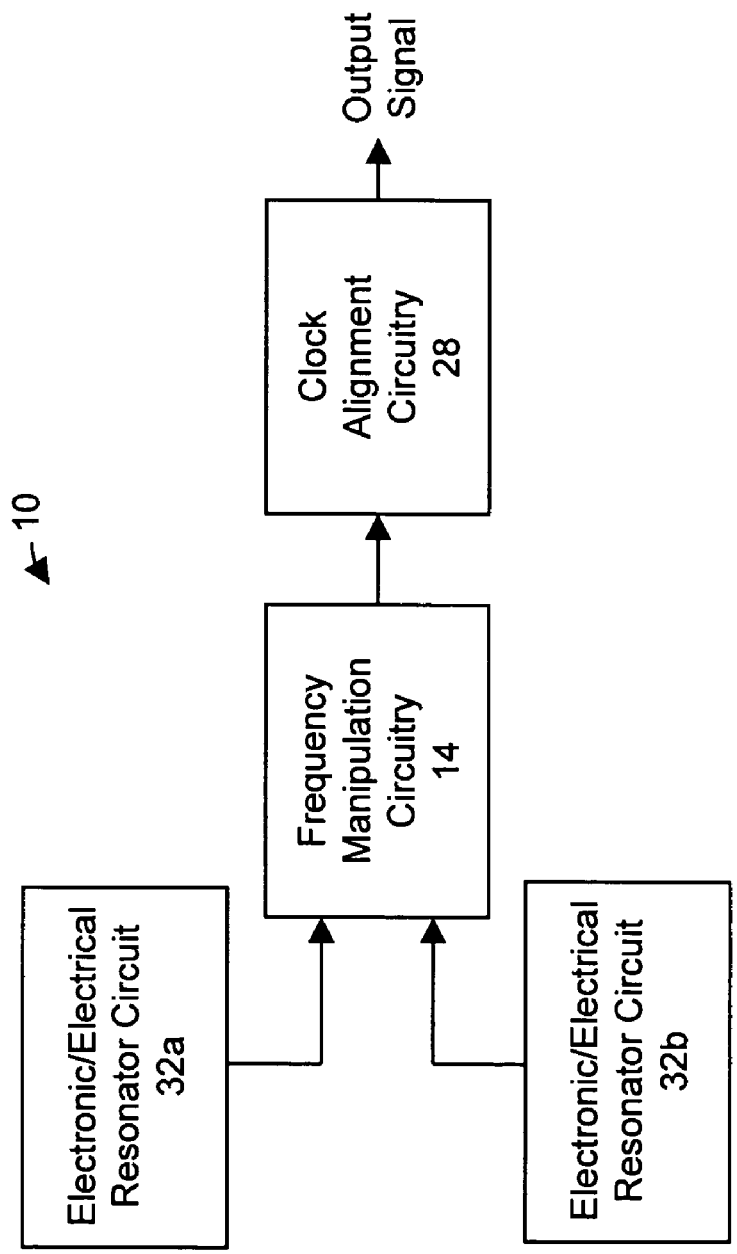
Figure 17M:
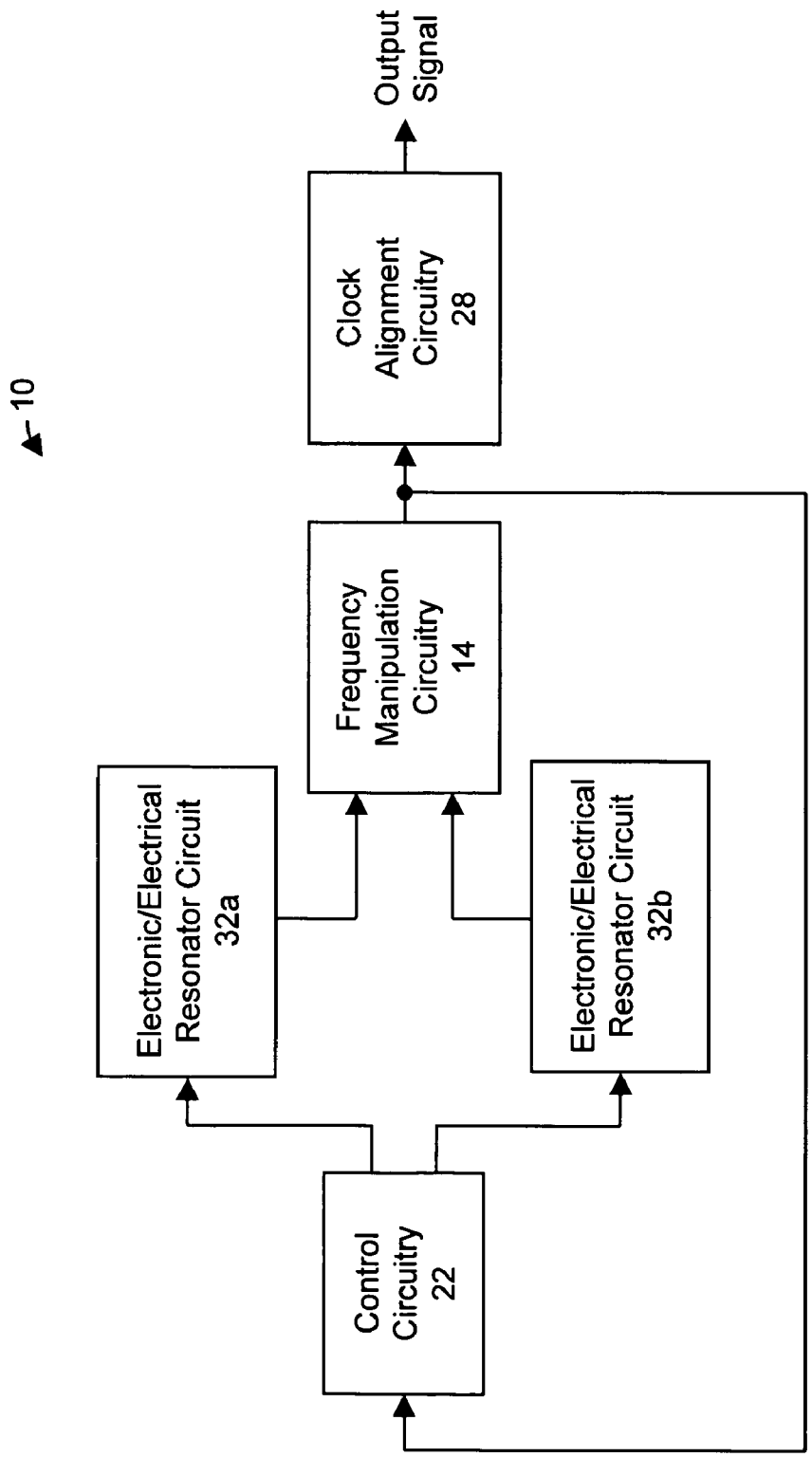

In one embodiment, one or more of microelectromechanical resonator structure 12 may be "replaced" by an electronic or electrical resonator circuit (for example, a capacitor/inductor circuit that, when stimulated/activated, resonates at a given or predetermined frequency). In this regard, with reference to FIGS. 17A, 17D and 17E, in one exemplary embodiment, electronic/electrical resonator circuit 32 provides a signal having a frequency that depends on the operating temperature of the elements of electronic/electrical resonator circuits 32, the design of resonator circuits 32, and the properties of the material comprising such elements. With reference to FIGS. 17B and 17C, in one exemplary embodiment, electronic/electrical resonator circuits 32a and 32b each provide a signal having a frequency that depends on the operating temperature of the elements of electronic/electrical resonator circuit 32 and the design and properties of the material comprising such elements.

Similar to the embodiments described and illustrated above, oscillator system 10 may be configured to provide and/or generate one or more output signals having a predetermined frequency over temperature, for example, (1) an output signal having a substantially stable frequency over a predetermined range of operating temperatures and/or (2) an output signal having a frequency that is dependent on the operating temperature from which the operating temperature may be determined (for example, an estimated operating temperature based on a empirical data and/or a mathematical relationship).

With reference to FIGS. 17A-17M, oscillator system 10 may include one or more electronic/electrical resonator circuits 32. Where oscillator system 10 includes two electronic/electrical resonator circuits 32a and 32b, each resonator system includes one or more material or design properties that respond differently to temperature (relative to the other resonator circuit). The output of electronic/electrical resonator circuit 32, having a frequency which varies temperature, may be applied to frequency manipulation circuitry 14 to generate an output signal having a predetermined frequency that is substantially stable over temperature. The frequency manipulation circuitry 14 may, in addition to or in lieu thereof, generate an output signal having a predetermined frequency that changes over temperature in a predetermined manner.

Like the other embodiments described above in the context of microelectromechanical resonators 12, in one embodiment of this aspect of the inventions, the output signal (of frequency manipulation circuitry 14) having the substantially stable frequency over temperature may be employed as an output signal and/or may be applied to clock alignment circuitry 28. (See, for example, FIGS. 17L and 17M). In this way, the clock signal may include a predetermined frequency that is higher or lower in frequency than the frequency of the output signal of the oscillator system. Indeed, the clock alignment circuitry 28 may provide a plurality of output signals that are higher and/or lower in frequency than the frequency of the output signal of the oscillator system.

Where the output signal of frequency manipulation circuitry 14 changes over temperature in a predetermined manner, that signal may be employed as a measure of the operating temperature of the system. In one embodiment, the signal which is representative of the operating temperature of oscillator system 10 may be applied to control circuitry 22 to interpret, analyze and/or correlate the frequency of the signal which is the dependent on the operating temperature. (See, for example, FIGS. 17D and 17G). Notably, all operations and/or functions described above with respect to control circuitry 22 are applicable to this embodiment. Moreover, all permutations and combinations employing control circuitry 22 and/or resonator drive and sense circuitry 24, in conjunction with one or more electronic/electrical resonator circuits 32, are intended to fall within the scope of the present inventions. (See, for example, FIGS. 17F, 17G, 17H, 17J and 17K. For the sake of brevity, those discussions will not be repeated.

Notably, each of the aspects of the present inventions, and/or embodiments thereof, may be employed alone or in combination with one or more of such aspects and/or embodiments. For the sake of brevity, those permutations and combinations will not be discussed separately herein. As such, the present inventions are not limited to any single aspect or embodiment thereof nor to any combinations and/or permutations of such aspects and/or embodiments.

While the present inventions have been described in the context of microelectromechanical systems including micromechanical resonators, the present inventions are not limited in this regard. Rather, the inventions described herein are applicable to gyroscopes, resonators, temperature sensors, accelerometers and/or other transducers as well as other electromechanical systems including, for example, nanoelectromechanical systems. Moreover, the oscillator system of the present inventions may be employed and/or embedded in any electrical device, for example, in which the oscillator output is used to coordinate or synchronize operations and/or provide one or more clock signals (for example, in a wired, wireless, or optical fiber network communication system, in which transmit and receive circuits synchronize with each other, or synchronization of multiple oscillators on a high-speed electronics chip designed to minimize clock signal skew, or synchronizing components across a board or a communication bus) and/or in any electrical device in which temperature related information is employed.

It should be further noted that the term "circuit" may mean, among other things, a single component (for example, electrical/electronic and/or microelectromechanical) or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, one or more processors, one or more state machines, one or more processors implementing software, or a combination of one or more circuits (whether integrated or otherwise), one or more state machines, one or more processors, and/or one or more processors implementing software. The term "data" may mean, among other things, a current or voltage signal(s) whether in an analog or a digital form.

The term "frequency function of temperature" of a microelectromechanical resonator may mean, among other things, the change in frequency of a resonator due to a change in Young's modulus over temperature of the microelectromechanical resonator, the change in thermal coefficient of expansion of the microelectromechanical resonator over temperature, the change in mass of the microelectromechanical resonator over temperature, and/or the change in stress/strain conditions of the microelectromechanical resonator, the substrate and/or the housing.

What is claimed is:

1. An oscillator system, comprising:
   a plurality of microelectromechanical resonators including:
   a first microelectromechanical resonator to generate a first output signal having a frequency that varies with operating temperature, wherein the first microelectromechanical resonator includes a first frequency function of temperature,
   a second microelectromechanical resonator to generate a second output signal having a frequency that varies with operating temperature, wherein the second microelectromechanical resonator includes a second frequency function of temperature, and
   a third microelectromechanical resonator to generate a third output signal having a frequency that varies with operating temperature, wherein the third microelectromechanical resonator includes a third frequency function of temperature; and
   frequency manipulation circuitry, coupled to the first, second and third microelectromechanical resonators, to generate an output signal having frequency that is substantially stable over a predetermined range of operating temperatures using the first, second and third frequency functions of temperature to cancel at least a first-order temperature dependent term of the first, second and third output signals, exclusive of the use of temperature sensing means separate from the first, second and third microelectromechanical resonators.

2. The oscillator system of claim 1 wherein the frequency manipulation circuitry includes frequency subtraction circuitry.

3. The oscillator system of claim 2 wherein the frequency subtraction circuitry includes digital or analog circuitry.

4. The oscillator system of claim 1 wherein the plurality of microelectromechanical resonators are disposed in or on the same substrate.

5. The oscillator system of claim 4 wherein the plurality of microelectromechanical resonators are fabricated from the same material.

6. The oscillator system of claim 4 wherein the plurality of microelectromechanical resonators are the same physical structure.

7. The oscillator system of claim 4 wherein the plurality of microelectromechanical resonators include different crystalline orientations or directions in or on the same substrate.

8. The oscillator system of claim 1 wherein the first microelectromechanical resonator and the second microelectromechanical resonator are disposed in or on the different substrates.

9. The oscillator system of claim 1 wherein:
   the plurality of microelectromechanical resonators further including a fourth microelectromechanical resonator to generate a fourth output signal having a frequency that varies with operating temperature, wherein the fourth microelectromechanical resonator includes a fourth frequency function of temperature; and
   the frequency manipulation circuitry, is coupled to the fourth microelectromechanical resonator, and generates the output signal having a frequency that is substantially stable over a predetermined range of operating temperatures using the first, second, third and fourth frequency functions of temperature to cancel at least a first-order temperature dependent term of the first, second, third and fourth output signals, exclusive of the use of temperature sensing means separate from the fourth microelectromechanical resonator.

10. The oscillator system of claim 1 wherein the plurality of microelectromechanical resonators and the frequency manipulation circuitry are disposed in or on the same substrate.

11. An oscillator system, comprising:
    a plurality of microelectromechanical resonators including:
    a first microelectromechanical resonator to generate a first output signal having a frequency that varies with operating temperature, wherein the first microelectromechanical resonator includes a first frequency function of temperature,
    a second microelectromechanical resonator to generate a second output signal having a frequency that varies with operating temperature, wherein the second microelectromechanical resonator includes a second frequency function of temperature,
    a third microelectromechanical resonator to generate a third output signal having a frequency that varies with operating temperature, wherein the third microelectromechanical resonator includes a third frequency function of temperature; and frequency mixer circuitry, coupled to the plurality of microelectromechanical resonators, to generate an output signal having frequency that is substantially stable over a predetermined range of operating temperatures using the first, second and third frequency functions of temperature to cancel at least a first-order temperature dependent term of the first, second and third output signals, exclusive of the use of temperature sensing means separate from the first, second and third microelectromechanical resonators.

12. The oscillator system of claim 11 wherein the frequency mixer circuitry further includes filter circuitry, coupled to the frequency mixer circuitry, to receive an output of the frequency mixer circuitry and to attenuate a frequency difference component or frequency sum component of the output of the frequency mixer circuitry.

13. The oscillator system of claim 11 wherein the frequency mixer circuitry includes digital or analog circuitry.

14. The oscillator system of claim 11 wherein the plurality of microelectromechanical resonators are disposed in or on the same substrate.

15. The oscillator system of claim 14 wherein the plurality of microelectromechanical resonators are fabricated from the same material.

16. The oscillator system of claim 14 wherein the plurality of microelectromechanical resonators are the same physical structure.

17. The oscillator system of claim 14 wherein the plurality of microelectromechanical resonators include different crystalline orientations or directions in or on the same substrate.

18. The oscillator system of claim 11 wherein the plurality of microelectromechanical resonators are disposed in or on the different substrates.

19. The oscillator system of claim 11 wherein:
the plurality of microelectromechanical resonators further including a fourth microelectromechanical resonator to generate a fourth output signal having a frequency that varies with operating temperature, wherein the fourth microelectromechanical resonator includes a fourth frequency function of temperature; and the frequency mixer circuitry, is coupled to the fourth microelectromechanical resonator, and generates the output signal having a frequency that is substantially stable over a predetermined range of operating temperatures using the first, second, third and fourth frequency functions of temperature to cancel at least a first-order temperature dependent term of the first, second, third and fourth output signals, exclusive of the use of temperature sensing means separate from the fourth microelectromechanical resonator.

20. An oscillator system, comprising:
a plurality of microelectromechanical resonators including:
a first microelectromechanical resonator to generate a first output signal having a frequency that varies with operating temperature, wherein the first microelectromechanical resonator includes a first frequency function of temperature,
a second microelectromechanical resonator to generate a second output signal having a frequency that varies with operating temperature, wherein the second microelectromechanical resonator includes a second frequency function of temperature, and
a third microelectromechanical resonator to generate a third output signal having a frequency that varies with operating temperature, wherein the third microelectromechanical resonator includes a third frequency function of temperature;

frequency mixer circuitry, coupled to the plurality of microelectromechanical resonators, to generate an output signal having frequency that is substantially stable over a predetermined range of operating temperatures using the first, second and third frequency functions of temperature to cancel at least a first-order temperature dependent term of the first, second and third output signals, exclusive of the use of temperature sensing means separate from the first, second and third microelectromechanical resonators; and signal alignment circuitry, coupled to the frequency mixer circuitry, to generate an output signal using the output signal of the frequency mixer circuitry.

21. The oscillator system of claim 20 wherein the frequency mixer circuitry further includes filter circuitry, coupled to the frequency mixer circuitry, to receive an output of the frequency mixer circuitry and to attenuate a frequency difference component or frequency sum component of the output of the frequency mixer circuitry.

22. The oscillator system of claim 21 wherein the frequency mixer circuitry includes digital or analog circuitry.

23. The oscillator system of claim 21 wherein the signal alignment circuitry receives the output of the filter circuitry.

24. The oscillator system of claim 20 wherein the signal alignment circuitry includes one or more phase locked loops, delay locked loops, digital/frequency synthesizer and/or frequency locked loops.

25. The oscillator system of claim 24 wherein the one or more digital/frequency synthesizers include one or more direct digital synthesizers, frequency synthesizers, fractional synthesizers and/or numerically controlled oscillators.

26. The oscillator system of claim 24 wherein the one or more phase locked loops, delay locked loops, digital/frequency synthesizer and/or frequency locked loops include fractional and/or fine-fractional type phase locked loops, delay locked loops, digital/frequency synthesizer and/or frequency locked loops.

27. The oscillator system of claim 20 wherein the plurality of microelectromechanical resonators are disposed in or on the same substrate.

28. The oscillator system of claim 27 wherein the plurality of microelectromechanical resonators are fabricated from the same material.

29. The oscillator system of claim 27 wherein the plurality of microelectromechanical resonators are the same physical structure.

30. The oscillator system of claim 27 wherein the plurality of microelectromechanical resonators include different crystalline orientations or directions in or on the same substrate.

31. The oscillator system of claim 20 wherein the plurality of microelectromechanical resonators are disposed in or on the different substrates.

32. The oscillator system of claim 20 wherein:
the plurality of microelectromechanical resonators further including a fourth microelectromechanical resonator to generate a fourth output signal having a frequency that varies with operating temperature, wherein the fourth microelectromechanical resonator includes a fourth frequency function of temperature; and the frequency mixer circuitry, is coupled to the fourth microelectromechanical resonator, and generates the output signal having a frequency that is substantially stable over a predetermined range of operating temperatures using the first, second, third and fourth frequency functions of temperature to cancel at least a first-order temperature dependent term of the first, second, third and fourth output signals, exclusive of the use of temperature sensing means separate from the fourth microelectromechanical resonator.

33. The oscillator system of claim 20 wherein the plurality of microelectromechanical resonators, the frequency mixer circuitry, and the signal alignment circuitry are disposed in or on the same substrate.

34. The oscillator system of claim 1, wherein the frequency manipulation circuitry is further configured to generate an output signal using the first, second and third frequency function of temperature to also cancel a second-order temperature dependent term of the first, second and third output signals.

35. The oscillator system of claim 11, wherein the frequency mixer circuitry is further configured to generate an output signal using the first, second and third frequency function of temperature to also cancel a second-order temperature dependent term of the first, second and third output signals.

36. The oscillator system of claim 20, wherein the frequency mixer circuitry is further configured to generate an output signal using the first, second and third frequency function of temperature to also cancel a second-order temperature dependent term of the first, second and third output signals.

* * * * *

UNITED STATES PATENT AND TRADEMARK OFFICE
CERTIFICATE OF CORRECTION

| | | |
|---|---|---|
| PATENT NO. | : 7,369,003 B2 | Page 1 of 1 |
| APPLICATION NO. | : 11/438653 | |
| DATED | : May 6, 2008 | |
| INVENTOR(S) | : Paul Merritt Hagelin | |

It is certified that error appears in the above-identified patent and that said Letters Patent is hereby corrected as shown below:

On the cover page, Assignee item (73) "NVIDIA Corporation, Santa Clara, CA (US)"

should read --SITIME, Corporation, Sunnyvale, CA (US)--

Signed and Sealed this

Third Day of March, 2009

JOHN DOLL
*Acting Director of the United States Patent and Trademark Office*